United States Patent
Ebisawa

(10) Patent No.: US 11,550,221 B2
(45) Date of Patent: Jan. 10, 2023

(54) CHEMICALLY AMPLIFIED POSITIVE-TYPE PHOTOSENSITIVE RESIN COMPOSITION, PHOTOSENSITIVE DRY FILM, METHOD OF MANUFACTURING PHOTOSENSITIVE DRY FILM, METHOD OF MANUFACTURING PATTERNED RESIST FILM, METHOD OF MANUFACTURING SUBSTRATE WITH TEMPLATE, METHOD OF MANUFACTURING PLATED ARTICLE, AND NITROGEN-CONTAINING AROMATIC HETEROCYCLIC COMPOUND

(71) Applicant: TOKYO OHKA KOGYO CO., LTD., Kawasaki (JP)

(72) Inventor: Kazuaki Ebisawa, Kawasaki (JP)

(73) Assignee: TOKYO OHKA KOG YO CO., LTD., Kawasaki (JP)

( * ) Notice: Subject to any disclaimer, the term of this patent is extended or adjusted under 35 U.S.C. 154(b) by 730 days.

(21) Appl. No.: 16/447,262

(22) Filed: Jun. 20, 2019

(65) Prior Publication Data
US 2020/0004150 A1 Jan. 2, 2020

(30) Foreign Application Priority Data
Jun. 27, 2018 (JP) .............................. JP2018-122522

(51) Int. Cl.
| | |
|---|---|
| *G03F 7/039* | (2006.01) |
| *G03F 7/16* | (2006.01) |
| *C08K 5/3432* | (2006.01) |
| *G03F 7/004* | (2006.01) |
| *G03F 7/06* | (2006.01) |
| *C08L 33/02* | (2006.01) |
| *C08L 33/14* | (2006.01) |

(52) U.S. Cl.
CPC .......... *G03F 7/0392* (2013.01); *C08K 5/3432* (2013.01); *C08L 33/02* (2013.01); *C08L 33/14* (2013.01); *G03F 7/0045* (2013.01); *G03F 7/063* (2013.01); *G03F 7/168* (2013.01)

(58) Field of Classification Search
None
See application file for complete search history.

(56) References Cited

U.S. PATENT DOCUMENTS

| | | | | |
|---|---|---|---|---|
| 6,291,619 | B1 * | 9/2001 | Maekawa | G03F 7/0233 |
| | | | | 526/321 |
| 2008/0026321 | A1 * | 1/2008 | Misumi | C08F 220/1808 |
| | | | | 430/270.1 |
| 2011/0140043 | A1 * | 6/2011 | Stoessel | C09K 11/06 |
| | | | | 252/301.16 |
| 2012/0231396 | A1 * | 9/2012 | Andou | G03F 7/40 |
| | | | | 430/326 |
| 2014/0017611 | A1 * | 1/2014 | Sugihara | G03F 7/0392 |
| | | | | 430/311 |
| 2015/0004533 | A1 * | 1/2015 | Hirano | G03F 7/027 |
| | | | | 430/281.1 |

FOREIGN PATENT DOCUMENTS

| | | |
|---|---|---|
| JP | H09-176112 | 7/1997 |
| JP | H11-052562 | 2/1999 |
| JP | 2002-513377 A | 5/2002 |
| WO | WO 98/02405 A1 | 1/1998 |

\* cited by examiner

*Primary Examiner* — Duane Smith
*Assistant Examiner* — Nicholas E Brown
(74) *Attorney, Agent, or Firm* — Knobbe, Martens, Olson & Bear LLP

(57) ABSTRACT

A chemically amplified positive-type photosensitive resin composition including an acid generator which generates acid upon exposure to an irradiated active ray or radiation, a resin whose solubility in alkali increases under the action of acid, and a nitrogen-containing aromatic heterocyclic compound that is a nitrogen-containing aromatic heterocyclic compound having a specific structure and having a Log S value of −6.00 or less.

13 Claims, No Drawings

CHEMICALLY AMPLIFIED POSITIVE-TYPE PHOTOSENSITIVE RESIN COMPOSITION, PHOTOSENSITIVE DRY FILM, METHOD OF MANUFACTURING PHOTOSENSITIVE DRY FILM, METHOD OF MANUFACTURING PATTERNED RESIST FILM, METHOD OF MANUFACTURING SUBSTRATE WITH TEMPLATE, METHOD OF MANUFACTURING PLATED ARTICLE, AND NITROGEN-CONTAINING AROMATIC HETEROCYCLIC COMPOUND

RELATED APPLICATIONS

This application claims priority to Japanese Patent Application No. 2018-122522, filed Jun. 27, 2018, the entire content of which is incorporated herein by reference.

BACKGROUND OF THE INVENTION

Field of the Invention

The present invention relates to a chemically amplified positive-type photosensitive resin composition; a photosensitive dry film having a photosensitive resin layer formed of the chemically amplified positive-type photosensitive resin composition; a method of manufacturing the photosensitive dry film; a method of manufacturing a patterned resist film using the above-mentioned chemically amplified positive-type photosensitive resin composition; a method of manufacturing a substrate with a template using the above-mentioned chemically amplified positive-type photosensitive resin composition; a method of manufacturing a plated article using the substrate with a template; and a nitrogen-containing aromatic heterocyclic compound capable of preferably being blended with the above-mentioned chemically amplified positive-type photosensitive resin composition.

Related Art

Photofabrication is now the mainstream of a microfabrication technique. Photofabrication is a generic term describing the technology used for manufacturing a wide variety of precision components such as semiconductor packages. The manufacturing is carried out by applying a photoresist composition to the surface of a processing target to form a photoresist layer, patterning this photoresist layer using photolithographic techniques, and then conducting chemical etching, electrolytic etching, or electroforming based mainly on electroplating, using the patterned photoresist layer (photoresist pattern) as a mask.

In recent years, high-density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high-density packaging techniques, connection terminals, for example, protruding electrodes (mounting terminals) known as bumps that protrude above the package or metal posts that extend from peripheral terminals on the wafer and connect rewiring with the mounting terminals, are disposed on the surface of the substrate with high precision.

In the photofabrication as described above, a photoresist composition is used, and chemically amplified photoresist compositions containing an acid generator have been known as such a photoresist composition (see Patent Documents 1, 2 and the like). According to the chemically amplified photoresist composition, an acid is generated from the acid generator upon irradiation with radiation (exposure) and diffusion of the acid is promoted through heat treatment, to cause an acid catalysis with a base resin and the like in the composition resulting in a change to the alkali-solubility of the same.

Such chemically amplified positive-type photoresist compositions are used, for example, in formation by a plating step for plated articles such as bumps, metal posts, and Cu-rewiring. Specifically, a photoresist layer having a desired film thickness is formed on a support such as a metal substrate using a chemically amplified photoresist composition, and the photoresist layer is exposed through a predetermined mask pattern and is developed. Thereby, a photoresist pattern used as a template in which portions for forming plated articles have been selectively removed (stripped) is formed. Then, bumps, metal posts, and Cu-rewiring can be formed by embedding a conductor such as copper into the removed portions (nonresist portions) by plating and then removing the surrounding photoresist pattern.

Patent Document 1: Japanese Unexamined Patent Application, Publication No. H09-176112
Patent Document 2: Japanese Unexamined Patent Application, Publication No. H11-52562

SUMMARY OF THE INVENTION

In general, when a resist pattern is formed, it is often desirable that a cross-sectional shape thereof be rectangular. In particular, in formation of connection terminals such as bumps or metal posts by the plating step mentioned above, or in formation of a Cu-rewiring, with respect to the nonresist portion of the resist pattern as a template, the cross-sectional shape thereof is strongly desired to be rectangular. In formation process of plated articles, when the cross-sectional shape of the nonresist portion of the resist pattern serving as a template is rectangular, the contact area between the bottom surface of the connection terminals such as bumps, metal posts, and Cu-rewiring can be sufficiently secured. This makes it easy to form connection terminals or a Cu-rewiring in which adhesiveness with respect to the support is good. Furthermore, when the cross-sectional shape of the nonresist portion of the resist pattern as a template is rectangular, it is possible to form connection terminals or a Cu-rewiring in which the tip portion has an appropriate diameter or width which is neither too thin nor too thick.

However, in a case where a resist pattern is formed using a conventionally known chemically amplified positive-type photoresist composition as disclosed in Patent Documents 1, 2, and the like, a resist pattern whose cross-sectional shape is rectangular is often not easily formed. In this way, in a case where a conventionally known chemically amplified positive-type photoresist composition as disclosed in Patent Documents 1, 2 and the like, is used, it is difficult to form a resist pattern having a desirable cross-sectional shape.

The present invention has been made in view of the above problem. An object of the present invention is to provide a chemically amplified positive-type photosensitive resin composition that easily forms a resist pattern whose cross-sectional shape is rectangular; a photosensitive dry film having a photosensitive resin layer formed of the chemically amplified positive-type photosensitive resin composition; a method of manufacturing the photosensitive dry film; a method of manufacturing a patterned resist film using the above-mentioned chemically amplified positive-type photosensitive resin composition; a method of manufacturing a substrate with a template using the above-mentioned chemically amplified positive-type photosensitive resin composition; a method of manufacturing a plated article using the substrate with a template; and a nitrogen-containing aromatic heterocyclic compound capable of preferably being blended with the above-mentioned chemically amplified positive-type photosensitive resin composition.

After conducting extensive studies in order to achieve the above objects, the present inventors have found that the above problem can be solved by including a nitrogen-containing aromatic heterocyclic compound (C) that is a nitrogen-containing aromatic heterocyclic compound having a specific structure and having a Log S value of −6.00 or less in a chemically amplified positive-type photosensitive resin composition including an acid generator (A) which generates acid upon exposure to an irradiated active ray or radiation and a resin (B) whose solubility in alkali increases under the action of acid, and have completed the present invention. Specifically, the present invention provides the following.

A first aspect of the present invention is a chemically amplified positive-type photosensitive resin composition containing an acid generator (A) which generates acid upon exposure to an irradiated active ray or radiation, a resin (B) whose solubility in alkali increases under the action of acid, and a nitrogen-containing aromatic heterocyclic compound (C), wherein the nitrogen-containing aromatic heterocyclic compound (C) is a compound represented by the following formula (c-a) or (c-b):

[Chem. 1]

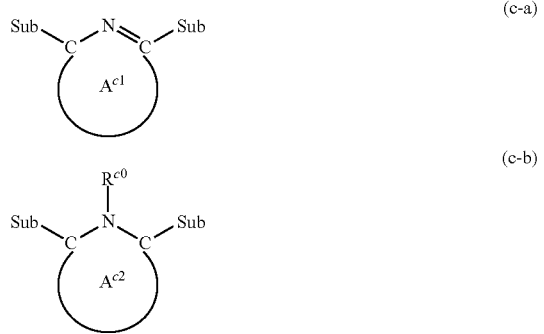

(in the formula (c-a), Sub is a substituent, $A^{c1}$ is a monocyclic or condensed polycyclic nitrogen-containing aromatic heterocycle which may have a substituent other than Sub, and two Subs may be identical to or different from each other; and in the formula (c-b), Sub is a substituent, $A^{c2}$ is a monocyclic or condensed polycyclic nitrogen-containing aromatic heterocycle which may have a substituent other than Sub, $R^{c0}$ is a hydrogen atom or an organic group, and two Subs may be identical to or different from each other), and wherein a common logarithm value Log S of the solubility S of the nitrogen-containing aromatic heterocyclic compound (C) is −6.00 or less.

A second aspect of the present invention is a photosensitive dry film including a substrate film, and a photosensitive resin layer formed on a surface of the substrate film, wherein the photosensitive resin layer includes the chemically amplified positive-type photosensitive resin composition according to the first aspect.

A third aspect of the present invention is a method of manufacturing a photosensitive dry film. The method includes applying the chemically amplified positive-type photosensitive resin composition according to the first aspect on a substrate film to form a photosensitive resin layer.

A fourth aspect of the present invention is a method of manufacturing a patterned resist film. The method includes: laminating a photosensitive resin layer on a substrate having a metal surface, the layer including the chemically amplified positive-type photosensitive resin composition of the first aspect, exposing the photosensitive resin layer through irradiation with an active ray or radiation in a position-selective manner, and developing the exposed photosensitive resin layer.

A fifth aspect of the present invention is a method of manufacturing a substrate with a template. The method includes: laminating a photosensitive resin layer on a substrate having a metal surface, the layer including the chemically amplified positive-type photosensitive resin composition of the first aspect, exposing the photosensitive resin layer through irradiation with an active ray or radiation, and developing the exposed photosensitive resin layer to prepare a template for plated articles.

A sixth aspect of the present invention is a method of manufacturing a plated article. The method includes plating the substrate with a template manufactured by the method of the fifth aspect to form the plated article in the template.

A seventh aspect of the present invention is a nitrogen-containing aromatic heterocyclic compound represented by the following formula (c2).

[Chem. 2]

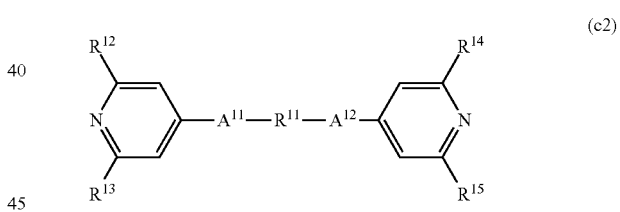

(In the formula (c2), $A^{11}$ and $A^{12}$ are each independently a single bond or a divalent group selected from the group consisting of —O—, —CO—, —COO—, —OCO—, —OCOO—, —NH—, —CONH—, —NHCO—, —NHCONH—, —S—, —SO—, and —SO$_2$—, $R^{11}$ is a divalent organic group, and $R^{12}$ to $R^{15}$ are each independently a hydrocarbon group).

The present invention can provide a chemically amplified positive-type photosensitive resin composition that easily forms a resist pattern whose cross-sectional shape is rectangular; a photosensitive dry film having a photosensitive resin layer formed of the chemically amplified positive-type photosensitive resin composition; a method of manufacturing the photosensitive dry film; a method of manufacturing a patterned resist film using the above-mentioned chemically amplified positive-type photosensitive resin composition; a method of manufacturing a substrate with a template using the above-mentioned chemically amplified positive-type photosensitive resin composition; a method of manufacturing a plated article using the substrate with a template; and a nitrogen-containing aromatic heterocyclic compound capable of preferably being blended with the above-mentioned chemically amplified positive-type photosensitive resin composition.

DETAILED DESCRIPTION OF THE INVENTION

<<Chemically Amplified Positive-Type Photosensitive Resin Composition>>

The chemically amplified positive-type photosensitive resin composition (hereinafter also referred to as the "photosensitive resin composition") includes an acid generator (A) which generates acid upon exposure to an irradiated active ray or radiation (hereinafter also referred to as the acid generator (A)), a resin (B) whose solubility in alkali increases under the action of acid (hereinafter also referred to as the resin (B)), and a nitrogen-containing aromatic heterocyclic compound (C) having a predetermined structure. The photosensitive resin composition may include components such as an alkali-soluble resin (D), a sulfur-containing compound (E), an acid diffusion suppressing agent (F), and an organic solvent (S), if desired.

The film thickness of the resist pattern formed using the photosensitive resin composition is not particularly limited. The photosensitive resin composition is preferably used for the formation of a thick resist pattern. Specifically, the film thickness of a resist pattern formed using the photosensitive resin composition is preferably 0.5 µm or more, more preferably 0.5 µm or more and 300 µm or less, further preferably 0.5 µm or more and 200 µm or less, and particularly preferably 0.5 µm or more and 150 µm or less. The upper limit value of the film thickness may be, for example, 100 µm or less. The lower limit value of the film thickness may be, for example, 1 µm or more, and may be 3 µm or more.

Hereinafter, described are essential or optional components in the photosensitive resin composition, and a method for manufacturing the photosensitive resin composition.

<Acid Generator (A)>

The acid generator (A) is a compound which generates acid upon exposure to an irradiated active ray or radiation, and is not particularly limited as long as it is a compound which directly or indirectly produces an acid under the action of light. The acid generator (A) is preferably any one of the acid generators of the first to fifth aspects that will be described below. Hereinafter, suitable aspects of the acid generator (A) that are suitably used in photosensitive resin compositions will be described as the first to fifth aspects.

The first aspect of the acid generator (A) may be a compound represented by the following formula (a1).

[Chem. 3]

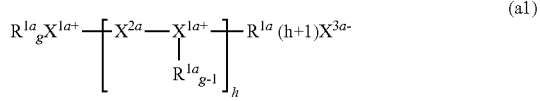
(a1)

In the formula (a1), $X^{1a}$ represents a sulfur atom or iodine atom respectively having a valence of g; g represents 1 or 2. h represents the number of repeating units in the structure within parentheses. $R^{1a}$ represents an organic group that is bonded to $X^{1a}$, and represents an aryl group having 6 or more and 30 or less carbon atoms, a heterocyclic group having 4 or more and 30 or less carbon atoms, an alkyl group having 1 or more and 30 or less carbon atoms, an alkenyl group having 2 or more and 30 or less carbon atoms, or an alkynyl group having 2 or more and 30 or less carbon atoms, and $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be respectively identical to or different from each other. Furthermore, two or more $R^{1a}$s may be bonded to each other directly or via —O—, —S—, —SO—, —SO$_2$—, —NH—, —NR$^{2a}$—, —CO—, —COO—, —CONH—, an alkylene group having 1 or more and 3 or less carbon atoms, or a phenylene group, and may form a ring structure including $X^{1a}$. $R^{2a}$ represents an alkyl group having 1 or more and 5 or less carbon atoms, or an aryl group having 6 or more and 10 or less carbon atoms.

$X^{2a}$ represents a structure represented by the following formula (a2).

[Chem. 4]

(a2)

In the above formula (a2), $X^{4a}$ represents an alkylene group having 1 or more and 8 or less carbon atoms, an arylene group having 6 or more and 20 or less carbon atoms, or a divalent group of a heterocyclic compound having 8 or more and 20 or less carbon atoms, and $X^{4a}$ may be substituted with at least one selected from the group consisting of an alkyl group having 1 or more and 8 or less carbon atoms, an alkoxy group having 1 or more and 8 or less carbon atoms, an aryl group having 6 or more and 10 or less carbon atoms, a hydroxyl group, a cyano group, a nitro group, and halogen atoms. $X^{5a}$ represents —O—, —S—, —SO—, —SO$_2$—, —NH—, —NR$^{2a}$—, —CO—, —COO—, —CONH—, an alkylene group having 1 or more and 3 or less carbon atoms, or a phenylene group. h represents the number of repeating units of the structure in parentheses. $X^{4a}$s in the number of h+1 and $X^{5a}$s in the number of h may be identical to or different from each other. $R^{2a}$ has the same definition as described above.

$X^{3a-}$ represents a counterion of an onium, and examples thereof include a fluorinated alkylfluorophosphoric acid anion represented by the following formula (a17) or a borate anion represented by the following formula (a18).

[Chem. 5]

(a17)

In the formula (a17), $R^{3a}$ represents an alkyl group having 80% or more of the hydrogen atoms substituted with fluorine atoms. j represents the number of $R^{3a}$s and is an integer of 1 or more and 5 or less. $R^{3a}$s in the number of j may be respectively identical to or different from each other.

[Chem. 6]

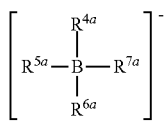
(a18)

In the formula (a18) $R^{4a}$ to $R^{7a}$ each independently represents a fluorine atom or a phenyl group, and a part or all of the hydrogen atoms of the phenyl group may be substituted with at least one selected from the group consisting of a fluorine atom and a trifluoromethyl group.

Examples of the onium ion in the compound represented by the above formula (a1) include triphenylsulfonium, tri-p-tolylsulfonium, 4-(phenylthio)phenyldiphenylsulfonium, bis[4-(diphenylsulfonio)phenyl] sulfide, bis[4-{bis[4-(2-hydroxyethoxy)phenyl]sulfonio}phenyl] sulfide, bis{4-[bis(4-fluorophenyl)sulfonio]phenyl} sulfide, 4-(4-benzoyl-2-chlorophenylthio)phenylbis(4-fluorophenyl)sulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfo-nium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, 4-isobutylphenyl(p-tolyl)iodonium, or the like.

Among the onium ions in the compound represented by the above formula (a1), a preferred onium ion may be a sulfonium ion represented by the following formula (a19).

[Chem. 7]

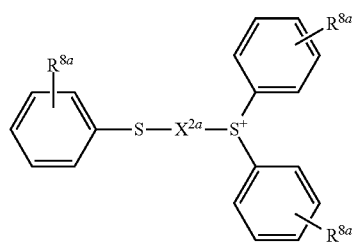
(a19)

In the above formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the above formula (a1).

Specific examples of the sulfonium ion represented by the above formula (a19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyl-diphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, and diphenyl[4-(p-terphenylthio)phenyl]diphenylsulfonium.

In regard to the fluorinated alkylfluorophosphoric acid anion represented by the above formula (a17), $R^{3a}$ represents an alkyl group substituted with a fluorine atom, and a preferred number of carbon atoms is 1 or more and 8 or less, while a more preferred number of carbon atoms is 1 or more and 4 or less. Specific examples of the alkyl group include linear alkyl groups such as methyl, ethyl, propyl, butyl, pentyl and octyl; branched alkyl groups such as isopropyl, isobutyl, sec-butyl and tert-butyl; and cycloalkyl groups such as cyclopropyl, cyclobutyl, cyclopentyl, and cyclohexyl. The proportion of hydrogen atoms substituted with fluorine atoms in the alkyl groups is usually 80% or more, preferably 90% or more, and even more preferably 100%. If the substitution ratio of fluorine atoms is less than 80%, the acid strength of the onium fluorinated alkylfluorophosphate represented by the above formula (a1) decreases.

A particularly preferred example of $R^{3a}$ is a linear or branched perfluoroalkyl group having 1 or more and 4 or less carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. j which is the number of $R^{3a}$s represents an integer of 1 or more and 5 or less, and is preferably 2 or more and 4 or less, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, or $[(CF_3CF_2CF_2)_3PF_3]^-$. Among these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, or $[((CF_3)_2CFCF_2)_2PF_4]^-$ are particularly preferred.

Preferred specific examples of the borate anion represented by the above formula (a18) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$) trifluoro (pentafluorophenyl)borate ($[(C_6F_5)BF_3]^-$), and tetrakis (difluorophenyl)borate ($[B(C_6H_3F_2)_4]^-$). Among these, tetrakis(pentafluorophenyl)borate ($[B(C_6F_5)_4]^-$) is particularly preferred.

The second aspect of the acid generator (A) include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl) ethenyl]-s-triazine, 2,4-bis(trichloromethyl)-6-(3,4-methylenedioxyphenyl)-s-triazine, 2,4-bis-trichloromethyl- 6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy) styrylphenyl-s-triazine, 2,4-bis-trichloromethyl-6-(3-bromo-4-methoxy) styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (a3) such as tris(2,3-dibromopropyl)isocyanurate.

[Chem. 8]

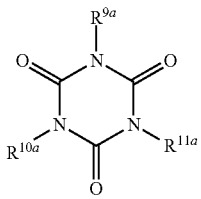

(a3)

In the above formula (a3), $R^{9a}$, $R^{10a}$ and $R^{11a}$ each independently represent a halogenated alkyl group.

Further, the third aspect of the acid generator (A) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (a4) having an oximesulfonate group.

[Chem. 9]

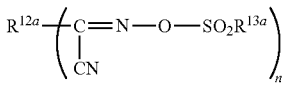

(a4)

In the above formula (a4), $R^{12a}$ represents a monovalent, bivalent or trivalent organic group, $R^{13a}$ represents a substituted or unsubstituted saturated hydrocarbon group, an unsaturated hydrocarbon group, or an aromatic group, and n represents the number of repeating units of the structure in the parentheses.

In the formula (a4), examples of the aromatic group include aryl groups such as a phenyl group and a naphthyl group, and heteroaryl groups such as a furyl group and a thienyl group. These may have one or more appropriate substituents such as halogen atoms, alkyl groups, alkoxy groups and nitro groups on the rings. It is particularly preferable that $R^{13a}$ is an alkyl group having 1 or more and 6 or less carbon atoms such as a methyl group, an ethyl group, a propyl group, and a butyl group. In particular, compounds in which $R^{12a}$ represents an aromatic compound group, and $R^{13a}$ represents an alkyl group having 1 or more and 4 or less carbon atoms are preferred.

Examples of the acid generator represented by the above formula (a4) include compounds in which $R^{12a}$ is any one of a phenyl group, a methylphenyl group and a methoxyphenyl group, and $R^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene](o-tolyl)acetonitrile and the like. Provided that n is 2, the acid generator represented by the above formula (a4) is specifically an acid generator represented by the following formulae.

[Chem. 10]

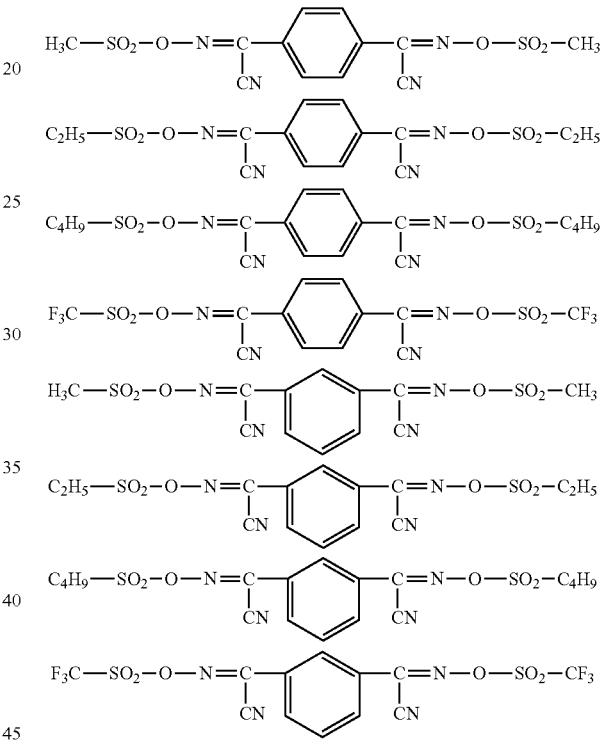

In addition, the fourth aspect of the acid generator (A) include onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 or more and 6 or less carbon atoms, a hydroxyl group, a linear or branched alkoxy group having 1 or more and 6 or less carbon atoms or the like. The structure derived from the naphthalene ring, which may be of a monovalent group (one free valence) or of a bivalent group (two free valences), is desirably of a monovalent group (in this regard, the number of free valences is counted except for the portions connecting with the substituents described above). The number of naphthalene rings is preferably 1 or more and 3 or less.

Preferably, the cation moiety of the onium salt having a naphthalene ring at the cation moiety is of the structure represented by the following formula (a5).

[Chem. 11]

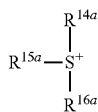

(a5)

In the above formula (a5), at least one of $R^{14a}$, $R^{15a}$ and $R^{16a}$ represents a group represented by the following formula (a6), and the remaining represents a linear or branched alkyl group having 1 or more and 6 or less carbon atoms, a phenyl group which may have a substituent, a hydroxyl group, or a linear or branched alkoxy group having 1 or more and 6 or less carbon atoms. Alternatively, one of $R^{14a}$, $R^{15a}$ and $R^{16a}$ is a group represented by the following formula (a6), and the remaining two are each independently a linear or branched alkylene group having 1 or more and 6 or less carbon atoms, and these terminals may bond to form a ring structure.

[Chem. 12]

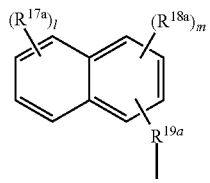

(a6)

In the formula (a6), $R^{17a}$ and $R^{18a}$ each independently represent a hydroxyl group, a linear or branched alkoxy group having 1 or more and 6 or less carbon atoms, or a linear or branched alkyl group having 1 or more and 6 or less carbon atoms, and $R^{19a}$ represents a single bond or a linear or branched alkylene group having 1 or more and 6 or less carbon atoms that may have a substituent. l and m each independently represent an integer of 0 or more and 2 or less, and l+m is 3 or less. Herein, if there exists a plurality of $R^{17a}$s, they may be identical to or different from each other. Furthermore, if there exists a plurality of $R^{18a}$s, they may be identical to or different from each other.

Preferably, among $R^{14a}$, $R^{15a}$ and $R^{16a}$ as above, the number of groups represented by the above formula (a6) is one in view of the stability of the compound, and the remaining are linear or branched alkylene groups having 1 or more and 6 or less carbon atoms of which the terminals may bond to form a ring. In this case, the two alkylene groups described above form a 3- to 9-membered ring including sulfur atom(s). Preferably, the number of atoms to form the ring (including sulfur atom(s)) is 5 or more and 6 or less.

Examples of the substituent, which the alkylene group may have, include an oxygen atom (in this case, a carbonyl group is formed together with a carbon atom that constitutes the alkylene group), a hydroxyl group or the like.

Furthermore, examples of the substituent, which the phenyl group may have, include a hydroxyl group, a linear or branched alkoxy group having 1 or more and 6 or less carbon atoms, a linear or branched alkyl group having 1 or more and 6 or less carbon atoms, or the like.

Examples of cations for the suitable cation moiety include cations represented by the following formulae (a7) and (a8), and the structure represented by the following formula (a8) is particularly preferable.

[Chem. 13]

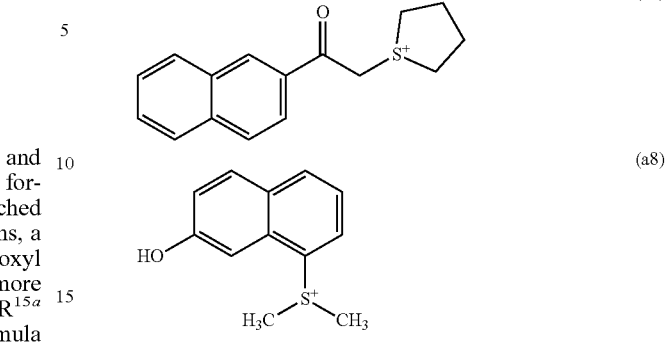

The cation moieties, which may be of an iodonium salt or a sulfonium salt, are desirably of a sulfonium salt in view of acid-producing efficiency.

It is, therefore, desirable that the suitable anions for the anion moiety of the onium salt having a naphthalene ring at the cation moiety is an anion capable of forming a sulfonium salt.

The anion moiety of the acid generator is exemplified by fluoroalkylsulfonic acid ions or aryl sulfonic acid ions, of which hydrogen atom(s) being partially or entirely fluorinated.

The alkyl group of the fluoroalkylsulfonic acid ions may be linear, branched or cyclic and have 1 or more and 20 or less carbon atoms. Preferably, the carbon number is 1 or more and 10 or less in view of bulkiness and diffusion distance of the produced acid. In particular, branched or cyclic alkyl groups are preferable due to shorter diffusion length. Also, methyl, ethyl, propyl, butyl, octyl groups and the like are preferable due to being inexpensively synthesizable.

The aryl group of the aryl sulfonic acid ions may be an aryl group having 6 or more and 20 or less carbon atoms, and is exemplified by a phenol group or a naphthyl group that may be unsubstituted or substituted with an alkyl group or a halogen atom. In particular, aryl groups having 6 or more and 10 or less carbon atoms are preferable due to being inexpensively synthesizable. Specific examples of preferable aryl group include phenyl, toluenesulfonyl, ethylphenyl, naphthyl, methylnaphthyl groups and the like.

When hydrogen atoms in the above fluoroalkylsulfonic acid ion or the aryl sulfonic acid ion are partially or entirely substituted with a fluorine atom, the fluorination rate is preferably 10% or more and 100% or less, and more preferably 50% or more and 100% or less; it is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

Among these, the preferable anion moiety is exemplified by those represented by the following formula (a9).

[Chem.14]

(a9)

In the above formula (a9), $R^{20a}$ represents groups represented by the following formulae (a10), (a11), and (a12).

[Chem. 15]

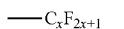
(a10)

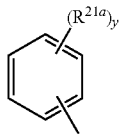
(a11)

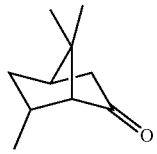
(a12)

In the above formula (a10), x represents an integer of 1 or more and 4 or less. Also, in the above formula (a11), $R^{21a}$ represents a hydrogen atom, a hydroxyl group, a linear or branched alkyl group having 1 or more and 6 or less carbon atoms, or a linear or branched alkoxy group having 1 or more and 6 or less carbon atoms, and y represents an integer of 1 or more and 3 or less. Of these, trifluoromethane sulfonate, and perfluorobutane sulfonate are preferable in view of safety.

In addition, a nitrogen-containing moiety represented by the following formulae (a13) and (a14) may also be used for the anion moiety.

[Chem. 16]

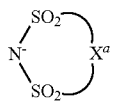
(a13)

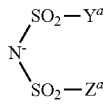
(a14)

In the formulae (a13) and (a14), $X^a$ represents a linear or branched alkylene group in which at least one hydrogen atom is substituted with a fluorine atom, the carbon number of the alkylene group is 2 or more and 6 or less, preferably 3 or more and 5 or less, and most preferably the carbon number is 3. In addition, $Y^a$ and $Z^a$ each independently represent a linear or branched alkyl group of which at least one hydrogen atom is substituted with a fluorine atom, the number of carbon atoms of the alkyl group is 1 or more and 10 or less, preferably 1 or more and 7 or less, and more preferably 1 or more and 3 or less.

The smaller number of carbon atoms in the alkylene group of $X^a$, or in the alkyl group of $Y^a$ or $Z^a$ is preferred since the solubility into organic solvent is favorable.

In addition, a larger number of hydrogen atoms each substituted with a fluorine atom in the alkylene group of $X^a$, or in the alkyl group of $Y^a$ or $Z^a$ is preferred since the acid strength becomes greater. The percentage of fluorine atoms in the alkylene group or alkyl group, i.e., the fluorination rate is preferably 70% or more and 100% or less and more preferably 90% or more and 100% or less, and most preferable are perfluoroalkylene or perfluoroalkyl groups in which all of the hydrogen atoms are each substituted with a fluorine atom.

Examples of preferable compounds for onium salts having a naphthalene ring at their cation moieties include compounds represented by the following formulae (a15) and (a16).

[Chem. 17]

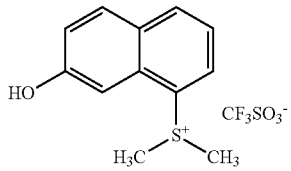
(a15)

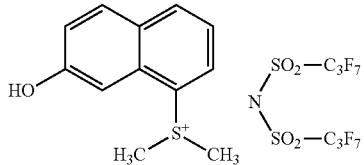
(a16)

Also, the fifth aspect of the acid generator (A) include bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethane sulfonates such as N-(trifluoromethylsulfonyloxy)phthalimide, N-(trifluoromethylsulfonyloxy)-1,8-naphthalimide and N-(trifluoromethylsulfonyloxy)-4-butyl-1,8-naphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl)diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

This acid generator (A) may be used alone, or two or more types may be used in combination. Furthermore, the content of the acid generator (A) is preferably adjusted to 0.1% by mass or more and 10% by mass or less, more preferably adjusted to 0.2% by mass or more and 6% by mass or less, and particularly preferably 0.5% by mass or more and 3% by mass or less, relative to the total mass of the solid component of the photosensitive resin composition. When the amount of the acid generator (A) used is adjusted to the range mentioned above, it is easy to prepare a photosensitive resin composition which is a uniform solution having satisfactory sensitivity and excellent storage stability.

<Resin (B)>

A resin (B) whose solubility in alkali increases under the action of acid is not particularly limited, and any resin whose solubility in alkali increases under the action of acid can be used. Among them, it is preferable to contain at least one resin selected from the group consisting of novolac resin (B1), polyhydroxystyrene resin (B2), and acrylic resin (B3).

[Novolac Resin (B1)]

As the novolak resin (B1), a resin including the constituent unit represented by the following formula (b1) may be used.

[Chem. 18]

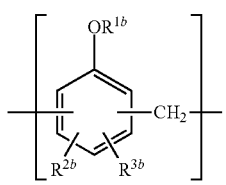

(b1)

In the formula (b1), $R^{1b}$ represents an acid-dissociable dissolution-inhibiting group, and $R^{2b}$ and $R^{3b}$ each independently represent a hydrogen atom or an alkyl group having 1 or more and 6 or less carbon atoms.

The acid-dissociable dissolution-inhibiting group represented by the above $R^{1b}$ is preferably a group represented by the following formula (b2) or (b3), a linear, branched or cyclic alkyl group having 1 or more and 6 or less carbon atoms, a vinyloxyethyl group, a tetrahydropyranyl group, a tetrahydrofuranyl group, or a trialkylsilyl group.

[Chem. 19]

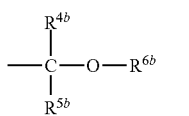

(b2)

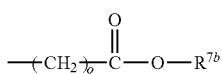

(b3)

In the above formulae (b2) and (b3), $R^{4b}$ and $R^{5b}$ each independently represent a hydrogen atom, or a linear or branched alkyl group having 1 or more and 6 or less carbon atoms, $R^{6b}$ represents a linear, branched or cyclic alkyl group having 1 or more and 10 or less carbon atoms, $R^{7b}$ represents a linear, branched or cyclic alkyl group having 1 or more and 6 or less carbon atoms, and o represents 0 or 1.

Examples of the above linear or branched alkyl group include a methyl group, an ethyl group, a propyl group, an isopropyl group, an n-butyl group, an isobutyl group, a tert-butyl group, a pentyl group, an isopentyl group, a neopentyl group, and the like. Also, examples of the above cyclic alkyl group include a cyclopentyl group, a cyclohexyl group, and the like.

Specific examples of the acid-dissociable dissolution-inhibiting group represented by the above formula (b2) include a methoxyethyl group, ethoxyethyl group, n-propoxyethyl group, isopropoxyethyl group, n-butoxyethyl group, isobutoxyethyl group, tert-butoxyethyl group, cyclohexyloxyethyl group, methoxypropyl group, ethoxypropyl group, 1-methoxy-1-methyl-ethyl group, 1-ethoxy-1-methylethyl group, and the like. Furthermore, specific examples of the acid-dissociable dissolution-inhibiting group represented by the above formula (b3) include a tert-butoxycarbonyl group, a tert-butoxycarbonylmethyl group, and the like. Examples of the above trialkylsilyl group include a trimethylsilyl group and tri-tert-butyldimethylsilyl group in which each alkyl group has 1 or more and 6 or less carbon atoms.

[Polyhydroxystyrene Resin (B2)]

As the polyhydroxystyrene resin (B2), a resin including a constituent unit represented by the following formula (b4) may be used.

[Chem. 20]

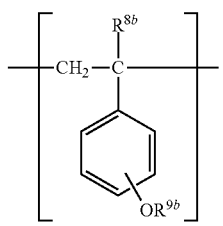

(b4)

In the above formula (b4), $R^{8b}$ represents a hydrogen atom or an alkyl group having 1 or more and 6 or less carbon atoms, and $R^{9b}$ represents an acid-dissociable dissolution-inhibiting group.

The above alkyl group having 1 or more and 6 or less carbon atoms may include, for example, linear, branched or cyclic alkyl groups having 1 or more and 6 or less carbon atoms. Examples of the linear or branched alkyl group include a methyl group, ethyl group, propyl group, isopropyl group, n-butyl group, isobutyl group, tert-butyl group, pentyl group, isopentyl group, neopentyl group, and the like. Examples of the cyclic alkyl group include a cyclopentyl group and cyclohexyl group.

The acid-dissociable dissolution-inhibiting group represented by the above $R^{9b}$ may be similar to the acid-dissociable dissolution-inhibiting groups exemplified in terms of the above formulae (b2) and (b3).

Furthermore, the polyhydroxystyrene resin (B2) may include another polymerizable compound as a constituent unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl (meth)acrylate, ethyl (meth)acrylate and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

[Acrylic Resin (B3)]

An acrylic resin (B3) is not particularly limited as long as it is an acrylic resin the solubility of which in alkali increases under the action of acid, and has conventionally blended in various photosensitive resin compositions. Preferably, the acrylic resin (B3) contains a constituent unit (b-3) derived from, for example, an acrylic ester including an —$SO_2$-containing cyclic group or a lactone-containing cyclic group. In such a case, when a resist pattern is formed, a resist pattern having a preferable cross-sectional shape can be easily formed.

(—$SO_2$-Containing Cyclic Group)

Herein, the "—$SO_2$-containing cyclic group" refers to a cyclic group having a cyclic group containing a ring including —$SO_2$— in the ring skeleton thereof, specifically a cyclic group in which the sulfur atom (S) in —$SO_2$— forms a part of the ring skeleton of the cyclic group. When a ring including —$SO_2$— in the ring skeleton thereof as the first ring, a group having that ring alone is called a monocyclic group, and a group further having another ring structure is called a polycyclic group regardless of its structure. The —$SO_2$-containing cyclic group may be monocyclic or polycyclic.

In particular, the —$SO_2$-containing cyclic group is preferably a cyclic group containing —O—$SO_2$— in the ring skeleton thereof, i.e., a cyclic group containing a sultone ring in which —O—S— in —O—$SO_2$— forms a part of the ring skeleton.

The number of carbon atoms in an —$SO_2$-containing cyclic group is preferably 3 or more and 30 or less, more preferably 4 or more and 20 or less, even more preferably 4 or more and 15 or less, and in particular preferably 4 or more and 12 or less. The above number of carbon atoms is the number of carbon atoms constituting a ring skeleton, and shall not include the number of carbon atoms in a substituent.

The —$SO_2$-containing cyclic group may be an —$SO_2$-containing aliphatic cyclic group or an —$SO_2$-containing aromatic cyclic group. It is preferably an —$SO_2$-containing aliphatic cyclic group.

—$SO_2$— containing aliphatic cyclic groups include a group in which at least one hydrogen atom is removed from an aliphatic hydrocarbon ring where a part of the carbon atoms constituting the ring skeleton thereof is (are) substituted with —$SO_2$— or —O—$SO_2$—. More specifically, they include a group in which at least one hydrogen atom is removed from an aliphatic hydrocarbon ring where —$CH_2$— constituting the ring skeleton thereof is substituted with —$SO_2$— and a group in which at least one hydrogen atom is removed from an aliphatic hydrocarbon ring where —$CH_2$—$CH_2$— constituting the ring thereof is substituted with —O—$SO_2$—.

The number of carbon atoms in the above alicyclic hydrocarbon ring is preferably 3 or more and 20 or less, more preferably 3 or more and 12 or less. The above alicyclic hydrocarbon ring may be polycyclic, or may be monocyclic. As the monocyclic alicyclic hydrocarbon group, preferred is a group in which two hydrogen atoms are removed from monocycloalkane having 3 or more and 6 or less carbon atoms. Examples of the above monocycloalkane can include cyclopentane, cyclohexane and the like. As the polycyclic alicyclic hydrocarbon ring, preferred is a group in which two hydrogen atoms are removed from polycycloalkane having 7 or more and 12 or less carbon atoms, and specific examples of the above polycycloalkane include adamantane, norbornane, isobornane, tricyclodecane, tetracyclododecane and the like.

The —$SO_2$-containing cyclic group may have a substituent. Examples of the above substituent include, for example, an alkyl group, an alkoxy group, a halogen atom, a halogenated alkyl group, a hydroxy group, an oxygen atom (=O), —COOR", —OC(=O)R", a hydroxyalkyl group, a cyano group and the like.

For an alkyl group as the above substituent, preferred is an alkyl group having 1 or more and 6 or less carbon atoms. The above alkyl group is preferably a linear or branched chain. Specific examples include a methyl group, an ethyl group, an n-propyl group, an isopropyl group, an n-butyl group, an isobutyl group, a tert-butyl group, an n-pentyl group, an isopentyl group, a neopentyl group, an n-hexyl group and the like. Among these, a methyl group or an ethyl group is preferred, and a methyl group is particularly preferred.

For an alkoxy group as the above substituent, preferred is an alkoxy group having 1 or more and 6 or less carbon atoms. The above alkoxy group is preferably a linear or branched chain. Specific examples include a group in which an alkyl groups recited as an alkyl group for the above substituent is attached to the oxygen atom (—O—).

Halogen atoms as the above substituent include a fluorine atom, a chlorine atom, a bromine atom, an iodine atom and the like, and a fluorine atom is preferred.

Halogenated alkyl groups for the above substituent include a group in which a part or all of the hydrogen atoms in the above alkyl group is (are) substituted with the above halogen atom(s).

Halogenated alkyl groups as the above substituent include a group in which a part or all of the hydrogen atoms in the alkyl groups recited as an alkyl group for the above substituent is (are) substituted with the above halogen atom(s). As the above halogenated alkyl group, a fluorinated alkyl group is preferred, and a perfluoroalkyl group is particularly preferred.

R"s in the aforementioned —COOR" and —OC(=O)R" are either a hydrogen atom or a linear, branched or cyclic alkyl group having 1 or more and 15 or less carbon atoms.

In a case where R" is a linear or branched alkyl group, the number of carbon atoms in the above chain alkyl group is preferably 1 or more and 10 or less, more preferably 1 or more and 5 or less, and in particular preferably 1 or 2.

In a case where R" is a cyclic alkyl group, the number of carbon atoms in the above cyclic alkyl group is preferably 3 or more and 15 or less, more preferably 4 or more and 12 or less, and in particular preferably 5 or more and 10 or less. Specific examples can include a group in which one or more hydrogen atoms are removed from monocycloalkane; and polycycloalkane such as bicycloalkane, tricycloalkane, tetracycloalkane and the like optionally substituted with a fluorine atom or a fluorinated alkyl group. More specific examples include a group in which one or more hydrogen atoms are removed from monocycloalkane such as cyclopentane and cyclohexane; and polycycloalkane such as adamantane, norbornane, isobornane, tricyclodecane and tetracyclododecane.

For a hydroxyalkyl group as the above substituent, preferred is a hydroxyalkyl group having 1 or more and 6 or less carbon atoms. Specific examples include a group in which at least one of the hydrogen atoms in the alkyl groups recited as an alkyl group for the above substituent is substituted with a hydroxy group.

More specific examples of the —SO$_2$-containing cyclic group include the groups represented by the following formulae (3-1) to (3-4).

[Chem. 21]

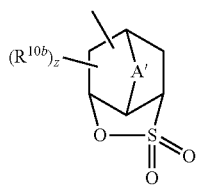

(3-1)

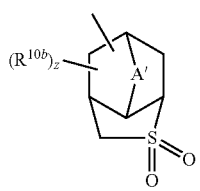

(3-2)

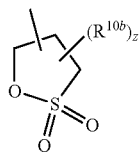

(3-3)

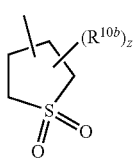

(3-4)

(In the formulae, A' represents an alkylene group having 1 or more and 5 or less carbon atoms optionally including an oxygen atom or a sulfur atom, an oxygen atom or a sulfur atom; z represents an integer of 0 or more and 2 or less; $R^{10b}$ represents an alkyl group, an alkoxy group, a halogenated alkyl group, a hydroxy group, —COOR", —OC(=O)R", a hydroxyalkyl group, or a cyano group; and R" represents a hydrogen atom or an alkyl group.)

In the above formulae (3-1) to (3-4), A' represents an alkylene group having 1 or more and 5 or less carbon atoms optionally including an oxygen atom (—O—) or a sulfur atom (—S—), an oxygen atom or a sulfur atom. As an alkylene group having 1 or more and 5 or less carbon atoms in A', a linear or branched alkylene group is preferred, and examples thereof include a methylene group, an ethylene group, an n-propylene group, an isopropylene group and the like.

In a case where the above alkylene group includes an oxygen atom or a sulfur atom, specific examples thereof include a group in which —O— or —S— is present at a terminal or between carbon atoms of the above alkylene group, for example, —O—CH$_2$—, —CH$_2$—O—CH$_2$—, —S—CH$_2$—, —CH$_2$—S—CH$_2$—, and the like. As A', an alkylene group having 1 or more and 5 or less carbon atoms or —O— is preferred, and an alkylene group having 1 or more and 5 or less carbon atoms is more preferred, and a methylene group is most preferred.

z may be any of 0, 1, and 2, and is most preferably 0. In a case where z is 2, a plurality of $R^{10b}$s may be the same, or may differ from each other.

Examples of an alkyl group, an alkoxy group, a halogenated alkyl group, —COOR", —OC(=O)R" and a hydroxyalkyl group in $R^{10b}$ include those similar to the groups described above for the alkyl group, the alkoxy group, the halogenated alkyl group, —COOR", —OC(=O)R" and the hydroxyalkyl group, respectively, which are recited as a substituent optionally contained in the —SO$_2$-containing cyclic group.

Below, specific cyclic groups represented by the above formulae (3-1) to (3-4) will be illustrated. Note here that "Ac" in the formulae represents an acetyl group.

[Chem. 22]

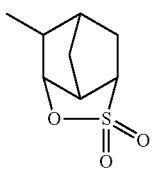

(3-1-1)

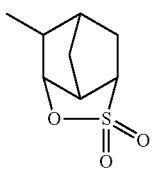

(3-1-2)

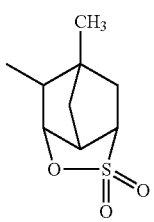

(3-1-3)

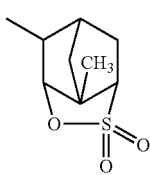

(3-1-4)

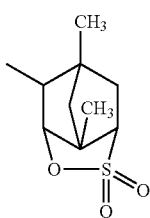

(3-1-5)

(3-1-6)

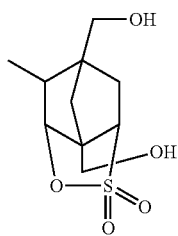
(3-1-7)
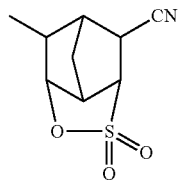
(3-1-14)
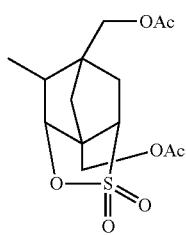
(3-1-8)
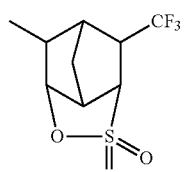
(3-1-15)
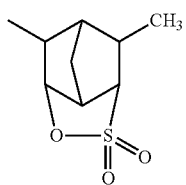
(3-1-9)
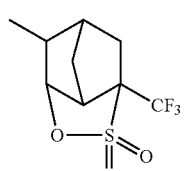
(3-1-16)
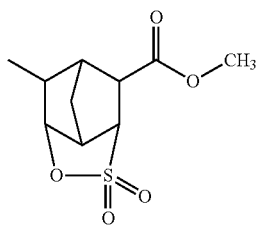
(3-1-10)
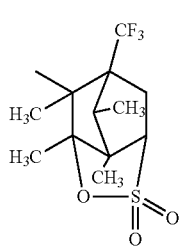
(3-1-17)
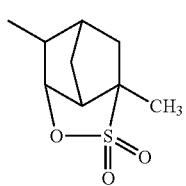
(3-1-11)
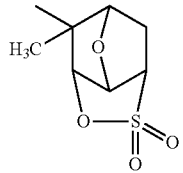
(3-1-18)
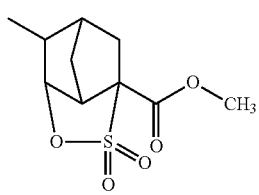
(3-1-12)
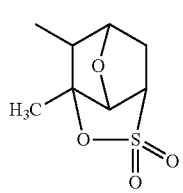
(3-1-19)
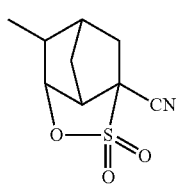
(3-1-13)
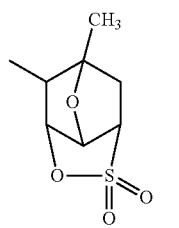
(3-1-20)
(3-1-21)

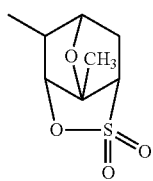
(3-1-22)
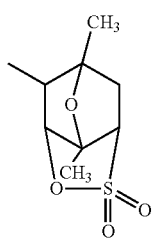
(3-1-23)
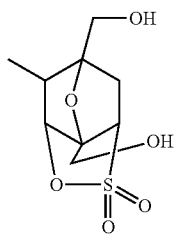
(3-1-24)
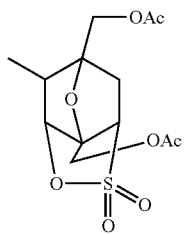
(3-1-25)
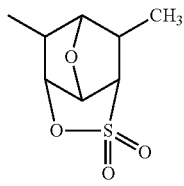
(3-1-26)
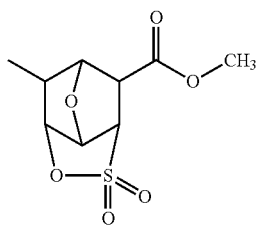
(3-1-27)
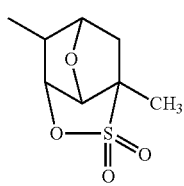
(3-1-28)
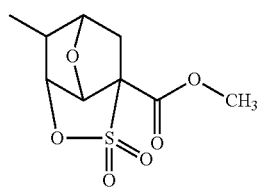
(3-1-29)
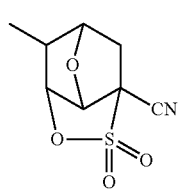
(3-1-30)
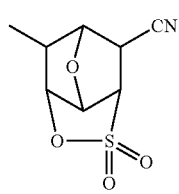
(3-1-31)
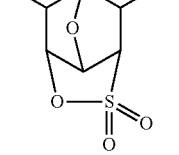
(3-1-32)
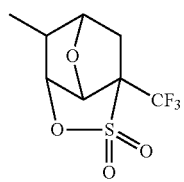
(3-1-33)
[Chem. 23]
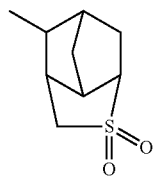
(3-2-1)
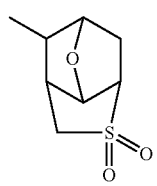
(3-2-2)
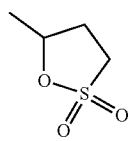
(3-3-1)

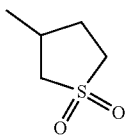
(3-4-1)

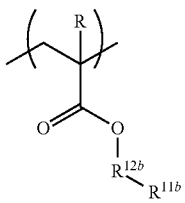
(b-S1)

As the —SO$_2$-containing cyclic group, among those shown above, a group represented by the above formula (3-1) is preferred, and at least one selected from the group consisting of the groups represented by any of the aforementioned formulae (3-1-1), (3-1-18), (3-3-1) and (3-4-1) is more preferred, and a group represented by the aforementioned formula (3-1-1) is most preferred.

(Lactone-Containing Cyclic Group)

The "lactone-containing cyclic group" refers to a cyclic group containing a ring (lactone ring) including —O—C(=O)— in the ring skeleton thereof. Considering the lactone ring as the first ring, a group having that lactone ring alone is called a monocyclic group, and a group further having another ring structure is called a polycyclic group regardless of its structure. The lactone-containing cyclic group may be a monocyclic group, or may be a polycyclic group.

There is no particular limitation on the lactone cyclic group in the constituent unit (b-3), and any cyclic group containing lactone can be used. Specifically, examples of the lactone-containing monocyclic groups include a group in which one hydrogen atom is removed from 4- to 6-membered ring lactone, for example, a group in which one hydrogen atom is removed from β-propiono lactone, a group in which one hydrogen atom is removed from γ-butyrolactone, a group in which one hydrogen atom is removed from δ-valerolactone and the like. Further, lactone-containing polycyclic groups include a group in which one hydrogen atom is removed from bicycloalkane, tricycloalkane and tetracycloalkane having a lactone ring.

As to the structure of the structural unit (b-3), as long as the constituent unit (b-3) has an —SO$_2$-containing cyclic group or a lactone-containing cyclic group, the structure of parts other than an —SO$_2$-containing cyclic group and a lactone-containing cyclic group is not particularly limited. A preferred structural unit (b-3) is at least one constituent unit selected from the group consisting of a constituent unit (b-3-S) derived from an acrylic acid ester including an —SO$_2$-containing cyclic group in which a hydrogen atom attached to the carbon atom in the a position may be substituted with a substituent; and a constituent unit (b-3-L) derived from an acrylic acid ester including a lactone-containing cyclic group in which the hydrogen atom attached to the carbon atom in the a position may be substituted with a substituent.

[Constituent Unit (b-3-S)]

More specifically, examples of the constituent unit (b-3-S) include one represented by the following formula (b-S1).

(In the formula, R represents a hydrogen atom, an alkyl group having 1 or more 5 or less carbon atoms or a halogenated alkyl group having 1 or more 5 or less carbon atoms; and $R^{11b}$ represents an —SO$_2$-containing cyclic group; and $R^{12b}$ represents a single-bond or divalent linking group.)

In the formula (b-S1), R is similarly defined as above. $R^{11b}$ is similarly defined as in the —SO$_2$-containing cyclic group described above. $R^{12b}$ may be either a single-bond linking group or a divalent linking group. A divalent linking group is preferred due to the superior effect of the present invention.

There is no particular limitation on the divalent linking group in $R^{12b}$, and suitable examples include an optionally substituted divalent hydrocarbon group, a divalent linking group including a heteroatom, and the like.

—Optionally Substituted Divalent Hydrocarbon Group

The hydrocarbon group as a divalent linking group may be an aliphatic hydrocarbon group, or may be an aromatic hydrocarbon group. The aliphatic hydrocarbon group means a hydrocarbon group without aromaticity. The above aliphatic hydrocarbon group may be saturated or may be unsaturated. Usually, a saturated hydrocarbon group is preferred. More specifically, examples of the above aliphatic hydrocarbon group include a linear or branched aliphatic hydrocarbon group, an aliphatic hydrocarbon group including a ring in the structure thereof and the like.

The number of carbon atoms in the linear or branched aliphatic hydrocarbon group is preferably 1 or more and 10 or less, more preferably 1 or more and 8 or less, and even more preferably 1 or more and 5 or less.

As the linear aliphatic hydrocarbon group, a linear alkylene group is preferred. Specific examples include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$-] and the like.

As the branched aliphatic hydrocarbon group, a branched alkylene group is preferred. Specific examples include alkyl alkylene groups such as alkyl methylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkyl ethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—; alkyl trimethylene groups such as —CH(CH$_3$)CH$_2$CH$_2$— and —CH$_2$CH(CH$_3$)CH$_2$—; alkyl tetramethylene groups such as —CH(CH$_3$)CH$_2$CH$_2$CH$_2$— and —CH$_2$CH(CH$_3$)CH$_2$CH$_2$—; and the like. As an alkyl group in the alkyl alkylene group, a linear alkyl group having 1 or more and 5 or less carbon atoms is preferred.

The above linear or branched aliphatic hydrocarbon group may or may not have a substituent (a group or atom other than a hydrogen atom) which substitutes a hydrogen atom.

Examples of the substituent include a fluorine atom, a fluorinated alkyl group having 1 or more and 5 or less carbon atoms substituted with a fluorine atom, an oxo group (=O) and the like.

Examples of the above aliphatic hydrocarbon group including a ring in the structure thereof include a cyclic aliphatic hydrocarbon group optionally including a hetero atom in the ring structure (a group in which two hydrogen atoms are removed from an aliphatic hydrocarbon ring); a group in which the above cyclic aliphatic hydrocarbon group is attached to an end of a linear or branched aliphatic hydrocarbon group; a group in which the above cyclic aliphatic hydrocarbon group is present in a linear or branched aliphatic hydrocarbon group along the chain; and the like. Examples of the above linear or branched aliphatic hydrocarbon group include groups similar to the above.

The number of carbon atoms in the cyclic aliphatic hydrocarbon group is preferably 3 or more and 20 or less, and more preferably 3 or more and 12 or less.

The cyclic aliphatic hydrocarbon group may be polycyclic, or may be monocyclic. As the monocyclic aliphatic hydrocarbon group, a group in which two hydrogen atoms are removed from monocycloalkane is preferred. The number of carbon atoms in the above monocycloalkane is preferably 3 or more and 6 or less. Specific examples include cyclopentane, cyclohexane and the like. As the polycyclic aliphatic hydrocarbon group, a group in which two hydrogen atoms are removed from polycycloalkane is preferred. The number of carbon atoms in the above polycycloalkane is preferably 7 or more and 12 or less. Specific examples include adamantane, norbornane, isobornane, tricyclodecane, tetracyclododecane and the like.

The cyclic aliphatic hydrocarbon group may or may not have a substituent which substitutes a hydrogen atom (a group or atom other than a hydrogen atom). Examples of the above substituent include an alkyl group, an alkoxy group, a halogen atom, a halogenated alkyl group, a hydroxy group, an oxo group (=O) and the like.

For an alkyl group as the above substituent, an alkyl group having 1 or more and 5 or less carbon atoms is preferred, and a methyl group, an ethyl group, a propyl group, an n-butyl group and a tert-butyl group are more preferred.

For an alkoxy group as the above substituent, an alkoxy group having 1 or more and 5 or less carbon atoms is preferred, and a methoxy group, an ethoxy group, an n-propoxy group, an iso-propoxy group, an n-butoxy group and a tert-butoxy group are more preferred, and a methoxy group and an ethoxy group are particularly preferred.

Halogen atoms as the above substituent include a fluorine atom, a chlorine atom, a bromine atom, an iodine atom and the like, and a fluorine atom is preferred.

Halogenated alkyl groups as the above substituent include a group in which a part or all of the hydrogen atoms in the aforementioned alkyl group is (are) substituted with the above halogen atom(s).

In the cyclic aliphatic hydrocarbon group, a part of carbon atoms constituting the ring structure thereof may be substituted with —O—, or —S—. As the substituent including the above hetero atom, preferred are —O—, —C(=O)—O—, —S—, —S(=O)$_2$— and —S(=O)$_2$—O—.

The aromatic hydrocarbon group as the divalent hydrocarbon group is a divalent hydrocarbon group having at least one aromatic ring, and may have a substituent. There is no particular limitation on the aromatic ring as long as it is a cyclic conjugated system having a 4n+2 π electrons, and it may be monocyclic or may be polycyclic. The number of carbon atoms in the aromatic ring is preferably 5 or more and 30 or less, more preferably 5 or more and 20 or less, further more preferably 6 or more and 15 or less, and particularly preferably 6 or more and 12 or less. However, the number of carbon atoms in a substituent shall not be included in the above number of carbon atoms.

Specifically, aromatic rings include aromatic hydrocarbon rings such as benzene, naphthalene, anthracene and phenanthrene; aromatic heterocycles in which a part of the carbon atoms constituting the above aromatic hydrocarbon ring is (are) substituted with hetero atom(s). Hetero atoms in the aromatic heterocycle include an oxygen atom, a sulfur atom, a nitrogen atom and the like. Specifically, aromatic heterocycles include a pyridine ring, a thiophene ring, and the like.

Specific examples of the aromatic hydrocarbon group as a divalent hydrocarbon group include a group in which two hydrogen atoms are removed from the above aromatic hydrocarbon ring or the above aromatic heterocycle (an arylene group or a heteroarylene group); a group in which two hydrogen atoms are removed from an aromatic compound including two or more aromatic rings (for example, biphenyl, fluorene and the like); a group in which one hydrogen atom from a group where one hydrogen atom is removed from the above aromatic hydrocarbon ring or the above aromatic heterocycle (an aryl group or a heteroaryl group) is substituted with an alkylene group (for example, a group in which one hydrogen atom is further removed from an aryl group in an arylalkyl group such as a benzyl group, a phenethyl group, a 1-naphthylmethyl group, a 2-naphthylmethyl group, a 1-naphthylethyl group and a 2-naphthylethyl group); and the like.

The number of carbon atoms in the above alkylene group bonded to an aryl group or a heteroaryl group is preferably 1 or more and 4 or less, more preferably 1 or more and 2 or less, and particularly preferably 1.

In the above aromatic hydrocarbon group, a hydrogen atom of the above aromatic hydrocarbon group may be substituted with a substituent. For example, a hydrogen atom attached to an aromatic ring in the above aromatic hydrocarbon group may be substituted with a substituent. Examples of the substituent include an alkyl group, an alkoxy group, a halogen atom, a halogenated alkyl group, a hydroxy group, an oxo group (=O) and the like.

For an alkyl group as the above substituent, an alkyl group having 1 or more and 5 or less carbon atoms is preferred, and a methyl group, an ethyl group, an n-propyl group, an n-butyl group and a tert-butyl group are more preferred.

For an alkoxy group as the above substituent, an alkoxy group having 1 or more and 5 or less carbon atoms is preferred, and a methoxy group, an ethoxy group, an n-propoxy group, an iso-propoxy group, an n-butoxy group and a tert-butoxy group are preferred, and a methoxy group and an ethoxy group are more preferred.

Halogen atoms as the above substituent include a fluorine atom, a chlorine atom, a bromine atom, an iodine atom and the like, and a fluorine atom is preferred.

Halogenated alkyl groups as the above substituent include a group in which a part or all of the hydrogen atoms in the aforementioned alkyl group is (are) substituted with the above halogen atom(s)

Divalent Linking Group Including Hetero Atom

A hetero atom in the divalent linking group including a hetero atom is an atom other than a carbon atom and a hydrogen atom, and examples thereof include an oxygen atom, a nitrogen atom, a sulfur atom, a halogen atom and the like.

Specific examples of the divalent linking group including a hetero atom include non-hydrocarbon based linking groups such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)—, =N—, and combinations of at least one of these non-hydrocarbon based linking groups and a divalent hydrocarbon group and the like. Examples of the above divalent hydrocarbon group include those similar to the aforementioned divalent hydrocarbon groups optionally having a substituent, and linear or branched aliphatic hydrocarbon groups are preferred.

Among those described above, —NH— in —C(=O)—NH—, and H in —NH— and —NH—C(=NH)— may be substituted with a substituent such as an alkyl group or an acyl group, respectively. The number of carbon atoms in the above substituent is preferably 1 or more and 10 or less, more preferably 1 or more and 8 or less, and in particular preferably 1 or more and 5 or less.

As a divalent linking group in $R^{12b}$, a linear or branched alkylene group, a cyclic aliphatic hydrocarbon group, or a divalent linking group including a hetero atom is preferred.

In a case where the divalent linking group in $R^{12b}$ is a linear or branched alkylene group, the number of carbon atoms in the above alkylene group is preferably 1 or more and 10 or less, more preferably 1 or more and 6 or less, in particular preferably 1 or more and 4 or less, and most preferably 1 or more and 3 or less. Specific examples include groups similar to the linear alkylene groups or branched alkylene groups recited as a linear and branched aliphatic hydrocarbon group in the description of the "divalent hydrocarbon group optionally having a substituent" as the aforementioned divalent linking group.

In a case where the divalent linking group in $R^{12b}$ is an cyclic aliphatic hydrocarbon group, examples of the above cyclic aliphatic hydrocarbon group include groups similar to the cyclic aliphatic hydrocarbon groups recited as the "aliphatic hydrocarbon group including a ring in the structure" in the description of the "divalent hydrocarbon group optionally having a substituent" as the aforementioned divalent linking group.

As the above cyclic aliphatic hydrocarbon group, particularly preferred is a group in which two or more hydrogen atoms are removed from cyclopentane, cyclohexane, norbornane, isobornane, adamantane, tricyclodecane or tetracyclododecane.

In a case where the divalent linking group in $R^{12b}$ is a divalent linking group including a hetero atom, groups preferred as the above linking groups include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O— and a group represented by the general formula —$Y^{1b}$—O—$Y^{2b}$—, —[$Y^{1b}$—C(=O)—O]m-$Y^{2b}$— or —$Y^{1b}$—O—C(=O)—$Y^{2b}$— (wherein $Y^{1b}$ and $Y^{2b}$ are divalent hydrocarbon groups each independently, optionally having a substituent, and O represents an oxygen atom, and m' is an integer of 0 or more and 3 or less).

In a case where the divalent linking group in $R^{12b}$ is —NH—, the hydrogen atom in —NH— may be substituted with a substituent such as an alkyl group or an acyl group. The number of carbon atoms in the above substituent (an alkyl group, an acyl group and the like) is preferably 1 or more and 10 or less, more preferably 1 or more and 8 or less, and in particular preferably 1 or more and 5 or less.

$Y^{1b}$ and $Y^{2b}$ in the formula $Y^{1b}$—O—$Y^{2b}$—, —[$Y^{1b}$—C(=O)—O]m-$Y^{2b}$— or —$Y^{1b}$—O—C(=O)—$Y^{2b}$— are divalent hydrocarbon groups each independently, optionally having a substituent. Examples of the above divalent hydrocarbon group include groups similar to the "divalent hydrocarbon group optionally having a substituent" recited in the description of the above divalent linking group.

As $Y^{1b}$, a linear aliphatic hydrocarbon group is preferred, and a linear alkylene group is more preferred, and a linear alkylene group having 1 or more and 5 or less carbon atoms is more preferred, and a methylene group and an ethylene group are particularly preferred.

As $Y^{2b}$, a linear or branched aliphatic hydrocarbon group is preferred, and a methylene group, an ethylene group and an alkylmethylene group are more preferred. The alkyl group in the above alkylmethylene group is preferably a linear alkyl group having 1 or more and 5 or less carbon atoms, more preferably a linear alkyl group having 1 or more and 3 or less carbon atoms, and particularly preferably a methyl group.

In a group represented by the formula —[$Y^{1b}$—C(=O)—O]$_m$, —$Y^{2b}$—, m' is an integer of 0 or more and 3 or less, preferably an integer of 0 or more and 2 or less, more preferably 0 or 1, and particularly preferably 1. In other words, as a group represented by the formula —[$Y^{1b}$—C(=O)—O]$_m$, —$Y^{2b}$—, a group represented by the formula —$Y^{1b}$—C(=O)—O—$Y^{2b}$— is particularly preferred. Among these, a group represented by the formula —(CH$_2$)$_a$—C(=O)—O—(CH$_2$)$_b$— is preferred. In the above formula, a' is an integer of 1 or more and 10 or less, preferably an integer of 1 or more and 8 or less, more preferably an integer of 1 or more and 5 or less, even more preferably 1 or 2, and most preferably 1. b' is an integer of 1 or more and 10 or less, preferably an integer of 1 or more and 8 or less, more preferably an integer of 1 or more and 5 or less, even more preferably 1 or 2, and most preferably 1.

With regard to the divalent linking group in $R^{12b}$, an organic group including a combination of at least one non-hydrocarbon group and a divalent hydrocarbon group is preferred as the divalent linking group including a hetero atom. Among these, a linear chain group having an oxygen atom as a hetero atom, for example, a group including an ether bond or an ester bond is preferred, and a group represented by the aforementioned formula —$Y^{1b}$—O—$Y^{2b}$—, —[$Y^{1b}$—C(=O)—O]$_m$—$Y^{2b}$— or —$Y^{1b}$—O—C(=O)—$Y^{2b}$— is more preferred, and a group represented by the aforementioned formula —[$Y^{1b}$—C(=O)—O]$_m$—$Y^{2b}$— or —$Y^{1b}$—O—C(=O)—$Y^{2b}$— is particularly preferred.

As the divalent linking group in $R^{12b}$, a group including an alkylene group or an ester bond (—C(=O)—O—) is preferred.

The above alkylene group is preferably a linear or branched alkylene group. Suitable examples of the above linear aliphatic hydrocarbon group include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$-] and the like. Suitable examples of the above branched alkylene group include alkyl alkylene groups such as alkyl methylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkyl ethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—; alkyl trimethylene groups such as —CH(CH$_3$)CH$_2$CH$_2$— and —CH$_2$CH(CH$_3$)CH$_2$—; alkyl tetramethylene groups such as —CH(CH$_3$)CH$_2$CH$_2$CH$_2$— and —CH$_2$CH(CH$_3$) CH$_2$CH$_2$—.

As the divalent linking group including an ester bond, particularly preferred is a group represented by the formula: —R$^{13b}$—C(=O)—O—[wherein R$^{13b}$ represents a divalent linking group.]. In other words, the constituent unit (b-3-S) is preferably a constituent unit represented by the following formula (b-S1-1).

[Chem. 25]

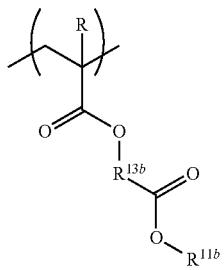

(b-S1-1)

(In the formula, R and R$^{11}b$ are each similar to the above, and R$^{13b}$ represents a divalent linking group.)

There is no particular limitation for R$^{13b}$, examples thereof include groups similar to the aforementioned divalent linking group in R$^{12b}$. As the divalent linking group in R$^{13b}$, a linear or branched alkylene group, an aliphatic hydrocarbon group including a ring in the structure, or a divalent linking group including a hetero atom is preferred, and a linear or branched alkylene group or a divalent linking group including an oxygen atom as a hetero atom is preferred.

As the linear alkylene group, a methylene group or an ethylene group is preferred, and a methylene group is particularly preferred. As the branched alkylene group, an alkylmethylene group or an alkylethylene group is preferred, and —CH(CH$_3$)—, —C(CH$_3$)$_2$— or —C(CH$_3$)$_2$CH$_2$— is particularly preferred.

As the divalent linking group including an oxygen atom, a divalent linking group including an ether bond or an ester bond is preferred, and the aforementioned —Y$^{1b}$—O—Y$^{2b}$—, —[Y$^{1b}$—C(=O)—O]$_{m'}$—Y$^{2b}$— or —Y$^b$—O—C(=O)—Y$^{2b}$— is more preferred. Y$^{1b}$ and Y$^{2b}$ are each independently divalent hydrocarbon groups optionally having a substituent, and m' is an integer of 0 or more and 3 or less. Among these, —Y$^{1b}$—O—C(=O)—Y$^{2b}$— is preferred, and a group represented by —(CH$_2$)$_c$—O—C(=O)—(CH$_2$)$_d$— is particularly preferred. c is an integer of 1 or more and 5 or less, and 1 or 2 is preferred. d is an integer of 1 or more and 5 or less, and 1 or 2 is preferred.

As the constituent unit (b-3-S), in particular, one represented by the following formula (b-S1-11) or (b-S1-12) is preferred, and one represented by the formula (b-S1-12) is more preferred.

[Chem. 26]

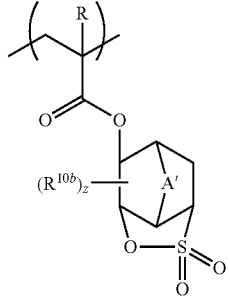

(b-S1-11)

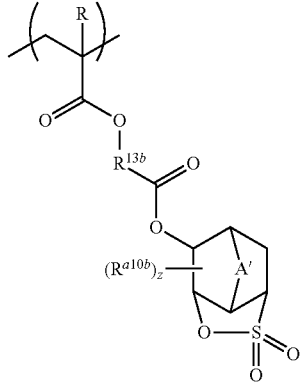

(b-S1-12)

(In the formulae, R, A', R$^{10b}$, z and R$^{13b}$ are each the same as the above.)

In the formula (b-S1-11), A' is preferably a methylene group, an oxygen atom (—O—) or a sulfur atom (—S—).

As R$^{13b}$, preferred is a linear or branched alkylene group or a divalent linking group including an oxygen atom. Examples of the linear or branched alkylene group and the divalent linking group including an oxygen atom in R$^{13b}$ include groups similar to the aforementioned linear or branched alkylene group and the aforementioned divalent linking group including an oxygen atom, respectively.

As the constituent unit represented by the formula (b-S1-12), particularly preferred is one represented by the following formula (b-S1-12a) or (b-S1-12b).

[Chem. 27]

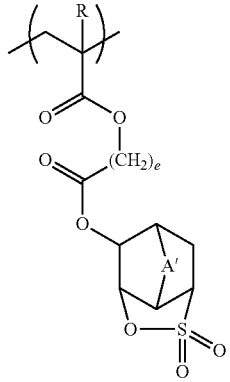

(b-S1-12a)

-continued (b-S1-12b)

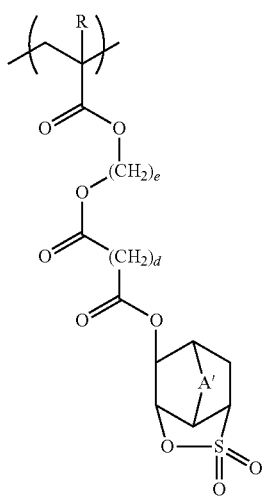

(In the formulae, R and A' are each the same as the above, and c to e are each independently an integer of 1 or more and 3 or less.)

[Constituent Unit (b-3-L)]

Examples of the constituent unit (b-3-L) include, for example, a constituent unit in which $R^{11b}$ in the aforementioned formula (b-S1) is substituted with a lactone-containing cyclic group. More specifically they include those represented by the following formulae (b-L1) to (b-L5).

[Chem. 28]

(b-L1)

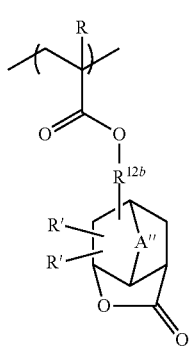

(b-L2)

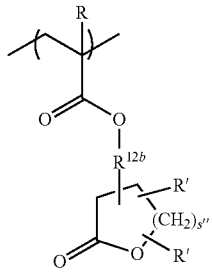

(b-L3)

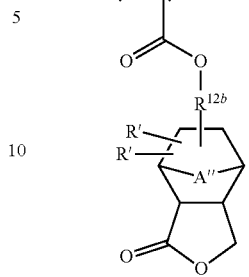

(b-L4)

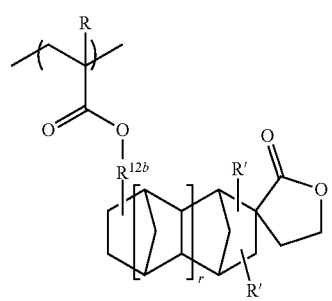

(b-L5)

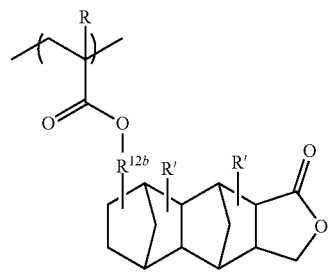

(In the formulae, R represents a hydrogen atom, an alkyl group having 1 or more and 5 or less carbon atoms or a halogenated alkyl group having 1 or more and 5 or less carbon atoms; R' represents each independently a hydrogen atom, an alkyl group, an alkoxy group, a halogenated alkyl group, a hydroxy group, —COOR", —OC(=O)R", a hydroxyalkyl group or a cyano group, and R" represents a hydrogen atom or an alkyl group; $R^{12b}$ represents a single bond or divalent linking group, and s" is an integer of 0 or more and 2 or less; A" represents an alkylene group having 1 or more and 5 or less carbon atoms optionally including an oxygen atom or a sulfur atom, an oxygen atom or a sulfur atom; and r is 0 or 1.)

R in the formulae (b-L1) to (b-L5) is the same as the above. Examples of the alkyl group, the alkoxy group, the halogenated alkyl group, —COOR", —OC(=O)R" and the hydroxyalkyl group in R' include groups similar to those described for the alkyl group, the alkoxy group, the halogenated alkyl group, —COOR", —OC(=O)R" and the hydroxyalkyl group recited as a substituent which the —SO$_2$-containing cyclic group may have, respectively.

R' is preferably a hydrogen atom in view of easy industrial availability and the like. The alkyl group in R" may be any of a linear, branched or cyclic chain. In a case where R" is a linear or branched alkyl group, the number of carbon atoms is preferably 1 or more and 10 or less, and more preferably 1 or more and 5 or less. In a case where R" is a cyclic alkyl group, the number of carbon atoms is preferably 3 or more and 15 or less, more preferably 4 or more and 12 or less, and most preferably 5 or more and 10 or less. Specific examples include a group in which one or more hydrogen atoms are removed from monocycloalkane and polycycloalkane such as bicycloalkane, tricycloalkane, tetracycloalkane and the like optionally substituted with a fluorine atom or a fluorinated alkyl group. Specific examples include a group in which one or more hydrogen atoms are removed from monocycloalkane such as cyclopentane and cyclohexane; and polycycloalkane such as adamantane, norbornane, isobornane, tricyclodecane and tetracyclododecane; and the like. Examples of A" include groups similar to A' in the aforementioned formula (3-1). A" is preferably an alkylene group having 1 to 5 carbon atoms, an oxygen atom (—O—) or a sulfur atom (—S—), more preferably an alkylene group having 1 or more and 5 or less carbon atoms or —O—. As the alkylene group having 1 or more and 5 or less carbon atoms, a methylene group or a dimethylmethylene group is more preferred, and a methylene group is most preferred.

$R^{12b}$ is similar to $R^{12b}$ in the aforementioned formula (b-S1). In the formula (b-L1), s" is preferably 1 or 2. Below, specific examples of the constituent units represented by the aforementioned formulae (b-L1) to (b-L3) will be illustrated. In each of the following formulae, $R^\alpha$ represents a hydrogen atom, a methyl group or a trifluoromethyl group.

[Chem. 29]

(b-L1-1)
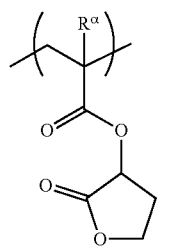

(b-L1-2)
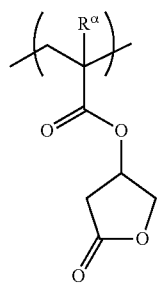

(b-L1-3)
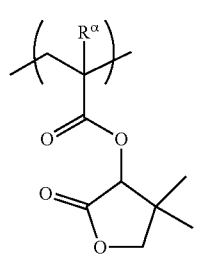

-continued (b-L1-4)
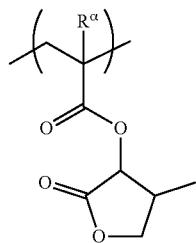

(b-L1-5)
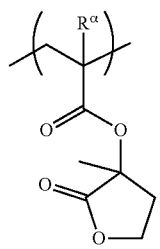

(b-L1-6)
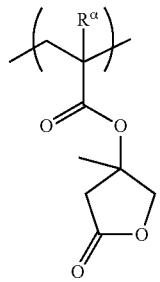

(b-L1-7)
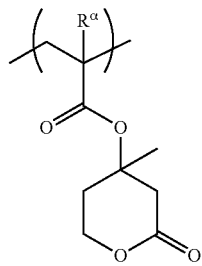

(b-L1-8)
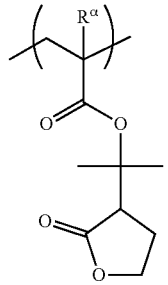

(b-L1-9)
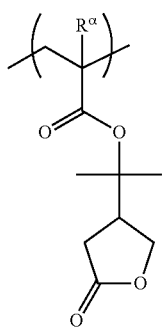
(b-L1-10)
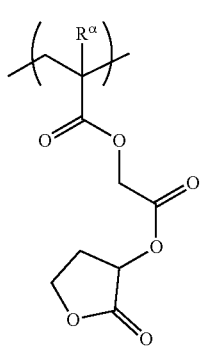
(b-L1-11)
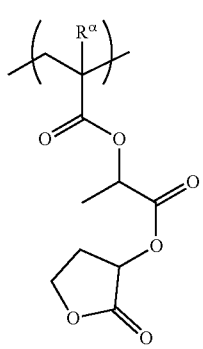
(b-L1-12)
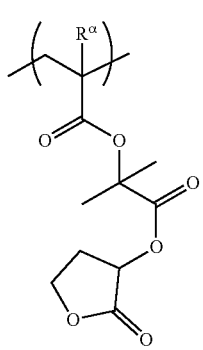
(b-L1-13)
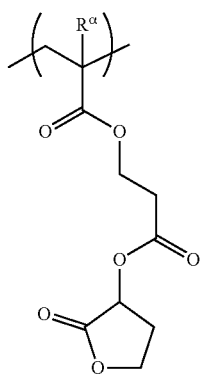
[Chem. 30]
(b-L2-1)
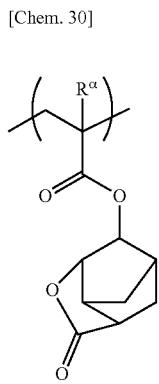
(b-L2-2)
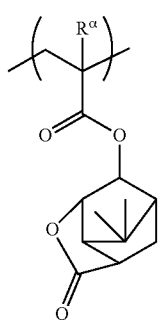
(b-L2-3)
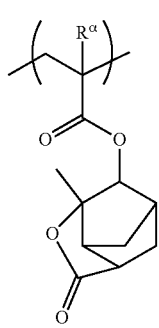

(b-L2-4)
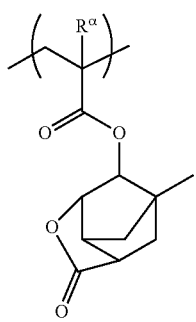
(b-L2-5)
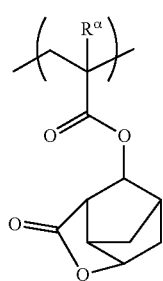
(b-L2-6)
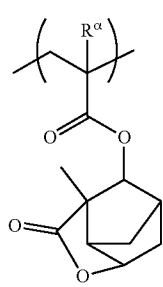
(b-L2-7)
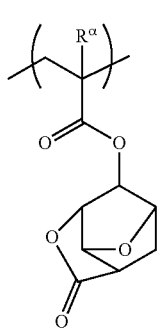
(b-L2-8)
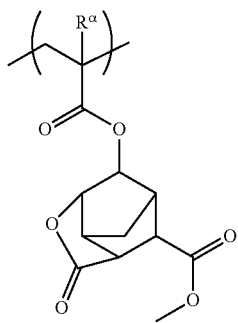
(b-L2-9)
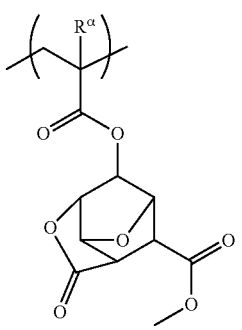
(b-L2-10)
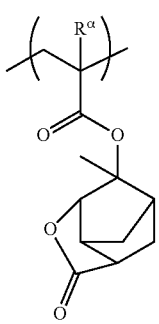
(b-L2-11)
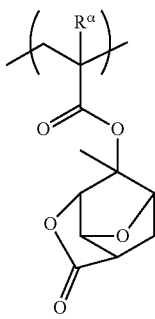
(b-L2-12)
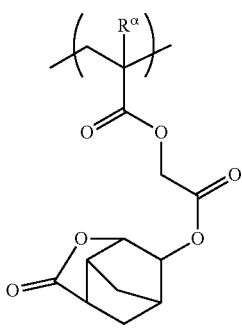

(b-L2-13) 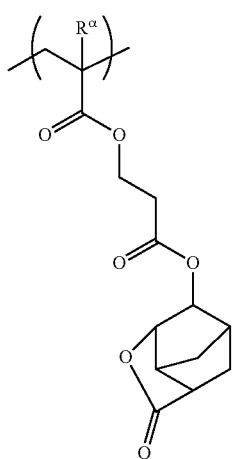
(b-L2-17) 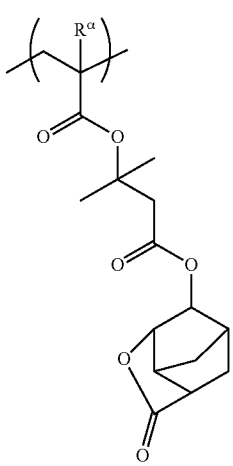
(b-L2-14)
[Chem. 31]
(b-L3-1) 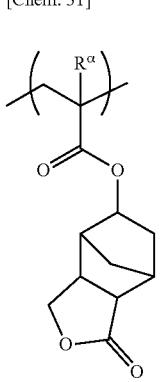
(b-L2-15) 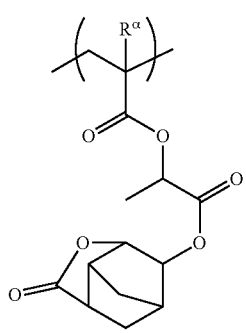
(b-L3-2) 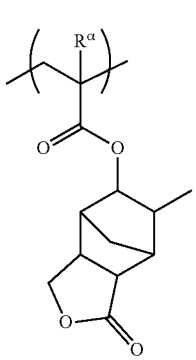
(b-L2-16) 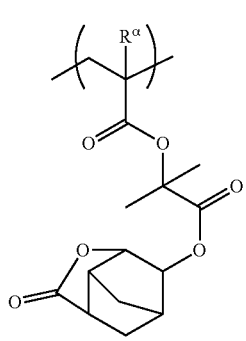
(b-L3-3) 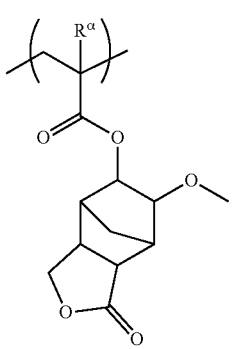

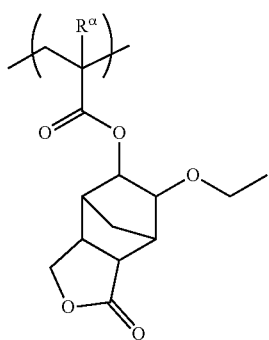
(b-L3-4)

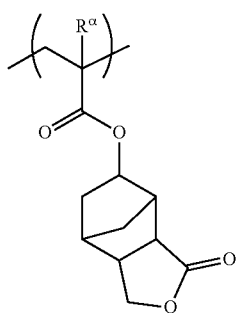
(b-L3-5)

As the constituent unit (b-3a-L), at least one selected from the group consisting of the constituent units represented by the aforementioned formulae (b-L1) to (b-L5) is preferred, and at least one selected from the group consisting of the constituent units represented by the formulae (b-L1) to (b-L3) is more preferred, and at least one selected from the group consisting of the constituent units represented by the aforementioned formula (b-L1) or (b-L3) is particularly preferred. Among these, at least one selected from the group consisting of the constituent units represented by the aforementioned formulae (b-L1-1), (b-L1-2), (b-L2-1), (b-L2-7), (b-L2-12), (b-L2-14), (b-L3-1) and (b-L3-5) is preferred.

Further, as the constituent unit (b-3-L), the constituent units represented by following formulae (b-L6) to (b-L7) are also preferred.

[Chem. 32]

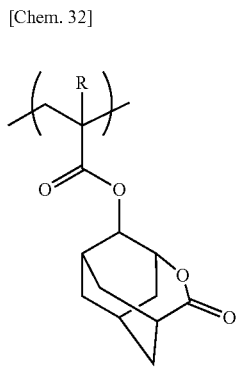
(b-L6)

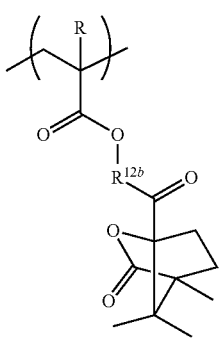
(b-L7)

R and $R^{12b}$ in the formulae (b-L6) and (b-L7) are the same as the above.

Further, the acrylic resin (B3) includes constituent units represented by the following formulae (b5) to (b7), having an acid dissociable group, as constituent units that enhance the solubility of the acrylic resin (B3) in alkali under the action of acid.

[Chem. 33]

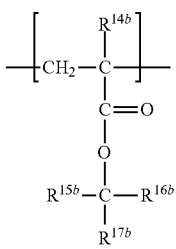
(b5)

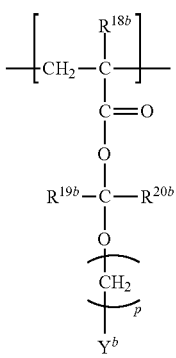
(b6)

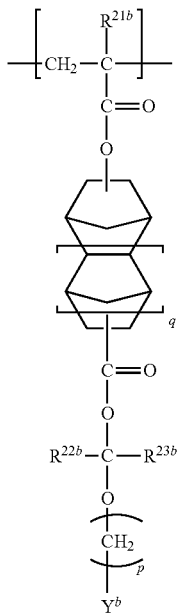

(b7)

In the above formulae (b5) to (b7), $R^{14b}$ and $R^{18b}$ to $R^{23b}$ each independently represent a hydrogen atom, a linear or branched alkyl group having 1 or more and 6 or less carbon atoms, a fluorine atom, or a linear or branched fluorinated alkyl group having 1 or more and 6 or less carbon atoms; $R^{15b}$ to $R^{17b}$ each independently represent a linear or branched alkyl group having 1 or more and 6 or less carbon atoms, a linear or branched fluorinated alkyl group having 1 or more and 6 or less carbon atoms, or an aliphatic cyclic group having 5 or more and 20 or less carbon atoms, and each independently represent a linear or branched alkyl group having 1 or more and 6 or less carbon atoms, or a linear or branched fluorinated alkyl group having 1 or more and 6 or less carbon atoms; and $R^{16b}$ and $R^{17b}$ may be bonded to each other to form a hydrocarbon ring having 5 or more and 20 or less carbon atoms together with the carbon atom to which both the groups are bonded; $Y^b$ represents an optionally substituted aliphatic group or alkyl group; p is an integer of 0 or more and 4 or less; and q is 0 or 1.

Note here that examples of the linear or branched alkyl group include a methyl group, ethyl group, propyl group, isopropyl group, n-butyl group, isobutyl group, tert-butyl group, pentyl group, isopentyl group, neopentyl group, and the like. Furthermore, the fluorinated alkyl group refers to the abovementioned alkyl groups of which the hydrogen atoms are partially or entirely substituted with fluorine atoms. Specific examples of aliphatic cyclic groups include groups obtained by removing one or more hydrogen atoms from monocycloalkanes or polycycloalkanes such as bicycloalkanes, tricycloalkanes, and tetracycloalkanes. Specifically, groups obtained by removing one hydrogen atom from a monocycloalkane such as cyclopentane, cyclohexane, cycloheptane, or cyclooctane, or a polycycloalkane such as adamantane, norbornane, isobornane, tricyclodecane, or tetracyclododecane may be mentioned. In particular, groups obtained by removing one hydrogen atom from cyclohexane or adamantane (which may further be substituted) are preferred.

When $R^{16b}$ and $R^{17b}$ do not combine with each other to form a hydrocarbon ring, the above $R^{15b}$, $R^{16b}$, and $R^{17b}$ preferably represent a linear or branched alkyl group having 2 or more and 4 or less carbon atoms, for example, from the viewpoints of a high contrast and favorable resolution and depth of focus. The above $R^{19b}$, $R^{20b}$, $R^{22b}$, and $R^{23b}$ preferably represent a hydrogen atom or a methyl group.

The above $R^{16b}$ and $R^{17b}$ may form an aliphatic cyclic group having 5 or more and 20 or less carbon atoms together with a carbon atom to which both are attached. Specific examples of such an alicyclic group are the groups of monocycloalkanes and polycycloalkanes such as bicycloalkanes, tricycloalkanes and tetracycloalkanes from which one or more hydrogen atoms are removed. Specific examples thereof are the groups of monocycloalkanes such as cyclopentane, cyclohexane, cycloheptane and cyclooctane and polycycloalkanes such as adamantane, norbornane, isobornane, tricyclodecane and tetracyclododecane from which one or more hydrogen atoms are removed. Particularly preferable are the groups of cyclohexane and adamantane from which one or more hydrogen atoms are removed (that may further have a substituent).

Further, in a case where an aliphatic cyclic group to be formed with the above $R^{16b}$ and $R^{17b}$ has a substituent on the ring skeleton thereof, examples of the substituent include a polar group such as a hydroxy group, a carboxyl group, a cyano group and an oxygen atom (=O), and a linear or branched alkyl group having 1 or more and 4 or less carbon atoms. As the polar group, an oxygen atom (=O) is particularly preferred.

The above $Y^b$ is an alicyclic group or an alkyl group; and examples thereof are the groups of monocycloalkanes and polycycloalkanes such as bicycloalkanes, tricycloalkanes and tetracycloalkanes from which one or more hydrogen atoms are removed. Specific examples thereof are the groups of monocycloalkanes such as cyclopentane, cyclohexane, cycloheptane and cyclooctane, and polycycloalkanes such as adamantane, norbornane, isobornane, tricyclodecane and tetracyclododecane from which one or more hydrogen atoms are removed. Particularly preferable is the group of adamantane from which one or more hydrogen atoms are removed (that may further have a substituent).

When the alicyclic group of the above $Y^b$ has a substituent on the ring skeleton, the substituent is exemplified by polar groups such as a hydroxy group, carboxyl group, cyano group and oxygen atom (=O), and linear or branched alkyl groups having 1 or more and 4 or less carbon atoms. The polar group is preferably an oxygen atom (=O) in particular.

When $Y^b$ is an alkyl group, it is preferably a linear or branched alkyl group having 1 or more and 20 or less carbon atoms, and more preferably 6 or more and 15 or less carbon atoms. The alkyl group is an alkoxyalkyl group particularly preferable. Examples of such an alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the constituent unit represented by the above formula (b5) include constituent units represented by the following formulae (b5-1) to (b5-33).

[Chem. 34]
(b5-1) 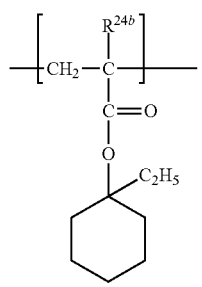
(b5-2) 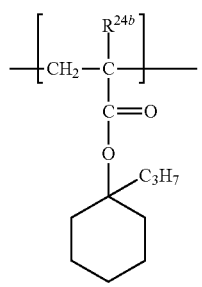
(b5-3) 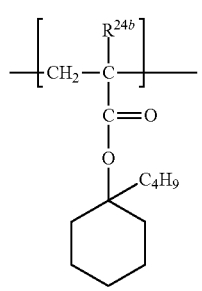
(b5-4) 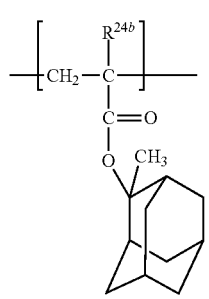
(b5-5) 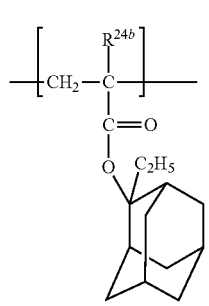
-continued
(b5-6) 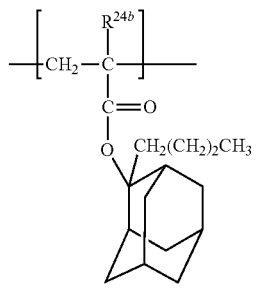
(b5-7) 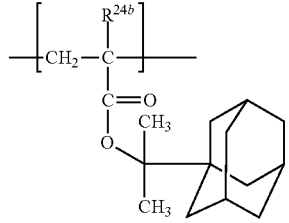
(b5-8) 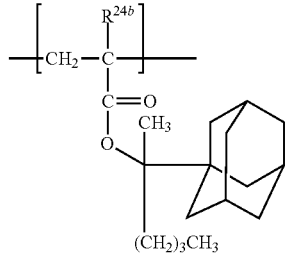
(b5-9) 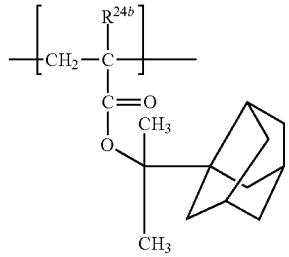
(b5-10) 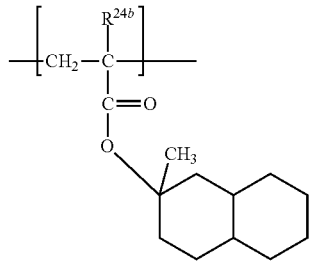
(b5-11) 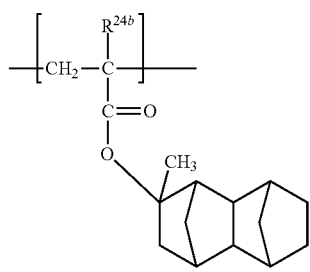

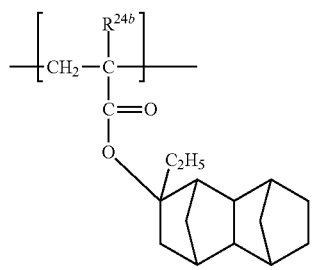 (b5-12)
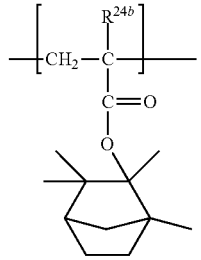 (b5-17)
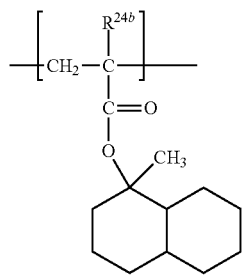 (b5-13)
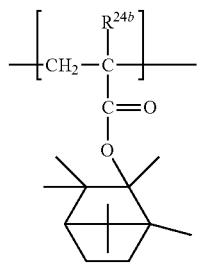 (b5-18)
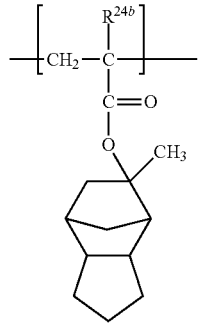 (b5-14)
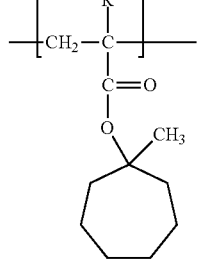 (b5-19)
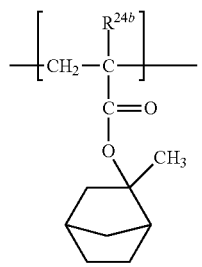 (b5-15)
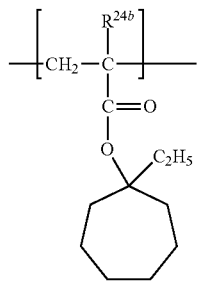 (b5-20)
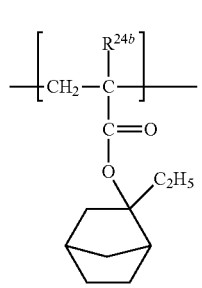 (b5-16)
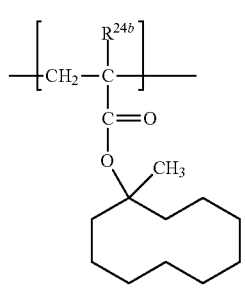 (b5-21)

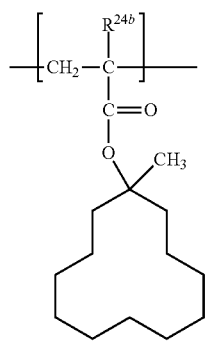
(b5-22)
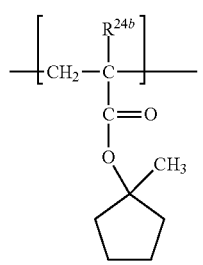
(b5-23)
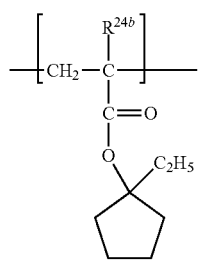
(b5-24)
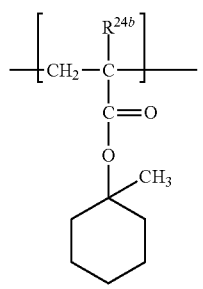
(b5-25)
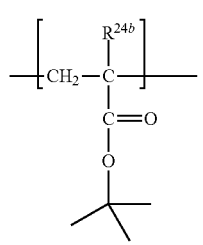
(b5-26)
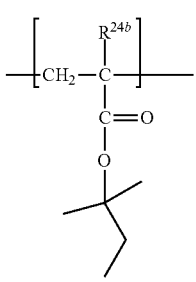
(b5-27)
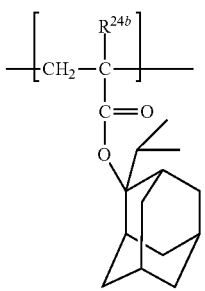
(b5-28)
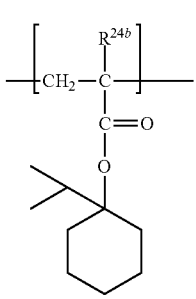
(b5-29)
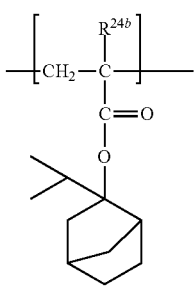
(b5-30)
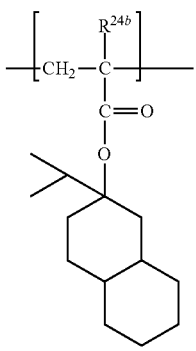
(b5-31)

(b5-32)
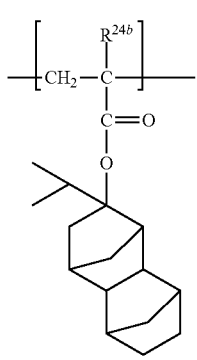
(b5-33)
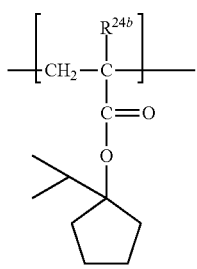
In the above formulae (b5-1) to (b5-33), $R^{24b}$ represents a hydrogen atom or a methyl group.
Preferable specific examples of the constituent unit represented by the above formula (b6) include constituent units represented by the following formulae (b6-1) to (b6-26)
[Chem. 35]
(b6-1)
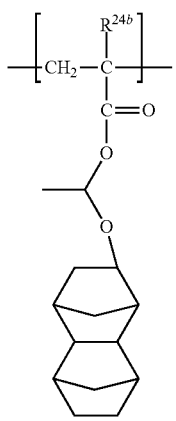
(b6-2)
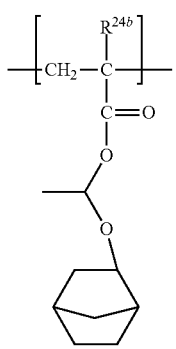
(b6-3)
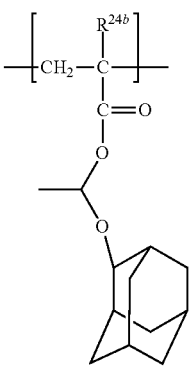
(b6-4)
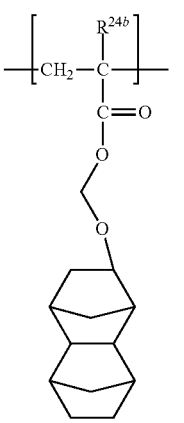
(b6-5)
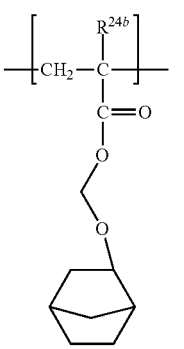
(b6-6)
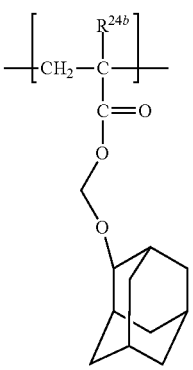

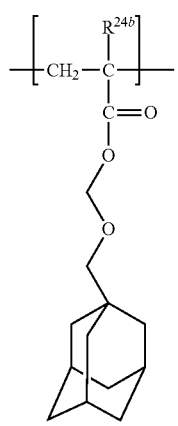
(b6-7)
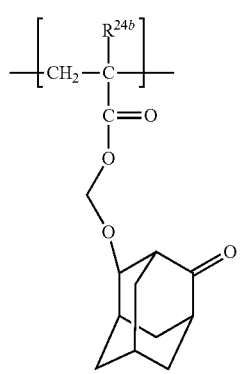
(b6-8)
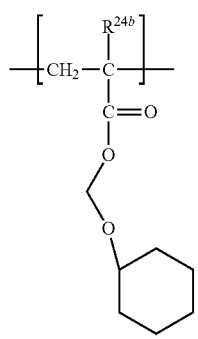
(b6-9)
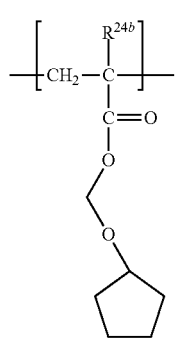
(b6-10)
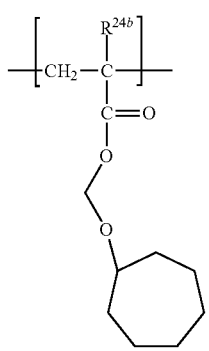
(b6-11)
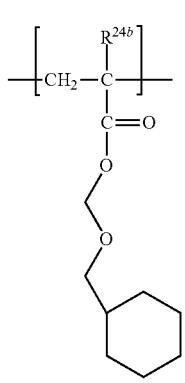
(b6-12)
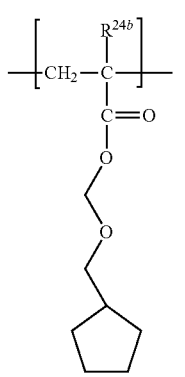
(b6-13)
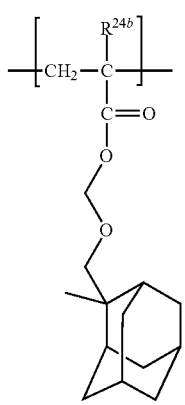
(b6-14)

(b6-15) 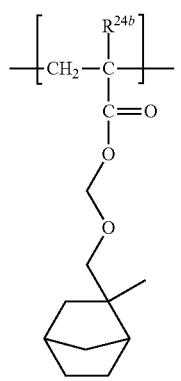
(b6-16) 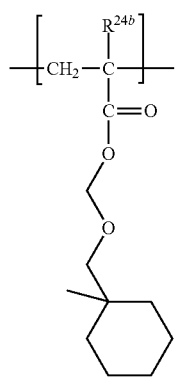
(b6-17) 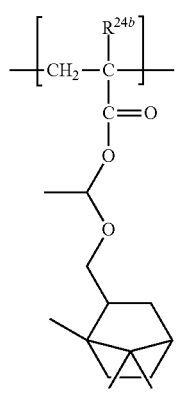
(b6-18) 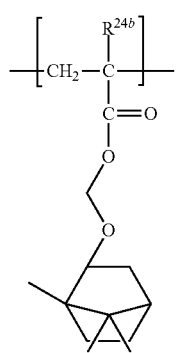
(b6-19) 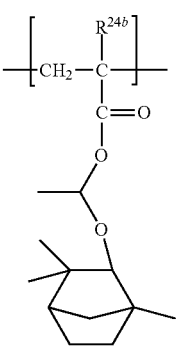
(b6-20) 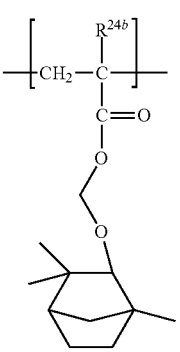
(b6-21) 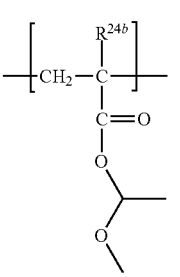
(b6-22) 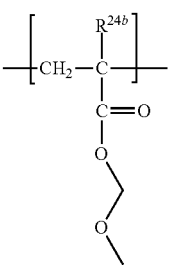
(b6-23) 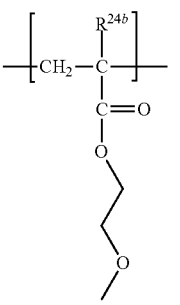

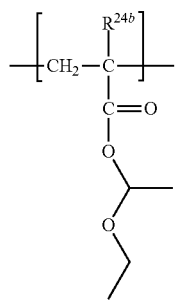 (b6-24)
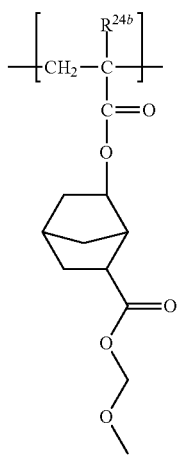 (b7-1)
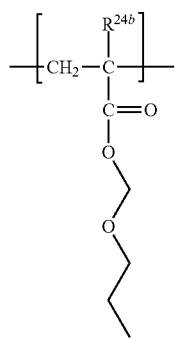 (b6-25)
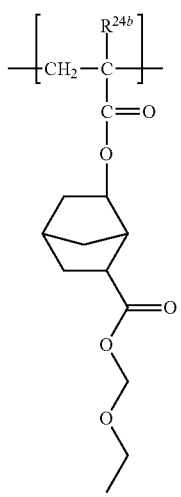 (b7-2)
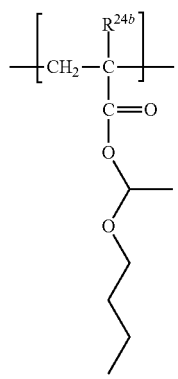 (b6-26)
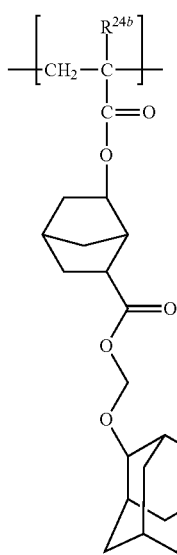 (b7-3)
In the above formulae (b6-1) to (b6-26), $R^{24b}$ represents a hydrogen atom or a methyl group.
Preferable specific examples of the constituent unit represented by the above formula (b7) include constituent units represented by the following formulae (b7-1) to (b7-15).

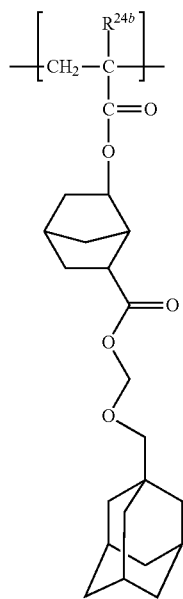
(b7-4)
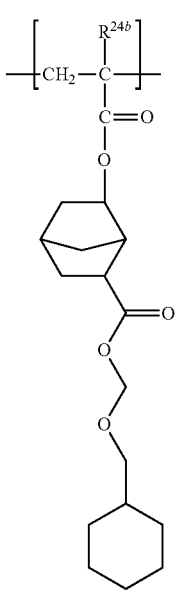
(b7-6)
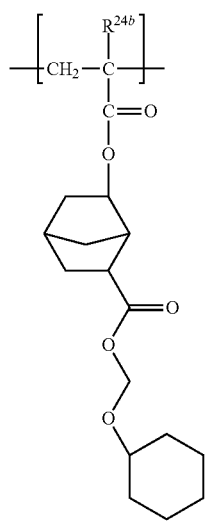
(b7-5)
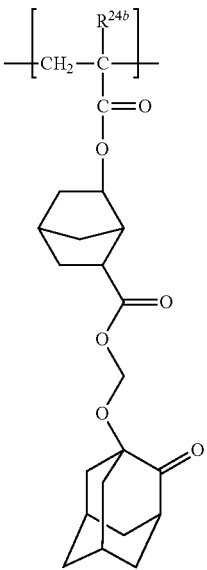
(b7-7)

(b7-8)
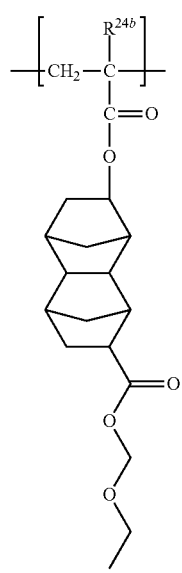
(b7-10)
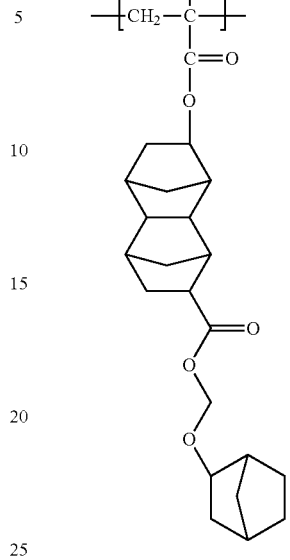
(b7-9)
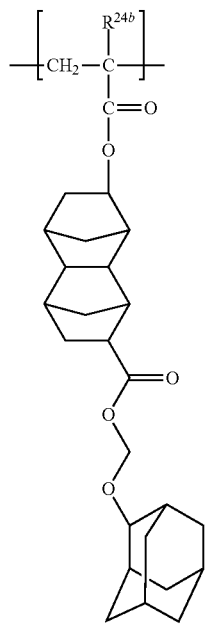
(b7-11)
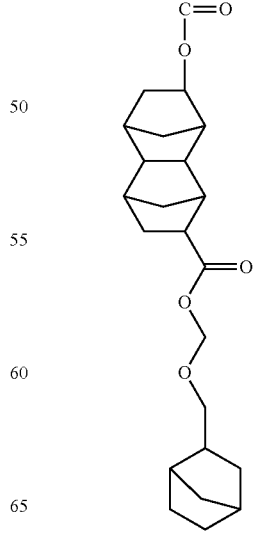

(b7-12)

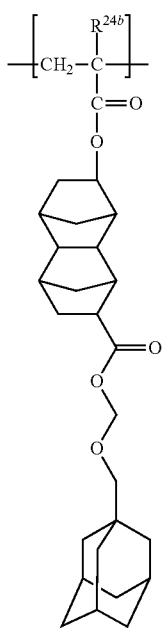

(b7-13)

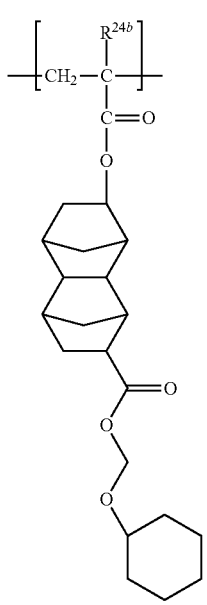

(b7-14)

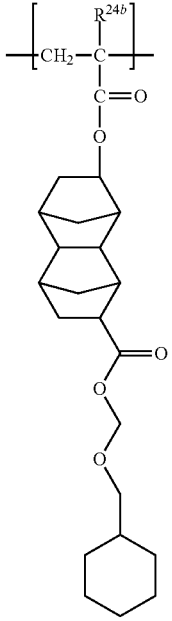

(b7-15)

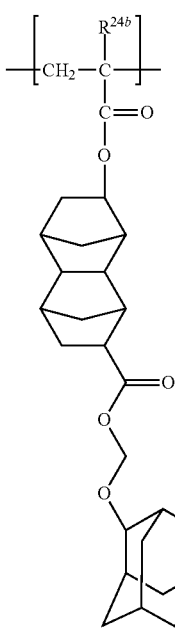

In the above formulae (b7-1) to (b7-15), $R^{24b}$ represents a hydrogen atom or a methyl group.

Among the constituent units represented by the formulae (b5) to (b7) described above, those represented by the formula (b6) are preferred in that they can be easily synthesized and relatively easily sensitized. Further, among the constituent units represented by the formula (b6), those in which $Y^b$ is an alkyl group are preferred, and those in which one or both of $R^{19b}$ and $R^{20b}$ are alkyl groups are preferred.

Further, the acrylic resin (B3) is preferably a resin including a copolymer including a constituent unit derived from a polymerizable compound having an ether bond together with a constituent unit represented by the above formulae (b5) to (b7).

Illustrative examples of the polymerizable compound having an ether bond include radical polymerizable compounds such as (meth)acrylic acid derivatives having an ether bond and an ester bond, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, tetrahydrofurfuryl (meth)acrylate, and the like. Also, the above polymerizable compound having an ether bond is preferably 2-methoxyethyl (meth) acrylate, 2-ethoxyethyl (meth)acrylate, or methoxytriethylene glycol (meth)acrylate. These polymerizable compounds may be used alone, or in combinations of two or more thereof.

Furthermore, the acrylic resin (B3) may include another polymerizable compound as a constituent unit in order to moderately control physical or chemical properties. The polymerizable compound is exemplified by conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth) acrylic acid alkyl esters such as methyl(meth)acrylate, ethyl (meth)acrylate, butyl(meth)acrylate and cyclohexyl(meth) acrylate; (meth)acrylic acid hydroxyalkyl esters such as 2-hydroxyethyl (meth)acrylate and 2-hydroxypropyl (meth) acrylate; (meth)acrylic acid aryl esters such as phenyl (meth) acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

As described above, the acrylic resin (B3) may include a constituent unit derived from a polymerizable compound having a carboxy group such as the above monocarboxylic acids and dicarboxylic acids. However, it is preferable that the acrylic resin (B3) does not substantially include a constituent unit derived from a polymerizable compound having a carboxyl group, since a resist pattern including a nonresist portion having a favorably rectangular sectional shape can be easily formed. Specifically, the proportion of a constituent unit derived from a polymerizable compound having a carboxyl group in the acrylic resin (B3) is preferably 20% by mass or less, more preferably 15% by mass or less, and particularly preferably 5% by mass or less. In acrylic resin (B3), acrylic resin including a relatively large amount of constituent unit derived from a polymerizable compound having a carboxy group is preferably used in combination with an acrylic resin that includes only a small amount of constituent unit derived from a polymerizable compound having a carboxy group or does not include this constituent unit.

Furthermore, examples of the polymerizable compound include (meth)acrylic acid esters having a non-acid-dissociable aliphatic polycyclic group, and vinyl group-containing aromatic compounds and the like. As the non-acid-dissociable aliphatic polycyclic group, particularly, a tricyclodecanyl group, an adamantyl group, a tetracyclododecanyl group, an isobornyl group, a norbornyl group, and the like are preferred in view of easy industrial availability and the like. These aliphatic polycyclic groups may have a linear or branched alkyl group having 1 or more and 5 or less carbon atoms as a substituent.

Specific examples of the constituent units derived from the (meth)acrylic acid esters having a non-acid-dissociable aliphatic polycyclic group include constituent units having structures represented by the following formulae (b8-1) to (b8-5).

[Chem. 37]

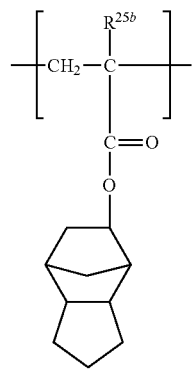

(b8-1)

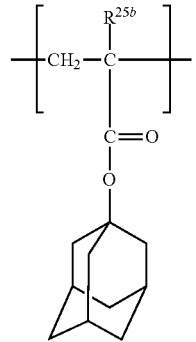

(b8-2)

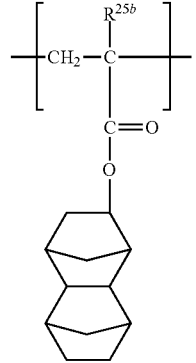

(b8-3)

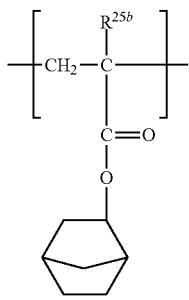

(b8-4)

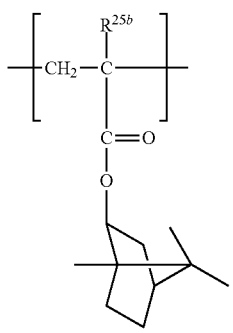

(b8-5)

In formulae (b8-1) to (b8-5), $R^{25b}$ represents a hydrogen atom or a methyl group.

When the acrylic resin (B3) includes the constituent unit (b-3) including a —SO$_2$-containing cyclic group or a lactone-containing cyclic group, the content of the constituent unit (b-3) in the acrylic resin (B3) is preferably 5% by mass or more, more preferably 10% by mass or more, and particularly preferably 10% by mass or more and 50% by mass or less, and most preferably 10% by mass or more and 30% by mass or less. In a case where the photosensitive resin composition includes the constituent unit (b-3) having the above-mentioned range of amount, both good developing property and a good pattern shape can be easily achieved simultaneously.

Further, in the acrylic resin (B3), a constituent unit represented by the aforementioned formulae (b5) to (b7) is preferably included in an amount of 5% by mass or more, more preferably 10% by mass or more, and particularly preferably 10% by mass or more and 50% by mass or less.

The acrylic resin (B3) preferably includes the above constituent unit derived from a polymerizable compound having an ether bond. The content of the constituent unit derived from a polymerizable compound having an ether bond in the acrylic resin (B3) is preferably 0% by mass or more and 50% by mass or less, more preferably 5% by mass or more and 30% by mass or less.

The acrylic resin (B3) preferably includes the above constituent unit derived from (meth)acrylic acid esters having a non-acid-dissociable aliphatic polycyclic group. The content of the constituent unit derived from (meth)acrylic acid esters having a non-acid-dissociable aliphatic polycyclic group in the acrylic resin (B3) is preferably 0% by mass or more and 50% by mass or less, and more preferably 5% by mass or more and 30% by mass or less.

As long as the photosensitive resin composition contains a predetermined amount of the acrylic resin (B3), an acrylic resin other than the acrylic resin (B3) described above can also be used as the resin (B). There is no particular limitation for such an acrylic resin other than the acrylic resin (B3) as long as it includes a constituent unit represented by the aforementioned formulae (b5) to (b7).

The mass-average molecular weight of the resin (B) described above in terms of polystyrene is preferably 10000 or more and 600000 or less, more preferably 20000 or more and 400000 or less, and even more preferably 30000 or more and 300000 or less. A mass-average molecular weight within these ranges allows a photosensitive resin layer to maintain sufficient strength without reducing detachability from a substrate, and can further prevent a swelled profile and cracking when plating.

It is also preferred that the resin (B) has a dispersivity of 1.05 or more. Dispersivity herein indicates a value of a mass average molecular weight divided by a number average molecular weight. A dispersivity in the range described above can avoid problems with respect to stress resistance on intended plating or possible swelling of metal layers resulting from the plating process.

The content of the resin (B) is preferably 5% by mass or more and 60% by mass or less with respect to the total solid part of the photosensitive resin composition.

<Nitrogen-Containing Aromatic Heterocyclic Compound (C)>

A photosensitive resin composition includes a nitrogen-containing aromatic heterocyclic compound (C) that is a compound represented by the following formula (c-a) or (c-b). With respect to the nitrogen-containing aromatic heterocyclic compound (C), the common logarithm value Log S of the solubility S is −6.00 or less. When the photosensitive resin composition includes a nitrogen-containing aromatic heterocyclic compound (C) showing a Log S value within a predetermined range, a resist pattern whose cross-sectional shape is rectangular is easily formed using a photosensitive resin composition.

Furthermore, when the nitrogen-containing aromatic heterocyclic compound (C) is blended with the photosensitive resin composition, a photosensitive resin composition having a wide margin of the depth of focus (DOF) is easily obtained. The margin of the depth of focus (DOF) is a range of the depth of focus that enables to form a resist pattern in the dimension in which a deviation with respect to a target dimension is within a predetermined range when exposure is performed with a focus shifted up or down at the same exposure amount. A wider depth of focus (DOF) margin is preferable. A template pattern for plating may be formed on a substrate having warping or a difference in height originated in base material such as polyimide membrane laminated on the substrate. Therefore, for a chemically amplified positive-type photoresist composition to be used for forming a template pattern for plating, it is desirable that the margin of depth of focus (DOF) is wide so that patterns having a desirable dimension or shape in regardless with the degree of flatness of the surface of the substrate.

In addition, when the photosensitive resin composition includes a nitrogen-containing aromatic heterocyclic compound (C), the post-exposure delay (PED) stability over time of the photosensitive resin composition is good. When the delay stability over time is excellent, even if the exposed photosensitive resin layer is left for a certain period of time after exposure, adverse effects on the pattern shape and pattern size are unlikely to occur when the exposed photosensitive resin layer is developed, and a pattern having a desired shape and size is easily formed.

[Chem. 38]

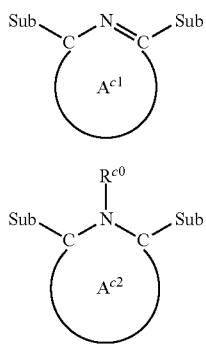

(c-a)

(c-b)

(In the formula (c-a), Sub is a substituent, $A^{c1}$ is a monocyclic or condensed polycyclic nitrogen-containing aromatic heterocycle which may have a substituent other than Sub, and two Subs may be identical to or different from each other. In the formula (c-b), Sub is a substituent, $A^{c2}$ is a monocyclic or condensed polycyclic nitrogen-containing aromatic heterocycle which may have a substituent other than Sub, $R^{c0}$ is a hydrogen atom or an organic group, and two Subs may be identical to or different from each other.) Note here that the "substituent other than Sub" means a substituent that exists separately from Sub, but does not mean substituents of types different from Sub. The "substituent other than Sub" may be a group that is the same as the Sub or may be a group that is different from the Sub.

In the formula (c-a), $A^{c1}$ is a monocyclic or condensed polycyclic nitrogen-containing aromatic heterocycle, which may have a substituent other than Sub. The nitrogen-containing aromatic heterocycle as $A^{c1}$ may include heteroatoms other than a nitrogen atom, for example, O and S, and preferably includes only a nitrogen atom as a heteroatom.

Hereinafter, regarding the nitrogen-containing aromatic heterocycles as $A^{c1}$ and $A^{c2}$, for the sake of convenience, a ring where the Sub and $R^{c0}$ are hydrogen atoms is described.

When $A^{c1}$ is a condensed polycyclic nitrogen-containing aromatic heterocycle, the number of monocycles constituting a condensed polycyclic nitrogen-containing aromatic heterocycle is not particularly limited as long as the object of the present invention is not inhibited. The number of monocycles forming a condensed polycyclic nitrogen-containing aromatic heterocycle is preferably 1 or more and 3 or less, more preferably 1 or 2, and particularly preferably 1, from the viewpoint that synthesis or availability of the nitrogen-containing aromatic compound (C) is easy, the molecular weight of the nitrogen-containing aromatic compound (C) is small, and a desirable effect can be obtained with a small amount. The number of nitrogen atoms included in the ring-constituting atoms constituting the monocyclic or condensed polycyclic nitrogen-containing aromatic heterocycle may be an integer of 1 or 2 or more, preferably an integer of 1 or more and 3 or less, and more preferably 1 or 2. When $A^{c1}$ is a monocyclic nitrogen-containing aromatic heterocycle, the monocyclic nitrogen-containing aromatic heterocycle is preferably a 5- to 7-membered ring, more preferably a 5- or 6-membered ring, and particularly preferably a 6-membered ring. Preferable specific examples of the monocyclic nitrogen-containing aromatic heterocycle include a 5-membered ring such as an imidazoline ring and an imidazole ring; a 6-membered ring such as a pyridine ring, a pyrimidine ring, a pyrazine ring, and a triazine ring; and the like. When $A^{c1}$ is a condensed polycyclic nitrogen-containing aromatic heterocycle, specific examples thereof include an isoindolenine ring, a purine ring, an isoquinoline ring, a quinazoline ring, a naphthyridine ring, a pteridine ring, and the like. As the monocyclic or condensed polycyclic nitrogen-containing aromatic heterocycle as $A^{c1}$, a monocyclic nitrogen-containing aromatic heterocycle as the 6-membered ring is preferable, and a pyridine ring is more preferable.

In the formula (c-b), $A^{c2}$ is a monocyclic or condensed polycyclic nitrogen-containing aromatic heterocycle, which may have a substituent other than Sub. The nitrogen-containing aromatic heterocycle as $A^{c2}$ may include heteroatoms other than a nitrogen atom, for example, O and S, and preferably includes only a nitrogen atom as a heteroatom. When $A^{c2}$ is a condensed polycyclic nitrogen-containing aromatic heterocycle, the number of monocycles constituting a condensed polycyclic nitrogen-containing aromatic heterocycle is not particularly limited as long as the object of the present invention is not inhibited. The number of monocycles forming a condensed polycyclic nitrogen-containing aromatic heterocycle is preferably 1 or more and 3 or less, more preferably 1 or 2, and particularly preferably 1, from the viewpoint that synthesis or availability of the nitrogen-containing aromatic compound (C) is easy, the molecular weight of the nitrogen-containing aromatic compound (C) is small, and a desirable effect can be obtained with a small amount. The number of nitrogen atoms included in the ring-constituting atoms constituting the monocyclic or condensed polycyclic nitrogen-containing aromatic heterocycle may be an integer of 1 or 2 or more, preferably an integer of 1 or more and 3 or less, and more preferably 1 or 2. When $A^{c2}$ is a monocyclic nitrogen-containing aromatic heterocycle, the monocyclic nitrogen-containing aromatic heterocycle is preferably a 5- to 7-membered ring, more preferably a 5- or 6-membered ring, and particularly preferably a 5-membered ring. Preferable specific examples of a nitrogen-containing aromatic heterocycle include a 5-membered ring such as a pyrrole ring and imidazole ring, and a 6-membered ring such as a piperazine ring. Specific examples of the condensed polycyclic nitrogen-containing aromatic heterocycle as $A^{c2}$ include an isoindole ring, and the like. As the monocyclic or condensed polycyclic nitrogen-containing aromatic heterocycle as $A^{c2}$, a monocyclic nitrogen-containing aromatic heterocycle as the 5-membered ring is preferable, and a pyrrole ring and an imidazole ring are more preferable.

In the formulae (c-a) and (c-b), Sub is a substituent. The substituent as Sub is not particularly limited within a range where the objects of the present invention are not impaired. The two Subs in the formulae (c-a) and (c-b) may be identical to or different from each other. From the viewpoint of easy synthesis or availability of the nitrogen-containing aromatic heterocyclic compound (C), two Subs are preferably the same as each other. Sub may be an organic group including heteroatoms such as N, O, S, P, Si, B, and a halogen atom and the like, or a hydrocarbon group. As Sub, a hydrocarbon group is preferable. The hydrocarbon group may be an aliphatic hydrocarbon group, an aromatic hydrocarbon group, or a combination of an aliphatic hydrocarbon group and an aromatic hydrocarbon group. The aliphatic hydrocarbon group may be a chain, a cyclic structure, or a structure including a chain structure and a cyclic structure. When aliphatic hydrocarbon group is a chain, it may be a linear or a branched chain. Furthermore, the aliphatic hydrocarbon group may have an unsaturated bond. The number of carbon atoms of the aliphatic hydrocarbon group is preferably 1 or more and 10 or less, more preferably 1 or more and 8 or less, and further preferably 1 or more and 5 or less. Specific examples of the chain aliphatic hydrocarbon group include a methyl group, an ethyl group, an n-propyl group, an isopropyl group, an n-butyl group, an isobutyl group, a sec-butyl group, a tert-butyl group, an n-pentyl group, an isopentyl group, a neopentyl group, and the like. Specific examples of the cyclic aliphatic hydrocarbon group include cyclic groups such as a cyclopentyl group, a cyclohexyl group, an adamantyl group, a norbornyl group, an isobornyl group, and a dicyclopentanyl group. Examples of the aromatic hydrocarbon group include aromatic hydrocarbon groups such as a phenyl group and a naphthyl group, which do not include a heteroatom, aromatic heterocyclic groups such as a furyl group, a thienyl group, a pyridyl group, and the like. Among the above-described Subs, from the viewpoint that the value of Log S is easily lowered, and that a desired addition effect is easily obtained, branched alkyl groups such as an isopropyl group, an isobutyl group, a sec-butyl group, and a tert-butyl group; cyclic aliphatic hydrocarbon groups such as a cyclopentyl group, a cyclohexyl group, an adamantyl group, a norbornyl group, an isobornyl group, and dicyclopentanyl group; and aromatic hydrocarbon groups such as a phenyl group and a naphthyl group are preferable. Among these suitable groups as Sub, aromatic hydrocarbon groups such as a phenyl group and a naphthyl group are more preferable, and a phenyl group is further preferable.

In the formula (c-b), $R^{c0}$ is a hydrogen atom or an organic group. The organic group as $R^{c0}$ may be an organic group including heteroatoms such as N, O, S, P, Si, B, and a halogen atom, or may be a hydrocarbon group. From the viewpoint that steric hindrance with two Subs is small, ROC is preferably a hydrogen atom. The hydrocarbon group may be an aliphatic hydrocarbon group or an aromatic hydrocarbon group, or a combination of an aliphatic hydrocarbon group and an aromatic hydrocarbon group. The aliphatic hydrocarbon group may be a chain, a cyclic structure, or a structure including a chain structure and a cyclic structure. In the case of the chain structure, it may be linear or branched, and may have an unsaturated bond. The number of carbon atoms of the aliphatic hydrocarbon group is preferably 1 or more and 10 or less, more preferably 1 or more and 8 or less, and further preferably 1 or more and 4 or less. Specific examples of the hydrocarbon group as $R^{c0}$ are the same as the specific examples of the hydrocarbon group for Sub. When $R^{c0}$ is a hydrocarbon group, from the viewpoint that steric hindrance with two Subs is small, $R^{c0}$ is preferably a linear aliphatic hydrocarbon group and more preferably a linear aliphatic hydrocarbon group having 1 or more and 4 or less carbon atoms, and more preferably a methyl group and an ethyl group.

The substituents other than Sub which $A^{c1}$ in the formula (c-a) may have, or the substituents other than Sub which $A^{c2}$ in the formula (c-b) may have is not particularly limited within a range where the objects of the present invention are not impaired. Examples of the substituent other than Sub include a hydroxyl group, a mercapto group, an amino group, a halogen atom, a nitro group, a cyano group, and an organic group. When the substituent other than Sub is an organic group, the organic group may be heteroatoms such as N, O, S, P, Si, B, and a halogen atom, or a hydrocarbon group. The organic groups include the groups the same as the above-mentioned Sub and groups in which one hydrogen atom or Sub is removed from the compounds represented by the formula (c-a) or (c-b). For example, in the compound represented by the formula (c-a), when $A^{c1}$ has one group in which one hydrogen atom or Sub is removed from the compound represented by the formula, the compound represented by the formula (c-a) is a dimer compound including two monocyclic or condensed polycyclic nitrogen-containing aromatic heterocycles. Furthermore, for example, in the compound represented by the formula (c-a), when $A^{c1}$ has one group in which one hydrogen atom or Sub is removed from the compound represented by the formula (c-a), the compound represented by the formula (c-a) is a trimer compound including three monocyclic or condensed polycyclic nitrogen-containing aromatic heterocycles. Furthermore, as the organic group, (m1-1) groups each of which one hydrogen atom or Sub is removed from the compound represented by the formula (c-a) or (c-b) are bonded to a linking group of m1-valence (polyvalent of divalent or more, and m1 is an integer of two or more) is also preferable.

Preferable examples of the compound among the compounds represented by the formula (c-a) or (c-b) include a compound represented by the following formula (c1).

$$(Y^1\text{-}A^1)_k\text{—}R^1 \quad (c1)$$

(In the formulae (c1), $Y^1$ is a group represented by the following formula (c-a-1) or (c-b-1),

[Chem. 39]

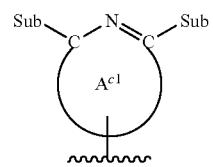
(c-a-1)

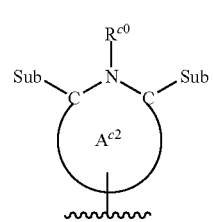
(c-b-1)

$A^1$ is a single bond or a divalent group selected from the group consisting of —O—, —CO—, —COO—, —OCO—, —OCOO—, —NH—, —CONH—, —NHCO—, —NHCONH—, —S—, —SO—, and —SO$_2$—; $R^1$ is a hydrogen atom or a k-valence organic group; k is 1 or 2; and when k is 2, two $Y^1$-$A^1$- may be identical to or different from each other, when $R^1$ is a hydrogen atom, k is 1; in the formula (c-a-1), Sub is a substituent, $A^{c1}$ is a monocyclic or condensed polycyclic nitrogen-containing aromatic heterocycle which may have a substituent other than Sub, and two Subs may be identical to or different from each other; and in the formula (c-b-1), Sub is a substituent, $A^{c2}$ is a monocyclic or condensed polycyclic nitrogen-containing aromatic heterocycle which may have a substituent other than Sub, $R^{c0}$ may be a hydrogen atom or an organic group and two Subs may be identical to or different from each other.)

When k is 1, the compound represented by the formula (c1) corresponds to a compound in which a substituent represented by -$A^1$-$R^1$ bonded to the ring $A^{c1}$ or a ring $A^{c2}$ in the compound represented by the formula (c-a) or (c-b). When k is 2, the compound represented by the formula (c1) corresponds to a compound in which a substituent represented by -$A^1$-$R^1$-$A^1$-$Y^1$ bonded to the ring $A^{c1}$ or a ring $A^{c2}$ in the compound represented by the formula (c-a) or (c-b).

In the formula (c1), $A^1$ is a single bond, or a divalent group selected from the group consisting of —O—, —CO—, —COO—, —OCO—, —OCOO—, —NH—, —CONH—, —NHCO—, —NHCONH—, —S—, —SO—, and —SO$_2$—. $A^1$ is preferably a single bond, —COO—, or —OCO—.

In the formula (c1), $R^1$ is a hydrogen atom or a k-valence organic group. k is 1 or 2. When k is 1, the organic group as $R^1$ may be an organic group including heteroatoms such as N, O, S, P, Si, B, and a halogen atom, or a hydrocarbon group. When $R^1$ is a hydrogen atom, the hydrocarbon group is the same as the hydrocarbon group described for Sub. When k is 2, the organic group as $R^1$ is preferably a group in which one hydrogen atom is removed from an organic group as $R^1$ when k is 1. When k is 2, $R^1$ is preferably an alkylene group having 1 or more and 10 or less carbon atoms, a cycloalkyne group having 3 or more and 10 or less carbon atoms, or an arylene group having 6 or more and 10 or less carbon atoms, or a divalent group combining thereof. Suitable specific examples of the alkylene group having 1 or more and 10 or less carbon atoms include a methylene group, ethane-1,2-diyl group, ethane-1,1-diyl group, a propane-1,3-diyl group, a propane-1,1-diyl group, a propane-2,2-diyl group, an n-butane-1,4-diyl group, an n-pentane-1,5-diyl group, an n-hexane-1,6-diyl group, an n-heptane-1,7-diyl group, an n-octane-1,8-diyl group, an n-nonane-1,9-diyl group, an n-decane-1,10-diyl group, and the like. Suitable specific examples of the cycloalkyne group having 3 or more and 10 or less carbon atoms include a cyclopentane-1,2-diyl group, a cyclopentane-1,3-diyl group, a cyclohexane-1,2-diyl group, a cyclohexane-1,3-diyl group, a cyclohexane-1,4-diyl group, and the like. Suitable specific examples of the arylene group having 6 or more and 10 or less carbon atoms include an o-phenylene group, an m-phenylene group, a p-phenylene group, a naphthalene-2,6-diyl group, a naphthalene-2,7-diyl group, a naphthalene-1,4-diyl group, and the like. Among them, a methylene group, an ethane-1,2-diyl group, a cyclohexane-1,3-diyl group, a cyclohexane-1,4-diyl group, an m-phenylene group, a p-phenylene group, and a divalent group combining thereof are preferable.

In the formula (c-a-1), the ring $A^{c1}$ that is a monocyclic or condensed polycyclic nitrogen-containing aromatic heterocycle which may have a substituent other than Sub is the same as the ring $A^{c1}$ in the formula (c-a) except that a single bond is bonded onto the ring $A^{c1}$. In the formula (c-b-1), the ring $A^{c2}$ that is a monocyclic or condensed polycyclic nitrogen-containing aromatic heterocycle which may have a substituent other than Sub is the same as the ring $A^{c2}$ in the formula (c-b) except that a single bond is bonded onto the ring $A^{c2}$.

Sub in the formulae (c-a-1) and (c-b-1) is the same as the sub in the formulae (c-a) and (c-b).

$R^{c0}$ in the formula (c-b-1) is the same as $R^{c0}$ in the formula (c-b).

In the compound represented by the formula (c1), it is preferable that k is 2, $Y^1$ is a group represented by the formula (c-a-1), and $A^{c1}$ in the formula (c-a-1) is a pyridine ring. Examples of such a compound include a compound represented by the following formula (c2).

[Chem. 40]

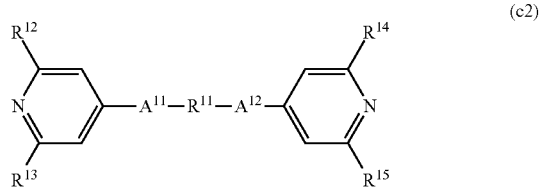

(c2)

(In the formula (c2), $A^{11}$ and $A^{12}$ are each independently a single bond, or a divalent group selected from the group consisting of —O—, —CO—, —COO—, —OCO—, —OCOO—, —NH—, —CONH—, —NHCO—, —NHCONH—, —S—, —SO—, and —SO$_2$—, $R^{11}$ is a divalent organic group, and $R^{12}$ to $R^{15}$ are each independently a hydrocarbon group.)

Preferably, in the formula (c2), $A^{11}$ and $A^{12}$ are each independently a single bond, —COO—, or —OCO—.

In the formula (c2), $R^{11}$ is a divalent organic group. The organic group as $R^{11}$ is the same as $R^1$ in the formula (c1) when k is 2.

In the formula (c2), $R^{12}$ to $R^{15}$ are each independently a hydrocarbon group. The hydrocarbon groups as $R^{12}$ to $R^{15}$ are the same as a hydrocarbon group described with respect to Sub in the formulae (c-a) and (c-b).

Furthermore, in the compound represented by the formula (c1), it is preferable that k is 1, $Y^1$ is a group represented by the formula (c-a-1), $A^{c1}$ in the formula (c-a-1) is a pyridine ring. Examples of such a compound include the compound (c3) represented by the following formula.

[Chem. 41]

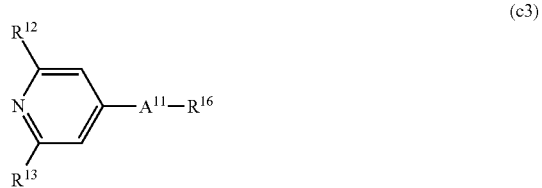

(c3)

(In the formula (c3), $R^{12}$, $R^{13}$, and $A^{11}$ are each independently the same as $R^{12}$, $R^{13}$, and $A^{11}$ in the formula (c2). $R^{16}$ is a monovalent organic group.)

In the formula (c3), $R^{16}$ is a monovalent organic group. The organic group as $R^{16}$ is the same as the organic group of $R^1$ in the formula (c1) in a case where k is 1.

Furthermore, a common logarithm value Log S of the solubility S of the nitrogen-containing aromatic heterocyclic compound (C) is −6.00 or less. For example, even when a compound corresponding to the above-mentioned formula (c-a) or (c-b) is used, when the Log S is more than −6.00, the shape becomes undesirable.

Log S is a common logarithm value of the solubility S as mentioned above. Log S is a value calculated by ChemDraw (registered trademark) Prime (16.0) for Windows (registered trademark). Note here that the Log S value may be calculated by using software other than ChemDraw Prime (16.0) for Windows as long as a similar value can be calculated as that by ChemDraw Prime (16.0) for Windows.

The Log S value of the nitrogen-containing aromatic heterocyclic compound (C) is only required to be −6.00 or less, and may be, for example, −10.00 or less. Furthermore, the Log S value of the nitrogen-containing aromatic heterocyclic compound (C) is preferably −15.00 or more, and more preferably −8.00 or more.
Specific examples of the nitrogen-containing aromatic heterocyclic compound (C) include the following compounds.
[Chem. 42]
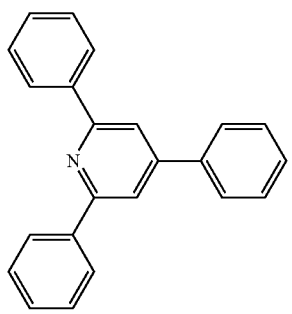
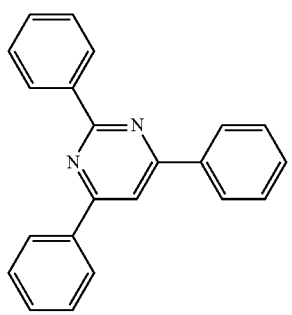
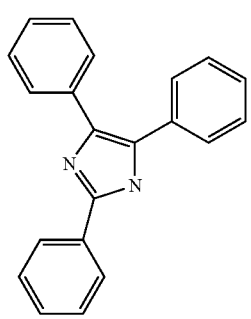
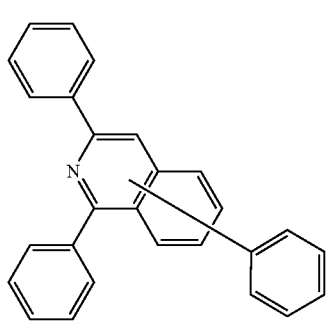
[Chem. 43]
-continued
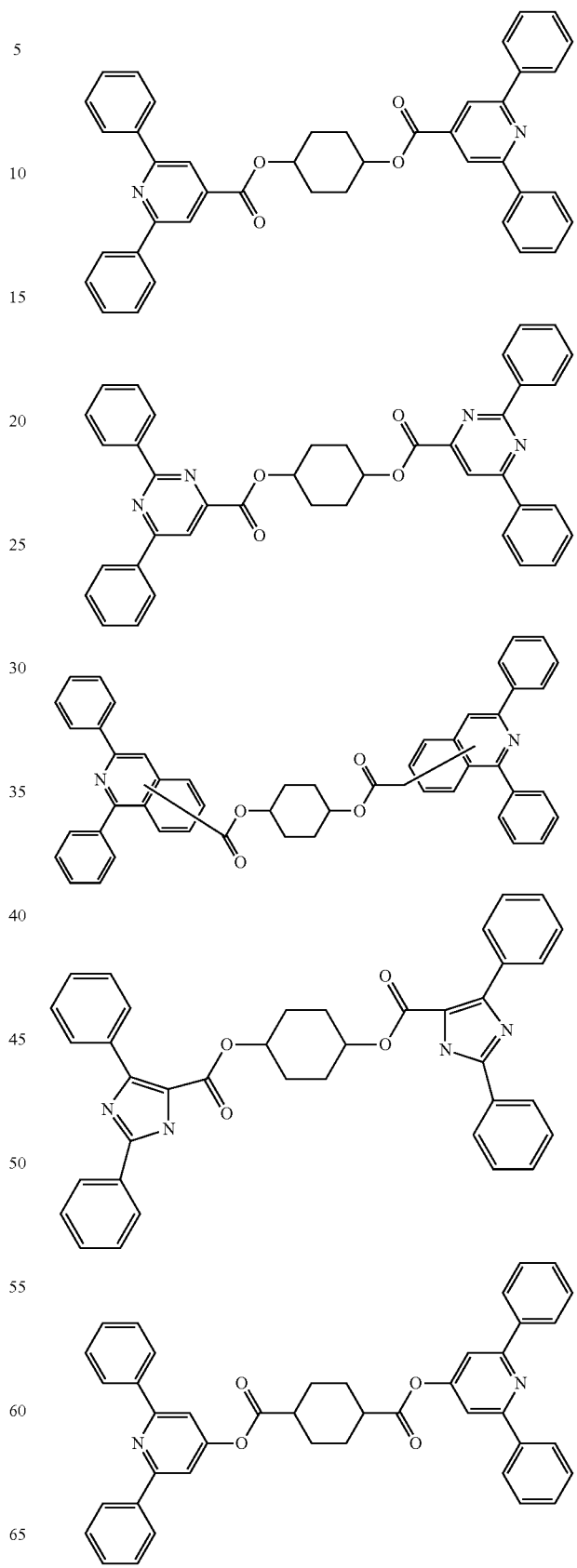

79
-continued
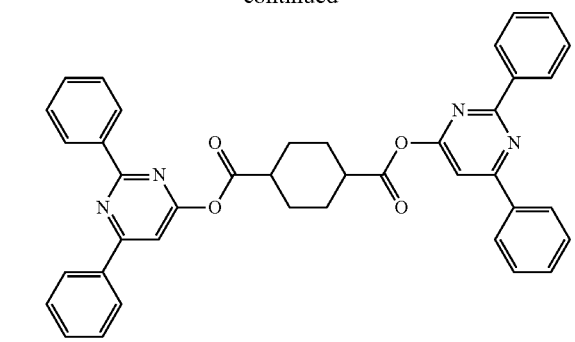
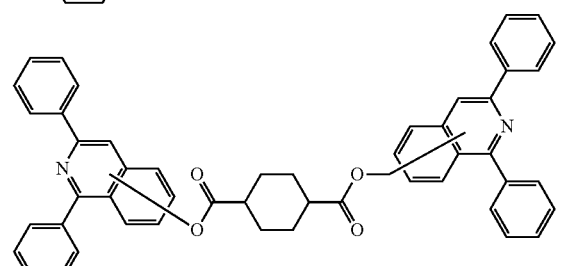
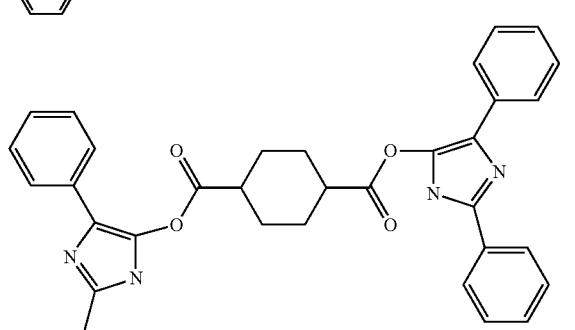
[Chem. 44]
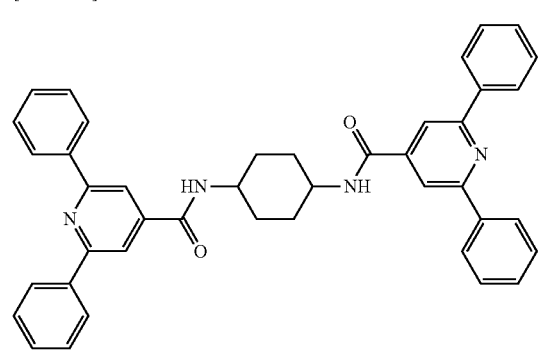
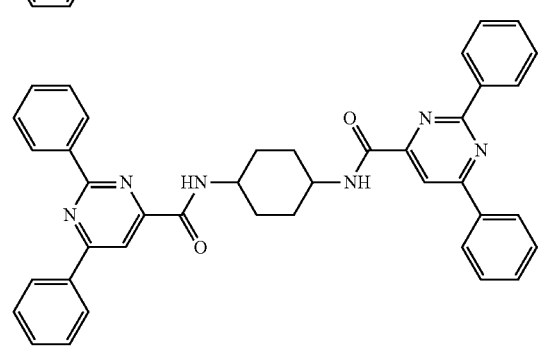
80
-continued
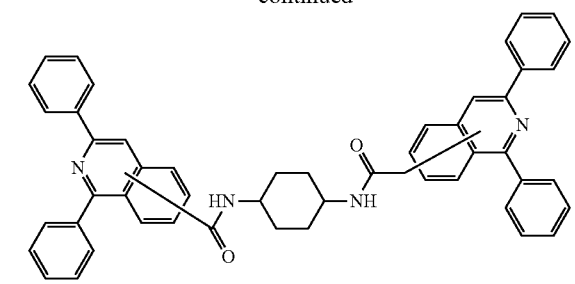
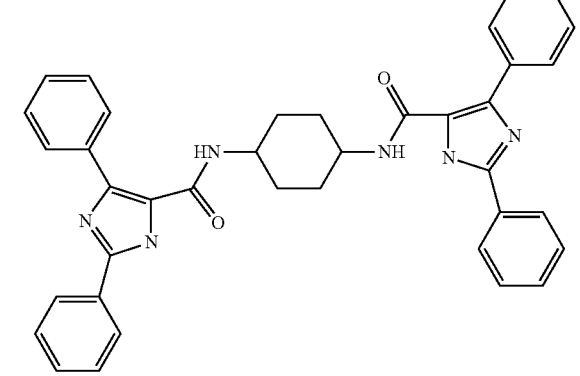
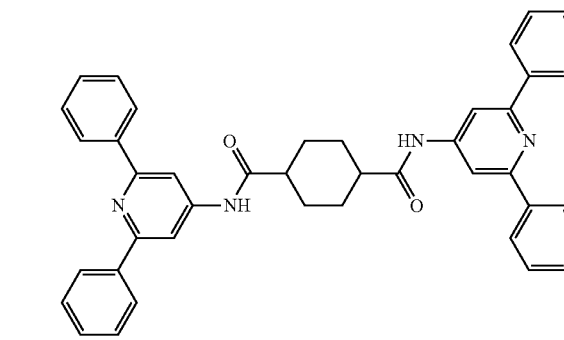
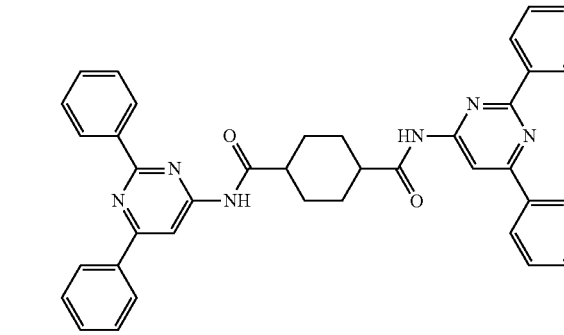
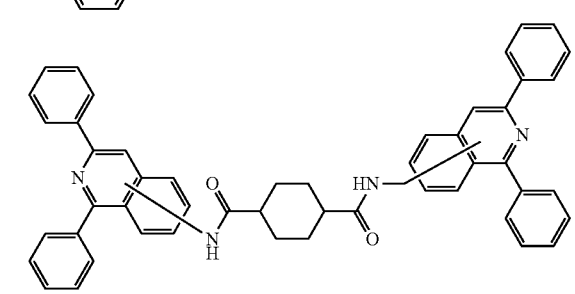

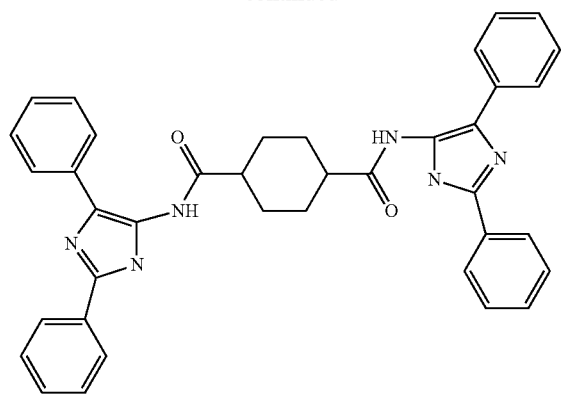
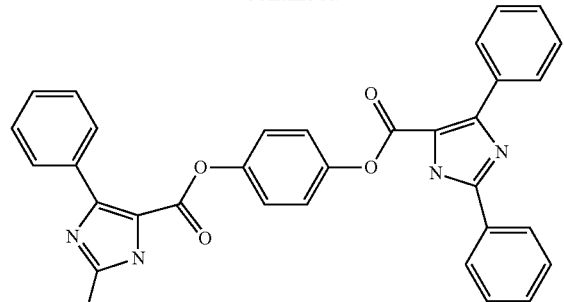
[Chem. 45]
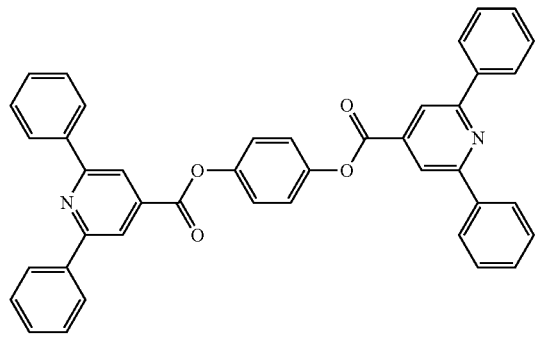
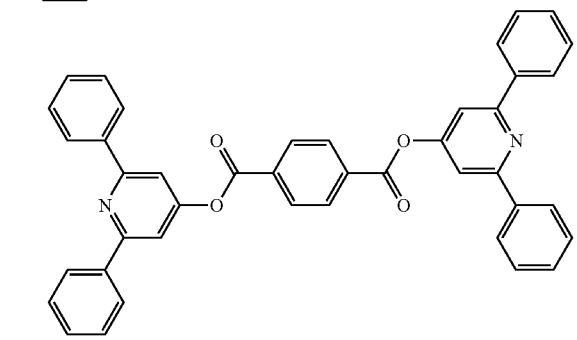
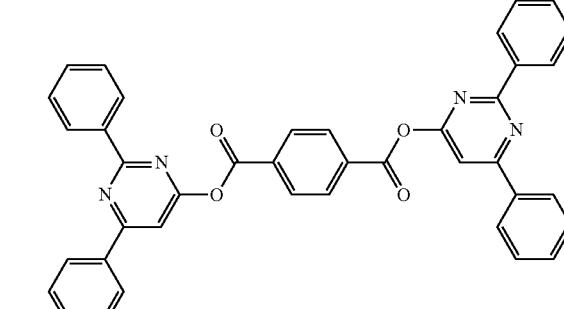
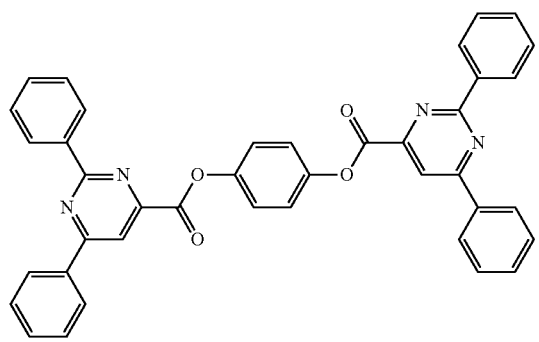
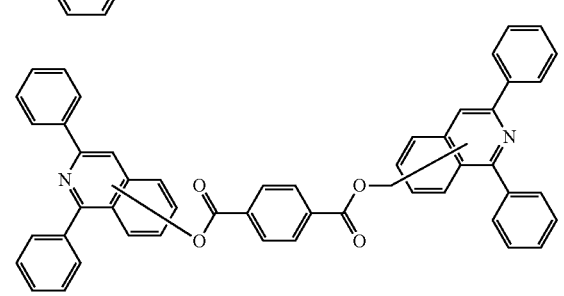
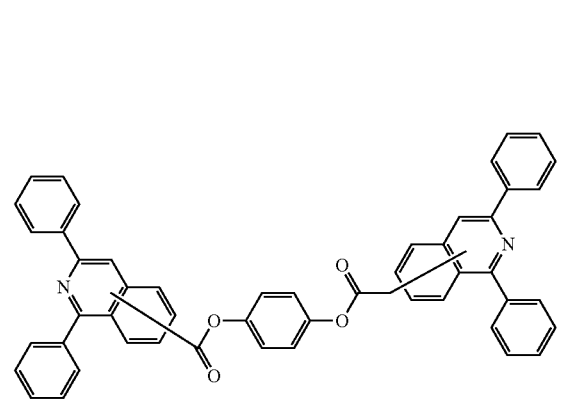
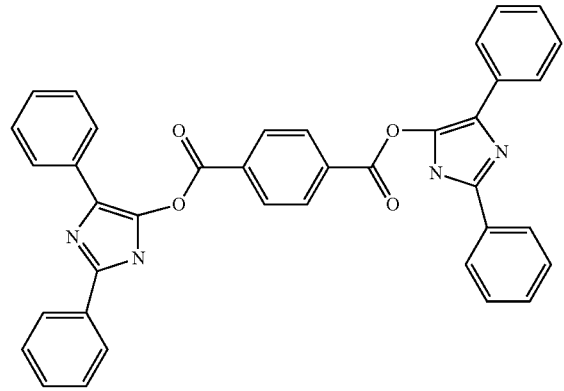

-continued
[Chem. 46]
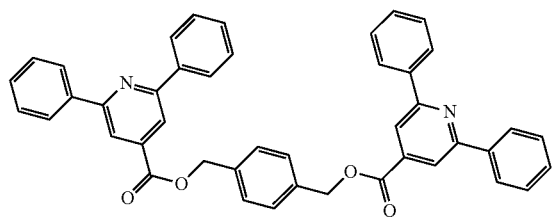
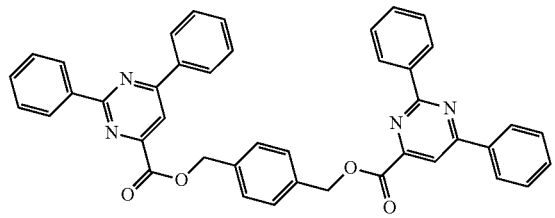
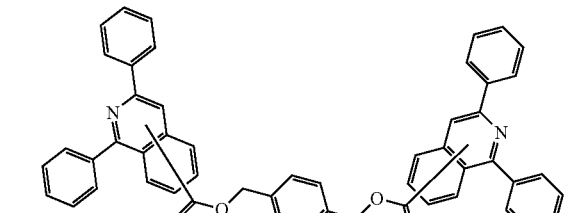
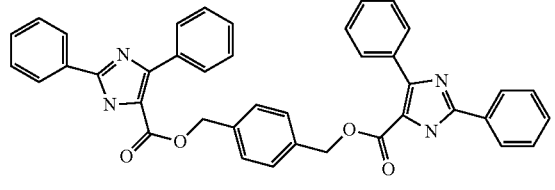
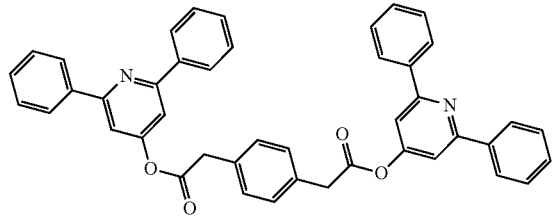
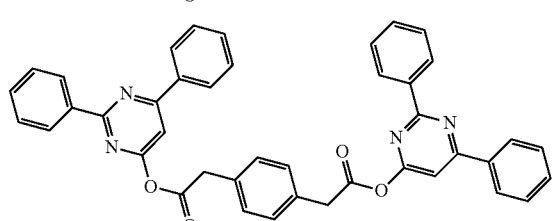
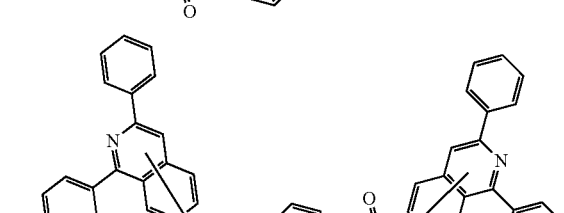
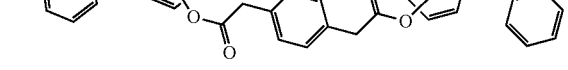
-continued
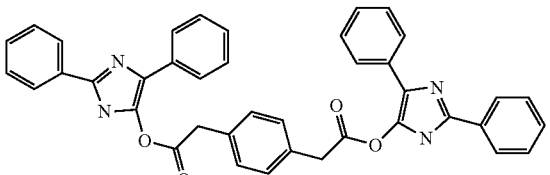
[Chem. 47]
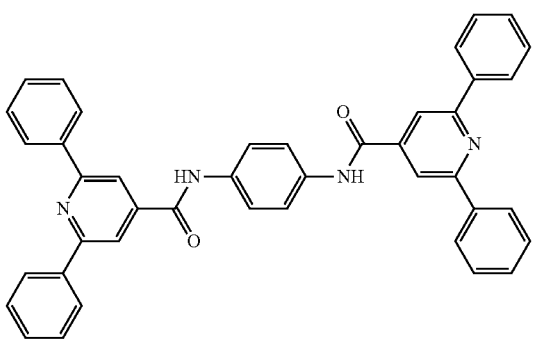
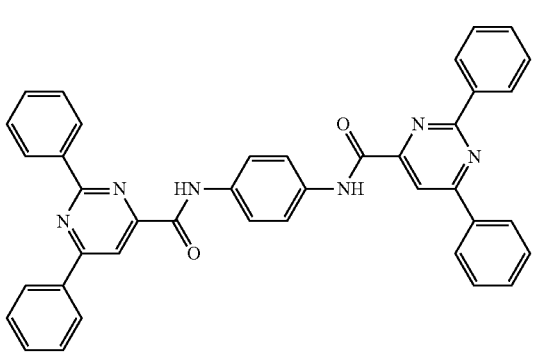
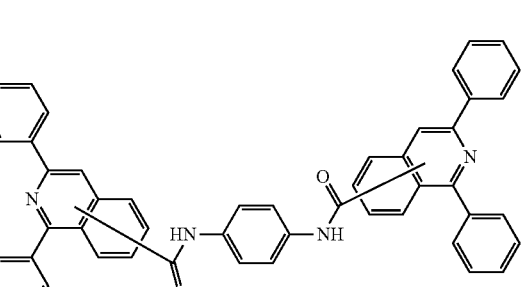
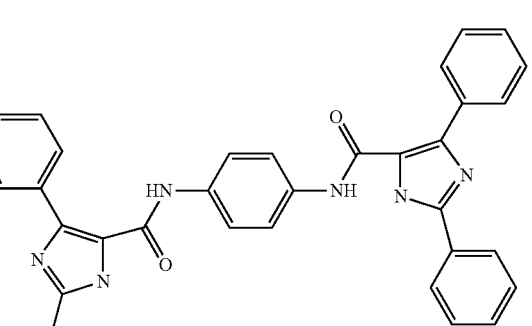

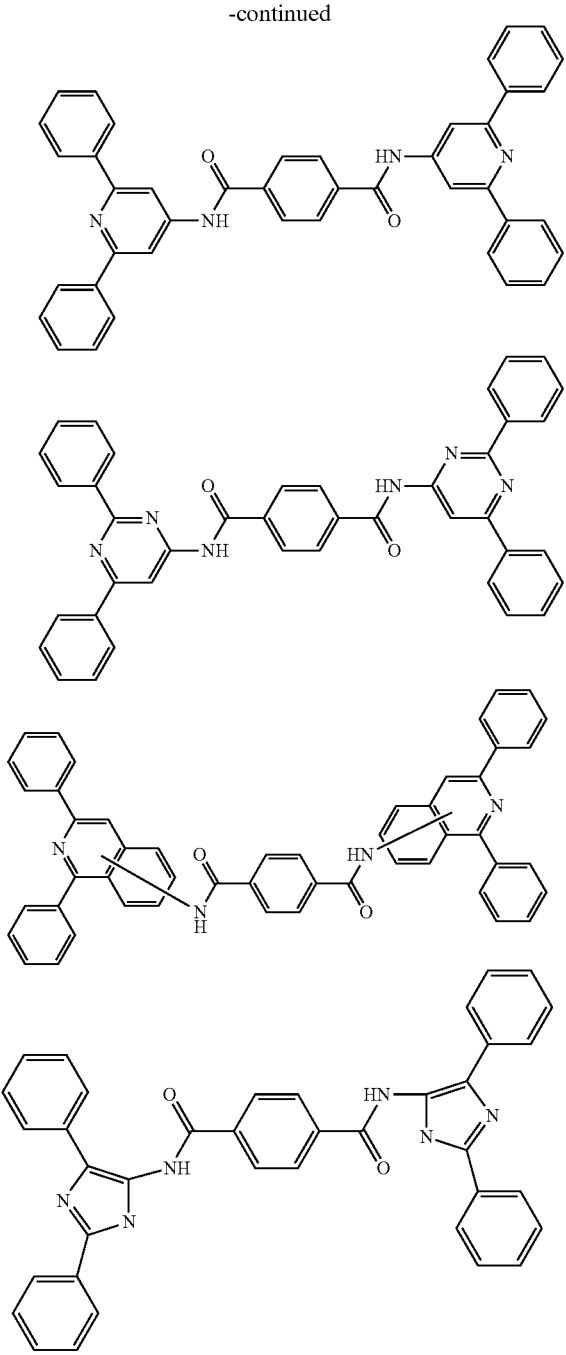

The nitrogen-containing aromatic heterocyclic compound (C) can be synthesized by appropriately combining well-known reactions. Hereinafter, an example of the method for synthesizing the nitrogen-containing aromatic heterocyclic compound (C) will be shown.

For example, a compound represented by the formula (c-a) wherein $A^{c1}$ is a pyridine ring which may have a substituent in addition to Sub can be obtained by a modified method of the Paal-Knorr synthesis. Specific examples of the method include a method for acting ammonium on 1,5-diketone represented by the following formula (c-aI); a method of acting ammonium on saturated 1,5-diketone represented by the following formula (c-aI') and oxidizing thereof by nitric acid, quinone, and the like; and a method of acting hydroxyl amine on saturated 1,5-diketone represented by the following formula (c-aI').

Sub-CO—CHR$^{c01}$—CR$^{c01}$=CR$^{c01}$—CO-Sub  (c-aI)

Sub-CO—CHR$^{c01}$—CHR$^{c01}$—CHR$^{c01}$—CO-Sub  (c-aI')

(In the formulae (c-aI) and (c-aI'), Sub is the same as Sub in the formula (c-a), and R$^{c01}$ is a substituent other than Sub bonded to a hydrogen atom or a pyridine ring. A plurality of R$^{c01}$s may be the same as or different from each other.) A compound represented by the formula (c-a) wherein $A^{c1}$ is a pyridine ring can be obtained by Bohlmann-Rahtz synthesis. Specifically, a compound represented by the formula (c-a) wherein $A^{c1}$ is a pyridine ring by a method of causing cyclocondensation of an ethynyl ketone compound represented by the following formula (c-aII) and an enamine compound represented by the formula (c-aIII) can be synthesized. In the compound produced by this method, an electron withdrawing group (EWG, for example, a carboxylic acid ester group such as an ethoxy carbonyl group and the like) is bonded onto the pyridine ring. Such an electron withdrawing group may be substituted to a hydrogen atom by a well-known method. Examples of the method of substitution of an electron withdrawing group to a hydrogen atom when the electron withdrawing group is an ethoxy carbonyl group include hydrolyzing an ethoxy carbonyl group with potassium hydroxide to be converted into a potassium carboxylate group, followed by heating and decarbonating an intermediary having a potassium carboxylate group in the presence of calcium hydroxide.

Sub-CO—C≡CH  (c-aII)

H$_2$N—CSub=CHEWG  (c-aIII)

(In the formulae (c-aII) and (c-aIII), Sub is the same as Sub in the formula (c-a); in the formula (c-aIII), EWG is an electron withdrawing group.)

Furthermore, a compound is a pyridine ring represented by the formula (c-a) wherein $A^{c1}$ may have a substituent other than Sub at the 4$^{th}$ position can be obtained by carrying out oxidation, hydrolysis, and decarbonation after Hantzsch synthesis. Specifically, cyclocondensation of a β-ketoester compound represented by the following formula (c-aIV), aldehyde represented by the following formula (c-aV), and ammonium is carried out so as to synthesize 2,6-disubstituted-1,4-dihydropyridine-3,5-dicarboxylic acid ester in which the 4$^{th}$ position may be substituted, followed by oxidation, thus a compound in which $A^{c1}$ may have a substituent other than Sub at the 4$^{th}$ position can be synthesized. The compound obtained by this method has a carboxylic acid ester group at the 3$^{rd}$ and 5$^{th}$ positions on the pyridine ring. Such a carboxylic acid ester group may be substituted with a hydrogen atom by the above-described method.

Sub-CO—CH$_2$—CO—O—R$^{c02}$  (c-aIV)

R$^{c01}$—CHO  (c-aV)

(In the formula (c-aIV), Sub is the same as Sub in the formula (c-a), R$^{c02}$ is a hydrocarbon group (for example, an alkyl group having 1 or more and 4 or less carbon atoms); and in the formula (c-aV), R$^{c01}$ is a hydrogen atom or a substituent other than Sub bonded to a pyridine ring.)

A compound represented by the formula (c-a) wherein $A^{c1}$ is a pyridine ring that may have a substituent other than Sub can be obtained by a method similar to Hantzsch synthesis. Specifically, synthesis can be carried out by cyclocondensation of a dicarbonyl compound represented by the following formula (c-aVI) and an enamine compound represented by the following formula (c-aVII).

Sub-CO—CHR$^{co1}$—CO—R$^{co1}$ (c-aVI)

H$_2$N—CSub=CHR$^{co1}$ (c-aVII)

(In the formulae (c-aVI) and (c-aVII), Sub is the same as Sub in the formula (c-a), R$^{co1}$ is a hydrogen atom, or a substituent other than Sub which is bonded to the pyridine ring. A plurality of R$^{co1}$s in the formulae (c-aVI) and (c-aVII) may be the same as or different from each other.) Furthermore, a compound represented by the formula (c-b) wherein A$^{c2}$ is a pyrrole ring can be synthesized by a Paal-Knorr synthesis method, for example, by carrying out ring closure of a dicarbonyl compound represented by the following formula (c-bI) in the presence of ammonium or amine represented by R$^{c0}$—NH$_2$.

Sub-CO—CHR$^{co1}$—CHR$^{co1}$—CO-Sub (c-bI)

(In the formula (c-bI), Sub is the same as Sub in the formula (c-b), and R$^{co1}$ is a hydrogen atom or a substituent other than Sub bonded to a pyrrole ring. A plurality of R$^{co1}$s may be the same as or different from each other.) The compound represented by the formula (c-a) and the compound represented by the formula (c-b) may be synthesized by introducing Sub by subjecting the ring A$^{c1}$ or ring A$^{c2}$ to the well-known alkylation method or a coupling reaction.

Furthermore, a compound represented by the formula (c1) wherein A$^1$ is —COO— and R$^1$ is a k-valence organic group can be manufactured by esterification of reacting a carboxylic acid compound represented by Y$^1$—COOH with alcohol represented by R$^{1-}$(OH)$_k$. Furthermore, a compound represented by the formula (c1) wherein A$^1$ is —OCO— and R$^1$ is a k-valence organic group can be manufactured by esterification of reacting alcohol represented by Y$^1$—OH with carboxylic acid compound represented by R$^1$—(COOH)$_k$. The method of esterification is not particularly limited. Suitable examples of the esterification method include a method of reacting a condensing agent such as a carbodiimide compound in the presence of a catalyst such as N,N-dimethyl-4-amino pyridine and condensing a carboxylic acid compound with alcohol. Furthermore, after the carboxylic acid compound is reacted with a halogenating agent such as thionyl chloride and phosphorus trichloride to produce carboxylic acid halide, the carboxylic acid halide may be reacted with alcohol.

A compound represented by the formula (c1) wherein A$^1$ is —CONH— and R$^1$ is a k-valence organic group can be manufactured by amidation of reacting a carboxylic acid compound represented by Y$^1$—COOH, halide of the carboxylic acid compound or acid anhydride of the carboxylic acid compound, and amine represented by R$^1$—(NH$_2$)$_k$. A compound represented by the formula (c1) wherein A$^1$ is —NHCO— and R$^1$ is a k-valence organic group can be manufactured by amidation of reacting amine represented by Y$^1$—NH$_2$ with carboxylic acid compound represented by R$^1$—(COOH)$_k$, halide of the carboxylic acid compound or acid anhydride of the carboxylic acid compound. The method of amidation is not particularly limited. Suitable examples of the amidation method include a method of reacting a condensing agent such as a carbodiimide compound in the presence of a catalyst such as N,N-dimethyl-4-amino pyridine and condensing a carboxylic acid compound, halide of the carboxylic acid compound, and acid anhydride of the carboxylic acid compound and amine.

As mentioned above, with respect to the method for manufacturing the compound represented by the formula (c1), it is explained in a case where A$^1$ is an ester bond or a carboxylic acid amide bonding. Note here that also in a case where A$^1$ is a bond other than an ester bond and a carboxylic acid amide, the compound represented by the formula (c1) can be manufactured by applying well-known methods including ether bond production reaction, acylation reaction, carbonate bond production reaction, an N-substituent introduction reaction into an amino group, an urethane bond production reaction, thioether bond production reaction, a sulfoxide bond production reaction (for example, oxidation of the thioether bond), and sulfone bond production reaction.

Note here that for the compound represented by the following formula as a nitrogen-containing aromatic heterocyclic compound (C), a commercial product (manufactured by, for example, Tokyo Chemical Industry Co., Ltd.) can be used.

[Chem. 48]

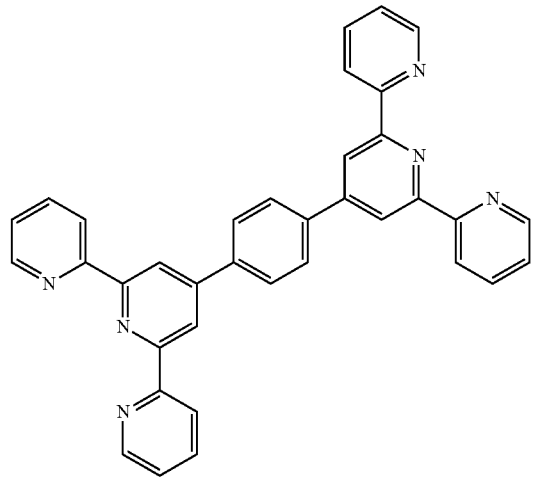

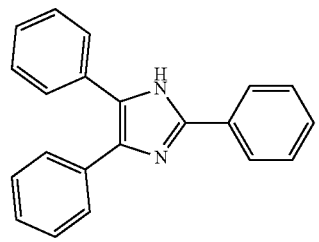

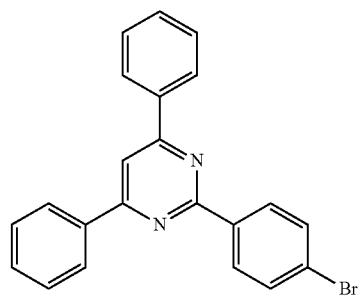

-continued

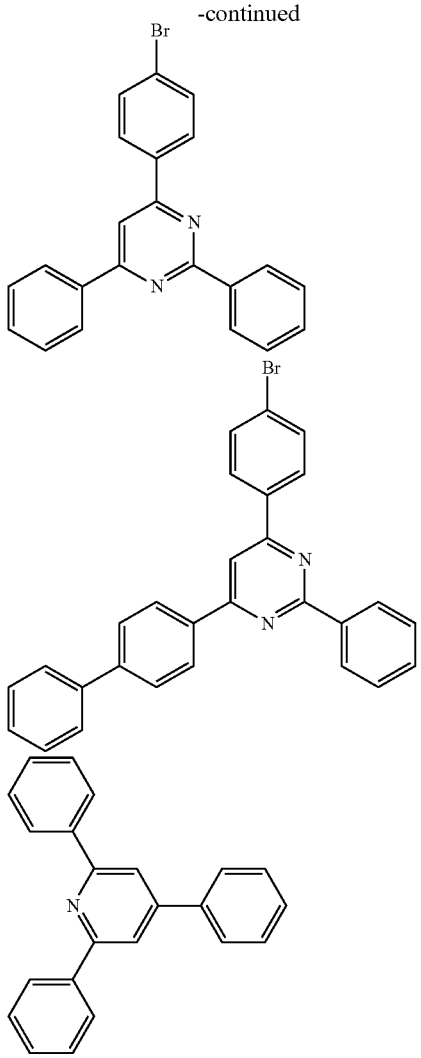

A nitrogen-containing aromatic heterocyclic compound (C) is used preferably in a range of 0.01 parts by mass or more and 5 parts by mass or less, more preferably in a range of 0.01 parts by mass or more and 3 parts by mass or less, further preferably in a range of 0.05 parts by mass or more and 2 parts by mass or less with respect to the total mass 100 parts by mass of the above-mentioned resin (B) and the below-mentioned alkali-soluble resin (D).

<Alkali-Soluble Resin (D)>

It is preferred that the photosensitive resin composition further contains an alkali-soluble resin (D) in order to improve crack resistance. The alkali-soluble resin as referred to herein may be determined as follows. A solution of the resin having a resin concentration of 20% by mass (solvent: propylene glycol monomethyl ether acetate) is used to form a resin film having a thickness of 1 μm on a substrate, and immersed in an aqueous 2.38% by mass TMAH (tetramethylammonium hydroxide) solution for 1 min. When the resin was dissolved in an amount of 0.01 μm or more, the resin is defined as being alkali-soluble. The alkali-soluble resin (D) is preferably at least one selected from the group consisting of novolak resin (D1), polyhydroxystyrene resin (D2), and acrylic resin (D3).

[Novolak Resin (D1)]

A novolak resin is prepared by addition condensation of, for example, aromatic compounds having a phenolic hydroxy group (hereinafter, merely referred to as "phenols") and aldehydes in the presence of an acid catalyst.

Examples of the above phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like. Examples of the above aldehydes include formaldehyde, furfural, benzaldehyde, nitrobenzaldehyde, acetaldehyde, and the like. The catalyst used in the addition condensation reaction is not particularly limited, and examples thereof include hydrochloric acid, nitric acid, sulfuric acid, formic acid, oxalic acid, acetic acid, etc., for acid catalyst.

The flexibility of the novolak resins can be enhanced more when o-cresol is used, a hydrogen atom of a hydroxyl group in the resins is substituted with other substituents, or bulky aldehydes are used.

The mass average molecular weight of novolac resin (D1) is not particularly limited as long as the purpose of the present invention is not impaired, but the mass average molecular weight is preferably 1,000 or more and 50,000 or less.

[Polyhydroxystyrene Resin (D2)]

The hydroxystyrene compound to constitute the polyhydroxystyrene resin (D2) is exemplified by p-hydroxystyrene, α-methylhydroxystyrene, α-ethylhydroxystyrene, and the like. Furthermore, the polyhydroxystyrene resin (D2) is preferably prepared to give a copolymer with a styrene resin. The styrene compound to constitute the styrene resin is exemplified by styrene, chlorostyrene, chloromethylstyrene, vinyltoluene, α-methylstyrene, and the like.

The mass average molecular weight of the polyhydroxystyrene resin (D2) is not particularly limited as long as the purpose of the present invention is not impaired, but the mass average molecular weight is preferably 1,000 or more and 50,000 or less.

[Acrylic Resin (D3)]

It is preferable that the acrylic resin (D3) includes a constituent unit derived from a polymerizable compound having an ether bond and a constituent unit derived from a polymerizable compound having a carboxyl group.

Examples of the above polymerizable compound having an ether bond include (meth)acrylic acid derivatives having an ether bond and an ester bond such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like. The above polymerizable compound having an ether bond is preferably 2-methoxyethyl acrylate, and methoxytriethylene glycol acrylate. These polymerizable compounds may be used alone, or in combinations of two or more.

Examples of the above polymerizable compound having a carboxy group include monocarboxylic acids such as acrylic acid, methacrylic acid and crotonic acid; dicarboxylic acids such as maleic acid, fumaric acid and itaconic acid; compounds having a carboxy group and an ester bond such as 2-methacryloyloxyethyl succinic acid, 2-methacryloyloxyethyl maleic acid, 2-methacryloyloxyethyl phthalic acid, 2-methacryloyloxyethyl hexahydrophthalic acid and the like. The above polymerizable compound having a carboxy group is preferably, acrylic acid and methacrylic acid. These polymerizable compounds may be used alone, or in combinations of two or more thereof.

The mass average molecular weight of the acrylic resin (D3) is not particularly limited as long as the purpose of the present invention is not impaired, but the mass average molecular weight is preferably 50,000 or more and 800,000 or less.

The content of the alkali-soluble resin (D) is such that when the total amount of the above resin (B) and the alkali-soluble resin (D) is taken as 100 parts by mass, the content is preferably 0 parts by mass or more and 80 parts by mass or less, and more preferably 0 parts by mass or more and 60 parts by mass or less. By setting the content of the alkali-soluble resin (D) to the range described above, resistance to cracking can be improved.

<Sulfur-Containing Compound (E)>

When the photosensitive resin composition is used for the formation of patterns on a metal substrate, it is preferable that the photosensitive resin composition includes a sulfur-containing compound (E). The sulfur-containing compound (E) is a compound comprising a sulfur atom capable of coordinating metal. Note here that regarding a compound that can produce two or more tautomers, at least one tautomer comprises a sulfur atom capable of coordinating metal forming a metal substrate, the compound corresponds to a sulfur-containing compound. When a resist pattern used as a template for plating is formed on a surface made of metal such as Cu, defects in the cross-sectional shape such as footing easily occurs. However, if the photosensitive resin composition includes a sulfur-containing compound (E), even when a resist pattern is formed on a surface made of metal on the substrate, the occurrence of defects in the cross-sectional shape such as footing is easily suppressed. Note here that "footing" is a phenomenon in which the width of the bottom becomes narrower than that of the top in a nonresist section due to the protrusion of a resist section toward the nonresist section at the contacting surface between the substrate surface and the resist pattern. When the photosensitive resin composition is used for pattern formation on a substrate other than the metal substrate, the photosensitive resin composition does not especially need to include a sulfur-containing compound. When the photosensitive resin composition is used for pattern formation on a substrate other than the metal substrate, it is preferable that the photosensitive resin composition does not include a sulfur-containing compound (E) from the viewpoint that a reduction of the number of components in the photosensitive resin composition makes manufacturing the photosensitive resin composition easier, reduces the manufacturing cost of the photosensitive resin composition, and the like. Note here that there are no particular defects because the photosensitive resin composition to be used on the substrate other than the metal substrate includes a sulfur-containing compound (E).

A sulfur atom capable of coordinating metal is included in the sulfur-containing compound as, for example, a mercapto group (—SH), a thiocarboxy group (—CO—SH), a dithiocarboxy group (—CS—SH), and a thiocarbonyl group (—CS—), and the like. Preferably, a sulfur-containing compound includes a mercapto group because of the easiness of coordinating a metal and being excellent in the effect of suppressing footing.

Preferable examples of the sulfur-containing compound having a mercapto group include a compound represented by the following formula (e1).

[Chem. 49]

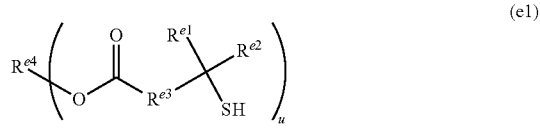

(e1)

(In the formula, $R^{e1}$ and $R^{e2}$ each independently represents a hydrogen atom or an alkyl group; $R^{e3}$ represents a single bond or an alkylene group; $R^{e4}$ represents a u-valent aliphatic group which may include atoms other than carbon; and u represents an integer of 2 or more and 4 or less.)

When $R^{e1}$ and $R^{e2}$ are alkyl groups, the alkyl group may be linear or branched, and preferably linear. When $R^{e1}$ and $R^{e2}$ are alkyl groups, the number of carbon atoms of the alkyl group is not particularly limited within a range where the objects of the present invention are not impaired. The number of carbon atoms of the alkyl group is preferably 1 or more and 4 or less, particularly preferably 1 or 2, and most preferably 1. The combination of $R^{e1}$ and $R^{e2}$ is preferably a combination in which one is a hydrogen atom and the other is an alkyl group, and particularly preferably a combination in which one is a hydrogen atom and the other is a methyl group.

When $R^{e3}$ is an alkylene group, the alkylene group may be linear or branched, and preferably is linear. When $R^{e3}$ is an alkylene group, the number of carbon atoms of the alkylene group is not particularly limited within a range where the objects of the present invention are not impaired. The number of carbon atoms of the alkylene group is preferably 1 or more and 10 or less, more preferably 1 or more and 5 or less, particularly preferably 1 or 2, and most preferably 1.

$R^{e4}$ is an aliphatic group having valence of two or more and four or less, which may include atoms other than carbon. Examples of the atoms other than carbon which $R^{e4}$ may include a nitrogen atom, an oxygen atom, a sulfur atom, a fluorine atom, a chlorine atom, a bromine atom, an iodine atom, and the like. The structure of the aliphatic group that is $R^{e4}$ may be linear, branched, or cyclic, and may be a structure combining these structures.

Among the compounds represented by the formula (e1), a compound represented by the following formula (e2) is preferable.

[Chem. 50]

(e2)

(In the formula (e2), $R^{e4}$ and u are the same as those in the formula (e1).)

Among the compounds represented by the formula (e2), the following compounds are preferable.

[Chem. 51]

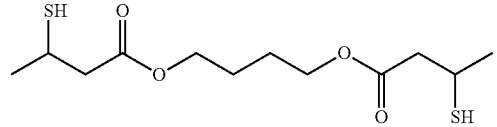

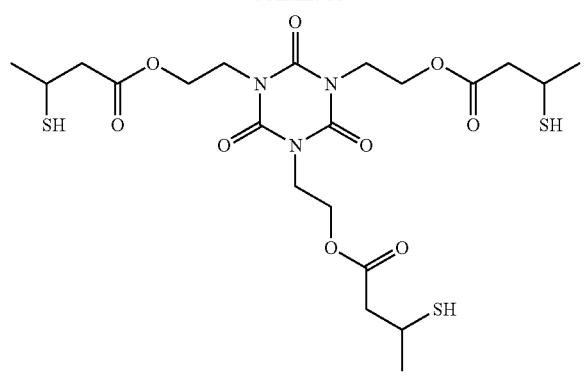

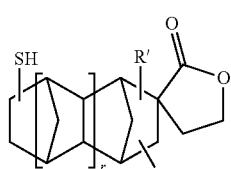

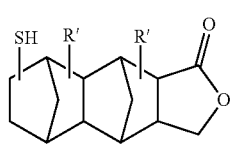

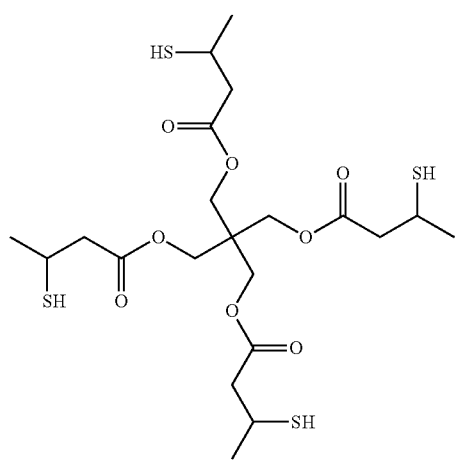

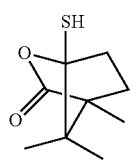

Among the compounds represented by the following formulae (e3-L1) to (e3-L7), a sulfur-containing compound having a mercapto group is preferable.

[Chem. 52]

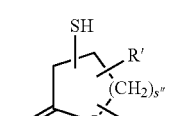 (e3-L1)

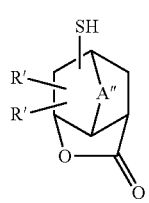 (e3-L2)

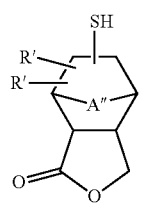 (e3-L3)

(In the formulae (e3-L1) to (e3-L7), R', s'', A'', and r are the same as those of the formulae (b-L1) to (b-L7) described for the acrylic resin (B3).)

Suitable specific examples of the mercapto compound represented by the above formulae (e3-L1) to (e3-L7) include the following compounds.

[Chem. 53]

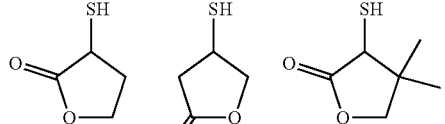

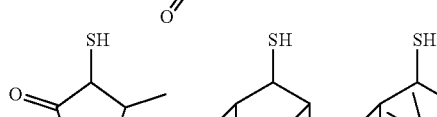

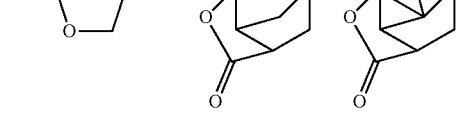

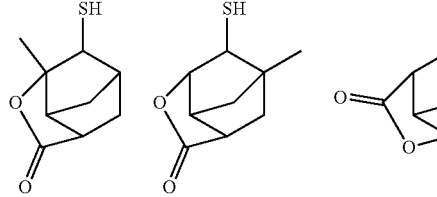

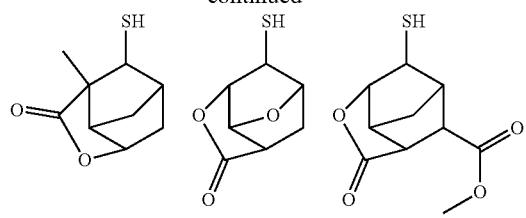
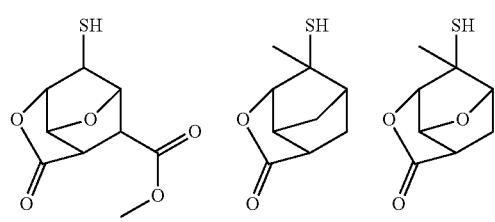
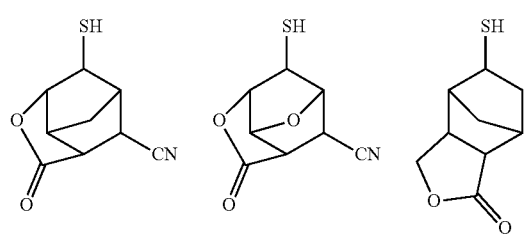
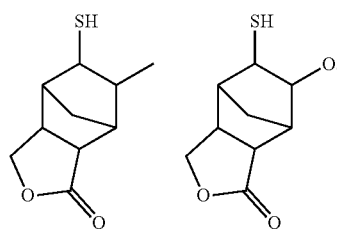
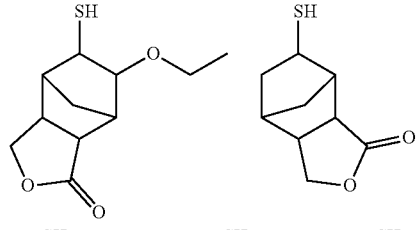
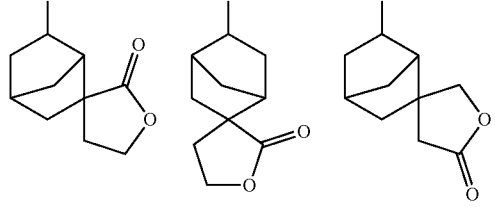
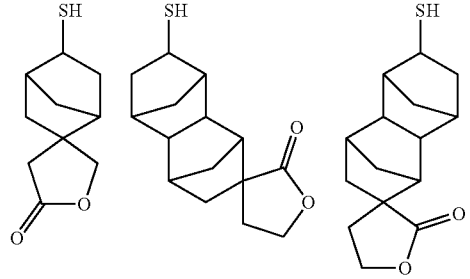
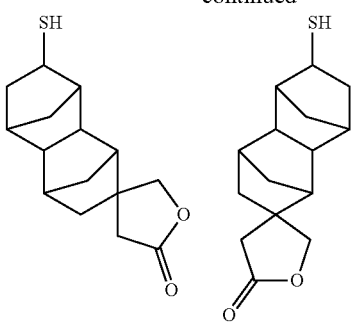
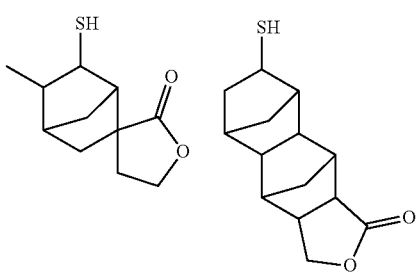
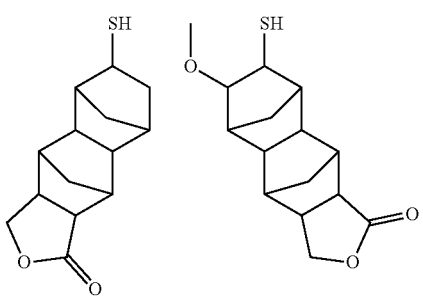
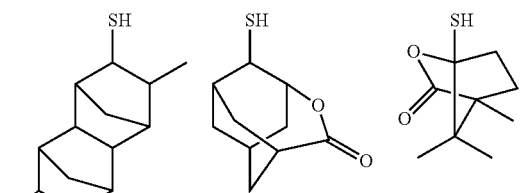
The compounds represented by the following formulae (e3-1) to (e3-4) are also preferable examples of the sulfur-containing compound having a mercapto group.
[Chem. 54]
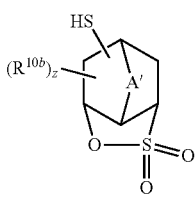
(e3-1)

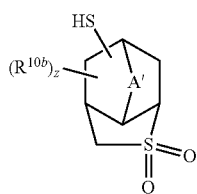
(e3-2)
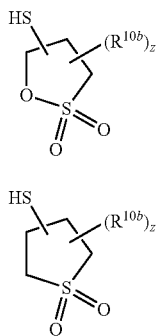
(e3-3)
(e3-4)
(The definition of abbreviations in the formulae (e3-1) to (e3-4) are as described above for the formulae (3-1) to (3-4) in the acrylic resin (B3).)
Suitable specific examples of the mercapto compound represented by the formulae (e3-1) to (e3-4) include the following compounds.
[Chem. 55]
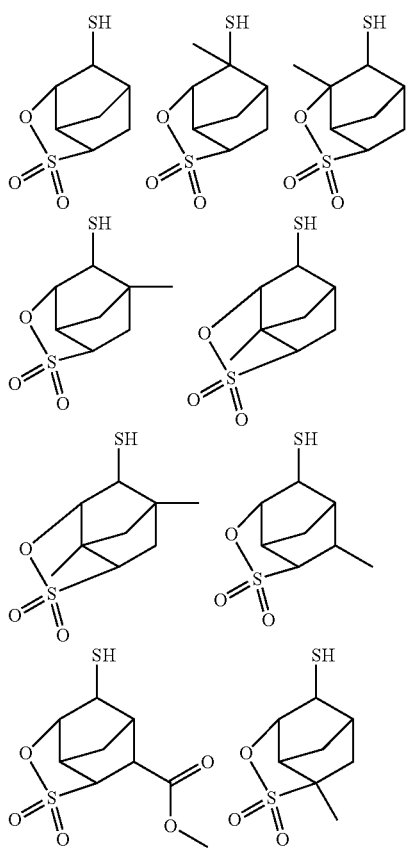
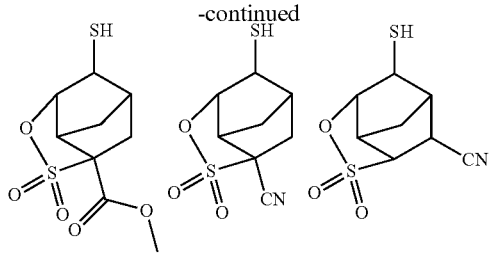
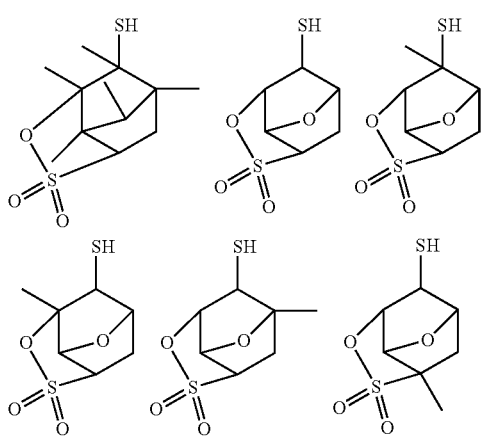
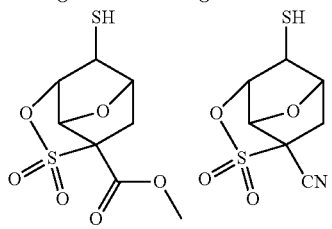
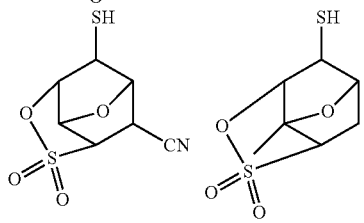
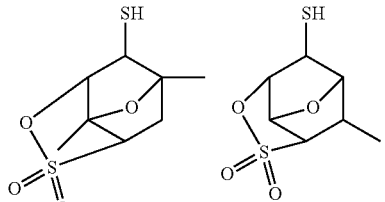
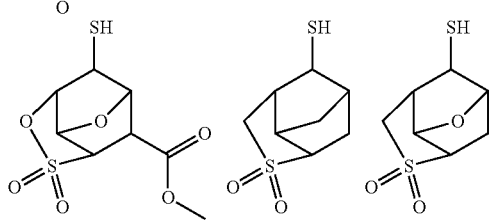
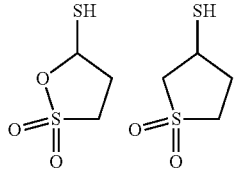

Suitable examples of the compound having a mercapto group include a compound represented by the following formula (e4).

[Chem. 56]

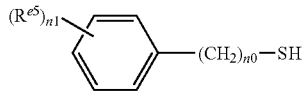

(e4)

(In the formula (e2), $R^{e5}$ is a group selected from the group consisting of a hydroxyl group, an alkyl group having 1 or more and 4 or less carbon atoms, an alkoxy group having 1 or more and 4 or less carbon atoms, an alkylthio group having 1 or more and 4 or less carbon atoms, a hydroxyalkyl group having 1 or more and 4 or less carbon atoms, a mercapto alkyl group having 1 or more and 4 or less carbon atoms, an alkyl halide group having 1 or more and 4 or less carbon atoms, and a halogen atom; n1 is an integer of 0 or more and 3 or less; n0 is an integer of 0 or more and 3 or less; and when n1 is 2 or 3, $R^{e5}$ may be the same as or different from each other.)

When $R^{e5}$ is an alkylene group which may have a hydroxyl group having 1 or more and 4 or less carbon atoms, specific examples thereof include a methyl group, an ethyl group, an n-propyl group, an isopropyl group, an n-butyl group, an isobutyl group, a sec-butyl group, and a tert-butyl group. Among these alkyl groups, a methyl group, a hydroxymethyl group, and an ethyl group are preferable.

When $R^{e5}$ is an alkoxy group which may have a hydroxyl group having 1 or more and 4 or less carbon atoms, specific examples thereof include a methoxy group, an ethoxy group, an n-propyloxy group, an isopropyloxy group, an n-butyloxy group, an isobutyloxy group, a sec-butyloxy group, and a tert-butyloxy group. Among these alkoxy groups, a methoxy group and an ethoxy group are preferable, and a methoxy group is more preferable.

When $R^{e5}$ is an alkylthio group having 1 or more and 4 or less carbon atoms, specific examples thereof include a methylthio group, an ethylthio group, an n-propylthio group, an isopropylthio group, an n-butylthio group, an isobutylthio group, a sec-butylthio group, and a tert-butylthio group. Among these alkylthio groups, a methylthio group, and an ethylthio group are preferable, and a methylthio group is more preferable.

When $R^{e5}$ is a hydroxyalkyl group having 1 or more and 4 or less carbon atoms, specific examples thereof include a hydroxymethyl group, a 2-hydroxyethyl group, a 1-hydroxyethyl group, a 3-hydroxy-n-propyl group, and a 4-hydroxy-n-butyl group, and the like. Among these hydroxyalkyl groups, a hydroxymethyl group, a 2-hydroxyethyl group, and a 1-hydroxyethyl group are preferable, and a hydroxymethyl group is more preferable.

When $R^{e5}$ is a mercapto alkyl group having 1 or more and 4 or less carbon atoms, specific examples thereof include a mercapto methyl group, a 2-mercapto ethyl group, a 1-mercapto ethyl group, a 3-mercapto-n-propyl group, a 4-mercapto-n-butyl group, and the like. Among these mercapto alkyl groups, a mercapto methyl group, a 2-mercapto ethyl group, and a 1-mercapto ethyl group are preferable, and a mercapto methyl group is more preferable.

When $R^{e5}$ is a halogenated alkyl group having 1 or more and 4 or less carbon atoms, examples of the halogen atoms included in the halogenated alkyl group include fluorine, chlorine, bromine, iodine, and the like. When $R^{e5}$ is a halogenated alkyl group having 1 or more and 4 or less carbon atoms, specific examples thereof include a chloromethyl group, a bromomethyl group, an iodomethyl group, a fluoromethyl group, a dichloromethyl group, a dibromomethyl group, a difluoromethyl group, a trichloromethyl group, a tribromomethyl group, a trifluoromethyl group, a 2-chloroethyl group, a 2-bromoethyl group, a 2-fluoroethyl group, a 1,2-dichloroethyl group, a 2,2-difluoroethyl group, a 1-chloro-2-fluoroethyl group, a 3-chloro-n-propyl group, a 3-bromo-n-propyl group, a 3-fluoro-n-propyl group, a 4-chloro-n-butyl group, and the like. Among these halogenated alkyl groups, a chloromethyl group, a bromomethyl group, an iodomethyl group, a fluoromethyl group, a dichloromethyl group, a dibromomethyl group, a difluoromethyl group, a trichloromethyl group, a tribromomethyl group, a trifluoromethyl group are preferable, and a chloromethyl group, a dichloromethyl group, a trichloromethyl group, and a trifluoromethyl group are more preferable.

When $R^{e5}$ is a halogen atom, specific examples thereof include fluorine, chlorine, bromine, and iodine.

In the formula (e4), n1 is an integer of 0 or more and 3 or less, and is more preferably 1. When n1 is 2 or 3, a plurality of $R^{e5}$s may be identical to or different from each other.

In the compound represented by the formula (e4), the substituted position of $R^{e5}$ on a benzene ring is not particularly limited. The substituted position of $R^{e5}$ on a benzene ring is preferably a meta position or a para position with respect to the binding position of —$(CH_2)_{n0}$—SH.

The compound represented by the formula (e4) is preferably a compound including at least one group selected from the group consisting of an alkyl group, a hydroxyalkyl group, and a mercapto alkyl group, as $R^{e5}$, and more preferably a compound including one group selected from the group consisting of an alkyl group, a hydroxyalkyl group, and a mercapto alkyl group as $R^eS$. When the compound represented by the formula (e4) includes one group selected from the group consisting of an alkyl group, a hydroxyalkyl group, and a mercapto alkyl group as $R^eS$, the substituted position on the benzene ring of alkyl group, a hydroxyalkyl group, or a mercapto alkyl group is preferably on the meta position or para position with respect to the binding position of —$(CH_2)_{n0}$—SH.

In the formula (e4), n0 is an integer of 0 or more and 3 or less. From the viewpoint of easiness in preparation or availability of the compound, n0 is preferably 0 or 1, and more preferably 0.

Specific examples of the compound represented by the formula (e4) include p-mercaptophenol, p-thiocresol, m-thiocresol, 4-(methylthio)benzenethiol, 4-methoxybenzenethiol, 3-methoxybenzenethiol, 4-ethoxybenzenethiol, 4-isopropyloxy benzenethiol, 4-tert-butoxybenzenethiol, 3,4-dimethoxybenzenethiol, 3,4,5-trimethoxybenzenethiol, 4-ethylenzenethiol, 4-isopropylenzenethiol, 4-n-butylenzenethiol, 4-tert-butylenzenethiol, 3-ethylenzenethiol, 3-isopropylenzenethiol, 3-n-butyl benzenethiol, 3-tert-butylenzenethiol, 3,5-dimethylenzenethiol, 3,4-dimethylenzenethiol, 3-tert-butyl-4-methylenzenethiol, 3-tert-4-methylenzenethiol, 3-tert-butyl-5-methylenzenethiol, 4-tert-butyl-3-methylenzenethiol, 4-mercaptobenzyl alcohol, 3-mercaptobenzyl alcohol, 4-(mercaptomethyl)phenol, 3-(mercaptomethyl)phenol, 1,4-di(mercaptomethyl)phenol, 1,3-di(mercaptomethyl)phenol, 4-fluorobenzenethiol, 3-fluorobenzenethiol, 4-chlorobenzenethiol, 3-chlorobenzenethiol, 4-bromobenzenethiol, 4-iodobenzenethiol, 3-bromobenzenethiol, 3,4-dichlorobenzenethiol, 3,5-dichlorobenzenethiol, 3,4-difluorobenzenethiol, 3,5-difluorobenzenethiol, 4-mercapto catechol, 2,6-di-tert-butyl-4-mercaptophenol, 3,5-di-tert-butyl-4-methoxybenzenethiol, 4-bromo-3-methylenzenethiol, 4-(trifluoromethyl)benzenethiol, 3-(trifluoromethyl)benzenethiol, 3,5-bis(trifluoromethyl)benzenethiol, 4-methylthiobenzenethiol, 4-ethylthiobenzenethiol, 4-n-butylthiobenzenethiol, 4-tert-butylthiobenzenethiol, and the like.

Furthermore, examples of the sulfur-containing compound having a mercapto group include a compound including a nitrogen-containing aromatic heterocycle substituted with a mercapto group, and a tautomer of a compound including a nitrogen-containing aromatic heterocycle substituted with a mercapto group. Suitable specific examples of the nitrogen-containing aromatic heterocycle include imidazole, pyrazole, 1,2,3-triazol, 1,2,4-triazol, oxazole, thiazole, pyridine, pyrimidine, pyridazine, pyrazine, 1,2,3-triazine, 1,2,4-triazine, 1,3,5-triazine, indole, indazole, benzimidazole, benzoxazole, benzothiazole, 1H-benzotriazole, quinoline, isoquinoline, cinnoline, phthalazine, quinazoline, quinoxaline, and 1,8-naphthyridine.

Specific examples of nitrogen-containing heterocyclic compounds suitable as a sulfur-containing compound and suitable specific examples of the tautomer of the nitrogen-containing heterocyclic compound include the following compounds.

[Chem. 57]

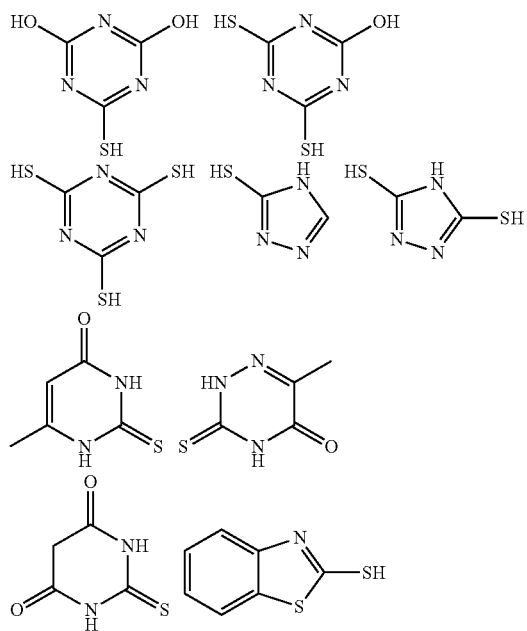

If the photosensitive resin composition includes a sulfur-containing compound (E), the use amount thereof is preferably 0.01 parts by mass or more and 5 parts by mass or less, more preferably 0.02 parts by mass or more and 3 parts by mass or less, and particularly preferably 0.05 parts by mass or more and 2 parts by mass or less with respect to the total mass of 100 parts by mass of the above-mentioned resin (B) and the below-described alkali-soluble resin (D).

<Acid Diffusion Control Agent (F)>

In order to improve the configuration of the resist pattern used as a template, the delay stability of photosensitive resin film and the like, it is preferable that the photosensitive resin composition further contains an acid diffusion control agent (F). Note here that the nitrogen-containing aromatic heterocyclic compound (C) contained in the photosensitive resin composition can function as the above-mentioned acid diffusion control agent. In this specification, the acid diffusion control agent (F) is defined as a compound other than the nitrogen-containing aromatic heterocyclic compound (C). The acid diffusion control agent (F) is preferably a nitrogen-containing compound (F1), and an organic carboxylic acid or an oxoacid of phosphorus or a derivative thereof (F2) may be further included as needed.

[Nitrogen-Containing Compound (F1)]

Examples of the nitrogen-containing compound (F1) include trimethylamine, diethylamine, triethylamine, di-n-propylamine, tri-n-propylamine, tri-n-pentylamine, tribenzylamine, diethanolamine, triethanolamine, n-hexylamine, n-heptyl amine, n-octyl amine, n-nonyl amine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane, pyridine, and the like. These may be used alone or in combinations of two or more thereof.

In addition, commercially available hindered amine products such as 4-hydroxy-1,2,2,6,6-pentamethylpiperidine derivatives, as well as 2,6-diphenylpyridine and pyridine substituted with a substituent such as a hydrocarbon group at the 2,6-position such as 2,6-di-tert-butylpyridine may be used as the nitrogen-containing compound.

The nitrogen-containing compound (F1) may be used in an amount typically in the range of 0 parts by mass or more and 5 parts by mass or less, and particularly preferably in the range of 0 parts by mass or more and 3 parts by mass or less, with respect to 100 parts by mass of total mass of the above resin (B) and the above alkali-soluble resin (D).

[Organic Carboxylic Acid or Oxoacid of Phosphorus or Derivative Thereof (F2)]

Among the organic carboxylic acid, or the oxoacid of phosphorus or the derivative thereof (E2), specific preferred examples of the organic carboxylic acid include malonic acid, citric acid, malic acid, succinic acid, benzoic acid, salicylic acid and the like, and salicylic acid is particularly preferred.

Examples of the oxoacid of phosphorus or derivatives thereof include phosphoric acid and derivatives such as esters thereof such as phosphoric acid, phosphoric acid di-n-butyl ester, and phosphoric acid diphenyl ester; phosphonic acid and derivatives such as esters thereof such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as phosphinic acid and phenylphosphinic acid; and the like. Among these, phosphonic acid is particularly preferred. These may be used alone or in combinations of two or more thereof.

The organic carboxylic acid or oxoacid of phosphorus or derivative thereof (F2) may be used in an amount usually in the range of 0 parts by mass or more and 5 parts by mass or less, and particularly preferably in the range of 0 parts by mass and 3 parts by mass or less, with respect to 100 parts by mass of total mass of the above resin (B) and the above alkali-soluble resin (D).

Moreover, in order to form a salt to allow for stabilization, the organic carboxylic acid, or the oxoacid of phosphorous or the derivative thereof (F2) is preferably used in an amount equivalent to that of the above nitrogen-containing compound (F1).

<Organic Solvent (S)>

The photosensitive resin composition contains an organic solvent (S). There is no particular limitation on the types of the organic solvent (S) as long as the objects of the present invention are not impaired, and an organic solvent appropriately selected from those conventionally used for positive-type photosensitive resin compositions can be used.

Specific examples of the organic solvent (S) include ketones such as acetone, methyl ethyl ketone, cyclohexanone, methyl isoamyl ketone, and 2-heptanone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, methyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate and 3-methyl-3-methoxybutyl acetate; aromatic hydrocarbons such as toluene and xylene; and the like. These may be used alone, or as a mixture of two or more thereof.

There is no particular limitation on the content of the organic solvent (S) as long as the objects of the present invention are not impaired. In a case where a photosensitive resin composition is used for a thick-film application such that a photosensitive resin layer obtained by the spin coating method and the like has a film thickness of 5 μm or more, the organic solvent (S) is preferably used in a range where the solid content concentration of the photosensitive resin composition is 30% by mass or more and 55% by mass or less.

<Other Components>

The photosensitive resin composition may further contain a polyvinyl resin for improving plasticity. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof, and the like. The polyvinyl resin is preferably polyvinyl methyl ether in view of lower glass transition temperatures.

Furthermore, the photosensitive resin composition may also contain an adhesive auxiliary agent in order to improve the adhesiveness between a template formed with the photosensitive resin composition and a metal substrate.

Also, the photosensitive resin composition may further contain a surfactant for improving coating characteristics, defoaming characteristics, leveling characteristics, and the like. As the surfactant, for example, a fluorine-based surfactant or a silicone-based surfactant is preferably used. Specific examples of the fluorine-based surfactant include commercially available fluorine-based surfactants such as BM-1000 and BM-1100 (both manufactured by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.) and the like, but not limited thereto. As the silicone-based surfactant, an unmodified silicone-based surfactant, a polyether modified silicone-based surfactant, a polyester modified silicone-based surfactant, an alkyl modified silicone-based surfactant, an aralkyl modified silicone-based surfactant, a reactive silicone-based surfactant, and the like, can be preferably used. As the silicone-based surfactant, commercially available silicone-based surfactant can be used. Specific examples of the commercially available silicone-based surfactant include Paintad M (manufactured by Dow Corning Toray Co., Ltd.), Topica K1000, Topica K2000, and Topica K5000 (all manufactured by Takachiho Industry Co., Ltd.), XL-121 (polyether modified silicone-based surfactant, manufactured by Clariant Co.), BYK-310 (polyester modified silicone-based surfactant, manufactured by BYK), and the like.

Additionally, in order to finely adjust the solubility in a developing solution, the photosensitive resin composition may further contain an acid, an acid anhydride, or a solvent having a high boiling point.

Specific examples of the acid and acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate; and the like.

Furthermore, specific examples of the solvent having a high boiling point include N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Moreover, the photosensitive resin composition may further contain a sensitizer for improving the sensitivity.

In such a photosensitive resin composition (a chemically amplified positive-type photosensitive resin composition) which includes an acid generator (A), a resin (B), and a nitrogen-containing aromatic heterocyclic compound (C), and which may include components such as an alkali-soluble resin (D), a sulfur-containing compound (E), an acid diffusion suppressing agent (F), and an organic solvent (S) as necessary, it is preferable that the film loss speed at the time when, after heating (prebaking) a coated film of the photosensitive resin composition at 130° C. for 5 minutes, an operation of bringing it into contact with a 2.38% by mass aqueous solution of tetramethylammonium hydroxide at 23° C. for 30 seconds is carried out twice with interval, followed by rinsing with pure water is 0.1 μm/min or more and 0.5 μm/min or less. Note here that the film loss speed can be calculated from the following formula.

Film loss speed(μm/min)=(film thickness after prebaking and before operation(μm)−film thickness after rinsing(μm))/contact time of tetramethylammonium hydroxide(min)

(In the formula, the "operation" means an operation of bringing a film into contact with a 2.38% by mass aqueous solution of tetramethylammonium hydroxide at 23° C. for 30 seconds. "Film thickness" means the film thickness of the coated film of the photosensitive resin composition. Furthermore, the contact time is 30 seconds×2, that is, one minute.)

Herein, when the film loss speed is fast, resistance to the pattern formed by using a photosensitive resin composition to a plating solution to be used for preparing plated particles is likely to be deteriorated. Therefore, many conventionally used photosensitive resin compositions are designed such that the film loss speed is reduced. On the other hand, in the above-mentioned photosensitive resin composition, a film loss speed that is higher than that of a conventionally used photosensitive resin composition, for example, 0.1 μm/min or more and 0.5 μm/min or less, is preferable from the viewpoint of improving the post-exposure delay (PED) stability over time and forming patterns whose cross-sectional shape is favorably rectangular. In this case, the photosensitive resin composition having an excellent post-exposure delay (PED) stability over time is easily obtained. When the exposed photosensitive resin layer is left for a long time, defects in the pattern shape at the time of development tend to appear near the surface of the photosensitive resin layer. However, when the above-mentioned film loss speed is set at a high speed in an appropriate range, the surface of the photosensitive resin layer slightly dissolves at the time of development, and thus, defects in the pattern shape after development by delay can be relieved. When such a film loss speed is employed, for example, even when the delay time after exposure to development is 9 hours or less, CD (Critical Dimension) change is easily reduced to within 10% or less.

With respect to the photosensitive resin composition, a method for adjusting the film loss speed within the above-mentioned preferable range is not particularly limited. Preferable methods for adjusting the film loss speed includes a method of adjusting the contained amount of an alkali-soluble resin (D). The larger the amount of the alkali-soluble resin (D) there is in the photosensitive resin composition, the more the film loss speed is increased.

Furthermore, examples of the other preferable methods for adjusting the film loss speed include a method of adjusting an amount of unit originated in a monomer having an alkali-soluble group in the resin (B). The larger the amount of unit originated in a monomer having an alkali-soluble group there is in the resin (B), the more the above-mentioned film loss speed is increased. Examples of the monomer having an alkali-soluble group include monocarboxylic acids such as acrylic acid, methacrylic acid, and crotonic acid; dicarboxylic acids such as maleic acid, fumaric acid, and itaconic acid; methacrylic acid derivatives having a carboxy group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; and vinyl group-containing aromatic compounds having phenolic hydroxyl groups such as hydroxystyrene, α-methylhydroxy styrene, and α-ethylhydroxy styrene.

<Method of Preparing Chemically Amplified Positive-Type Photosensitive Resin Composition>

A chemically amplified positive-type photosensitive resin composition is prepared by mixing and stirring the above components by the common method. Machines which can be used for mixing and stirring the above components include dissolvers, homogenizers, 3-roll mills and the like. After uniformly mixing the above components, the resulting mixture may be filtered through a mesh, a membrane filter and the like.

<<Photosensitive Dry Film>>

A photosensitive dry film includes a substrate film, and a photosensitive resin layer formed on the surface of the substrate film. The photosensitive resin layer is made of the above-mentioned photosensitive resin compositions.

As the substrate film, a film having optical transparency is preferable. Specifically, a polyethylene terephthalate (PET) film, a polypropylene (PP) film, a polyethylene (PE) film, and the like. However, in view of excellent balance between the optical transparency and the breaking strength, a polyethylene terephthalate (PET) film is preferable.

The above-mentioned photosensitive resin composition is applied on the substrate film to form a photosensitive resin layer, and thereby a photosensitive dry film is manufactured. When the photosensitive resin layer is formed on the substrate film, a photosensitive resin composition is applied and dried on the substrate film using an applicator, a bar coater, a wire bar coater, a roller coater, a curtain flow coater, and the like, so that a film thickness after drying is preferably 0.5 μm or more and 300 μm or less, more preferably 1 μm or more and 300 μm or less, and particularly preferably 3 μm or more and 100 μm or less.

The photosensitive dry film may have a protective film on the photosensitive resin layer. Examples of the protective film include a polyethylene terephthalate (PET) film, a polypropylene (PP) film, a polyethylene (PE) film, and the like.

<<Patterned Resist Film, and Method of Producing Substrate with Template>>

There is no particular limitation on a method of forming a patterned resist film on a substrate having the metal surface using the photosensitive resin composition described above. Such a patterned resist film is suitably used as a template, etc. for forming a plated article. A suitable method includes a manufacturing method of a patterned resist film that includes: laminating a photosensitive resin layer including photosensitive resin composition on a metal surface of a substrate having a metal surface, exposing the photosensitive resin layer through irradiation with an active ray or radiation in a position-selective manner, and developing the exposed photosensitive resin layer. A method of producing a substrate with a template for forming a plated article is the same as the method of producing a patterned resist film, except for the added steps of laminating a photosensitive resin layer on the metal surface of a substrate having a metal surface and creating a template for forming a plated article by development.

As the substrate on which a photosensitive resin layer is laminated, a substrate having a metal surface is used. As metal species constituting a metal surface, copper, gold and aluminum are preferred, and copper is more preferred. Since the above-mentioned photosensitive resin composition has a wide margin of the depth of focus (DOF), regardless of the flatness of the surface of the substrate, various substrates can be used.

The photosensitive resin layer is laminated on the substrate, for example, as follows. In other words, a liquid photosensitive resin composition is coated onto a substrate, and the coating is heated to remove the solvent and thus to form a photosensitive resin layer having a desired thickness. The thickness of the photosensitive resin layer is not particularly limited as long as it is possible to form a resist pattern serving as a template which has a desired thickness. The thickness of the photosensitive resin layer is not particularly limited, but is preferably 0.5 µm or more, more preferably 0.5 µm or more and 300 µm or less, and particularly preferably 1 µm or more and 150 µm or less, and most preferably 3 µm or more and 100 µm or less.

As a method of applying a photosensitive resin composition onto a substrate, methods such as the spin coating method, the slit coat method, the roll coat method, the screen printing method and the applicator method can be employed. Pre-baking is preferably performed on a photosensitive resin layer. The conditions of pre-baking may differ depending on the components in a photosensitive resin composition, the blending ratio, the thickness of a coated film and the like. They are usually about 2 minutes or more and 120 minutes or less at 70° C. or more and 200° C. or less, and preferably 80° C. or more and 150° C. or less.

The photosensitive resin layer formed as described above is selectively irradiated (exposed) with an active ray or radiation, for example, ultraviolet radiation or visible light with a wavelength of 300 nm or more and 500 nm or less through a mask having a predetermined pattern.

Low-pressure mercury lamps, high-pressure mercury lamps, super-high-pressure mercury lamps, metal halide lamps, argon gas lasers, etc. can be used for the light source of the radiation. The radiation may include microwaves, infrared rays, visible lights, ultraviolet rays, X-rays, γ-rays, electron beams, proton beams, neutron beams, ion beams, etc. The irradiation dose of the radiation may vary depending on the constituent of the photosensitive resin composition, the film thickness of the photosensitive resin layer, and the like. For example, when a super-high-pressure mercury lamp is used, the dose may be 100 mJ/cm$^2$ or more and 10,000 mJ/cm$^2$ or less. The radiation includes a light ray to activate the acid generator (A) in order to generate an acid.

After the exposure, the diffusion of acid is promoted by heating the photosensitive resin layer using a known method to change the alkali solubility of the photosensitive resin layer at an exposed portion in the photosensitive resin film.

Subsequently, the exposed photosensitive resin layer is developed in accordance with a conventionally known method, and an unnecessary portion is dissolved and removed to form a predetermined resist pattern, or a template for forming a plated article. At this time, as the developing solution, an alkaline aqueous solution is used.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surfactant to the above aqueous solution of the alkali can be used as the developing solution.

The developing time may vary depending on the constituent of the photosensitive resin composition, the film thickness of the photosensitive resin layer, and the like. Usually, the developing time is 1 minute or more and 30 minutes or less. The method of the development may be any one of a liquid-filling method, a dipping method, a paddle method, a spray developing method, and the like.

After development, it is washed with running water for 30 seconds or more and 90 seconds or less, and then dried with an air gun, an oven, and the like. In this manner, it is possible to form a resist pattern which has been patterned in a predetermined pattern on a metal surface of a substrate having a metal surface. Furthermore, in this manner, it is possible to manufacture a substrate with a template having a resist pattern serving as a template on a metal surface of a substrate having a metal surface.

<<Method of Manufacturing Plated Article>>

A conductor such as a metal may be embedded, by plating, into a nonresist portion (a portion removed with a developing solution) in the template formed by the above method on the substrate to form a plated article, for example, like a contacting terminal such as a bump or a metal post, and Cu-rewiring. Note that there is no particular limitation on the method of plate processing, and various conventionally known methods can be used. As a plating liquid, in particular, a solder plating liquid, a copper plating liquid, a gold plating liquid and a nickel plating liquid are suitably used. Finally, the remaining template is removed with a stripping liquid and the like in accordance with a conventional method.

When a plated article is manufactured, in some cases, it is preferable that an ashing process is carried out to the metal surface exposed to a non-patterned part of a resist pattern serving as a template for forming a plated article. Specifically, examples of such cases include a case where pattern formed using a photosensitive resin composition including a sulfur-containing compound (E) is used as a template to form a plated article. In this case, adhesiveness with respect to the metal surface of the plated article may be damaged. This defect is remarkably observed in the case where a sulfur-containing compound (E) represented by the formula (e1) described above and a sulfur-containing compound (E) represented by the formula (e4) are used. However, if the above-mentioned ashing process is carried out, even when a pattern on which a photosensitive resin composition including a sulfur-containing compound (E) is used, plated article that is well adhered to the metal surface can be easily formed. Note here that little or no problem regarding the adhesiveness of a plated article mentioned above arises when a compound including a nitrogen-containing aromatic heterocycle substituted with a mercapto group is used as a sulfur-containing compound (E). Therefore, when the compound including a nitrogen-containing aromatic heterocycle substituted with a mercapto group is used as a sulfur-containing compound (E), even without carrying out an ashing process, a plated article having excellent adhesiveness with respect to the metal surface can be easily carried out.

The ashing process is not particularly limited as long as the method does not damage the resist pattern serving as a template for forming a plating article to such an extent that the plating template having a desired shape cannot be formed. Preferable examples of the ashing process method include a method using oxygen plasma. In order to carry out ashing of a metal surface on a substrate using oxygen plasma, oxygen plasma is only required to be generated using a well-known oxygen plasma generating apparatus to irradiate a metal surface on the substrate with oxygen plasma.

As a gas to be used for generating oxygen plasma, various gases that have conventionally been used for plasma treatment together with oxygen can be mixed within a range where the objects of the present invention are not impaired. Examples of such gases include nitrogen gas, hydrogen gas, $CF_4$ gas, and the like. Conditions for ashing using oxygen plasma are not particularly limited within a range where the objects of the present invention are not impaired, but treatment time is, for example, 10 seconds or more and 20 minutes or less, preferably 20 seconds or more and 18 minutes or less, and more preferably 30 seconds or more and 15 minutes or less. By setting the treatment time by oxygen plasma in the above-mentioned range, an effect of improving the adhesiveness of the plated article can be achieved without changing the shape of the resist pattern.

According to the above-mentioned method, since a resist pattern whose cross-sectional shape is favorably rectangular can be used as a template for forming a plated article, a wide contact area can be secured between the plated article and the substrate surface, and thus, a plated article excellent in adhesiveness with respect to the substrate can be manufactured.

Note here that a compound represented by the above-mentioned formula (c2) is a new compound. The compound represented by the formula (c2) can also be included in a photosensitive resin composition other than the above-mentioned photosensitive resin composition and can be used for applications of use other than that of the photosensitive resin composition. The Log S value of the compound represented by the formula (c2) is not limited, and, for example, the Log S value is preferably −6.00 or less from the viewpoint that the compound can also be used for the above-mentioned photosensitive resin composition.

EXAMPLES

The present invention will be described in more detail below by way of Examples, but the present invention is not limited to these Examples.

Preparation Example 1

(Synthesis of Mercapto Compound E1)

In Preparation Example 1, a mercapto compound E1 having the following structure was synthesized as a sulfur-containing compound (E).

[Chem. 58]

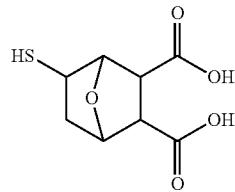

E1

In a flask, 15.00 g of 7-oxanorborna-5-ene-2,3-dicarboxylic anhydride and 150.00 g of tetrahydrofuran were added, followed by stirring. Subsequently, 7.64 g of thioacetic acid (AcSH) was added in a flask, followed by stirring at room temperature for 3.5 hours. Then, the reaction solution was concentrated to obtain 22.11 g of 5-acetyl thio-7-oxanorbornane-2,3-dicarboxylic anhydride. In a flask, 22.11 g of 5-acetylthio-7-oxanorbornane-2,3-dicarboxylic anhydride and 30.11 g of an aqueous sodium hydroxide solution having a concentration of 10% by mass were added, and then the contents in the flask were stirred at room temperature for 2 hours. Subsequently, hydrochloric acid (80.00 g) having a concentration of 20% by mass was added in the flask to acidify the reaction solution. Then, extraction with 200 g of ethyl acetate was performed four times to obtain an extraction liquid including a mercapto compound E1. The extraction liquid was concentrated and the collected residue was dissolved by adding 25.11 g of tetrahydrofuran (THF). Heptane was added dropwise to the THF solution to precipitate the mercapto compound E1, and the precipitated mercapto compound E1 was collected by filtration. The measurement results of $^1$H-NMR of the mercapto compound E1 are shown below.

1H-NMR (DMSO-d6): δ12.10 (s, 2H), 4.72 (d, 1H), 4.43 (s, 1H), 3.10 (t, 1H), 3.01 (d, 1H), 2.85 (d, 1H), 2.75 (d, 1H), 2.10 (t, 1H), 1.40 (m, 1H)

[Chem. 59]

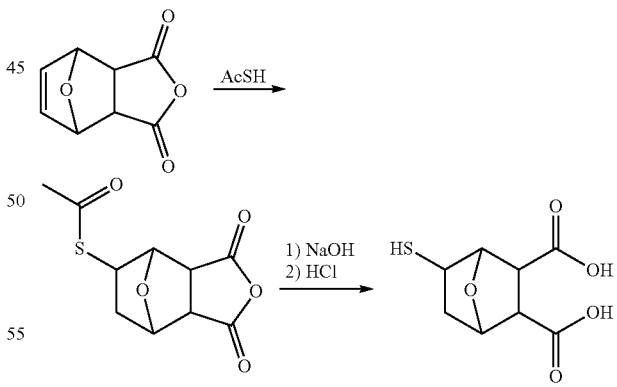

Preparation Example 2

(Synthesis of Nitrogen-Containing Aromatic Heterocyclic Compound C2)

In Preparation Example 2, a nitrogen-containing aromatic heterocyclic compound C2 having the following structure was synthesized as a nitrogen-containing aromatic heterocyclic compound (C).

[Chem. 60]

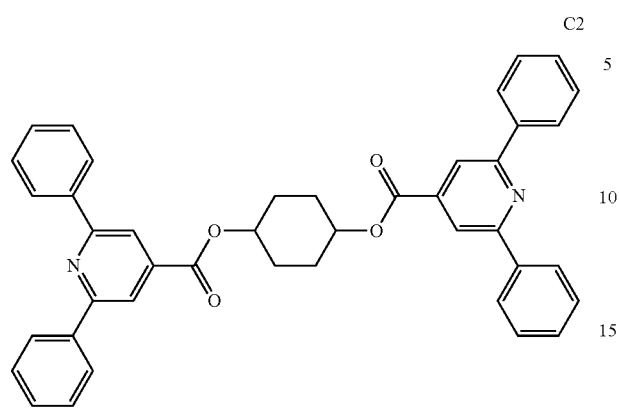

C2

In methylene chloride, 1.00 g (3.63 mmol) of 2,6-diphenyl isonicotinic acid (manufactured by Aldrich) and 0.421 g (3.63 mmol) of 1,4-cyclohexane diol were dissolved, and 0.835 g (4.36 mmol) of WSC—HCl (carbodiimide hydrochloride compound) was added thereto, followed by stirring at room temperature for 24 hours. Thereafter, the solution was washed with 10 g of pure water three times, and then a solvent was evaporated under reduced pressure to obtain 0.81 g of a target C2. The measurement results of $^1$H-NMR of C2 are shown below.

$^1$H-NMR (CDCl$_3$): 58.35-8.15 (m, 12H), 7.70-7.40 (m, 12H), 4.75 (m, 2H), 2.20-1.90 (m, 4H), 1.70-1.35 (m, 4H)

Preparation Example 3

(Synthesis of Nitrogen-Containing Aromatic Heterocyclic Compound C3)

In Preparation Example 3, a nitrogen-containing aromatic heterocyclic compound C3 having the following structure was synthesized as a nitrogen-containing aromatic heterocyclic compound (C).

[Chem. 61]

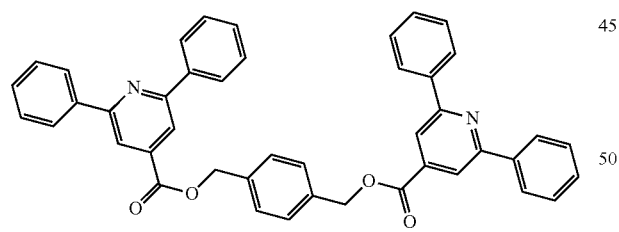

C3

In the same manner as in Preparation Example 2, except for 0.421 g of 1,4-cyclohexane diol being changed to 0.501 g of 1,4-benzene dimethanol, 0.95 g of a target C3 was obtained. The measurement results of $^1$H-NMR of C3 are shown below.

$^1$H-NMR (CDCl$_3$): 58.35-8.15 (m, 12H), 7.70-7.40 (m, 12H), 7.10 (s, 4H), 5.11 (S, 4H)

Examples 1 to 12, and Comparative Examples 1 to 8

In Examples 1 to 12 and Comparative Examples 1 to 8, a compound A1 represented by the following formula was used as the acid generator (A).

[Chem. 62]

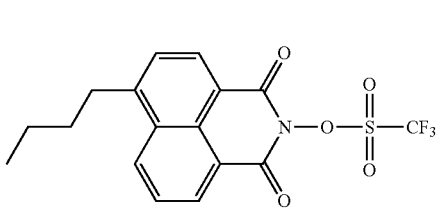

A1

In Examples 1 to 12, and Comparative Examples 1 to 8, the following resins B1, B2, B3, and B4 were used as the resin whose solubility in alkali increases under the action of acid (resin (B)). The number on the lower right of the parentheses in each constituent unit in the following structural formula represents the content (% by mass) of the constituent unit in each resin. The resin B1 has a mass average molecular weight Mw of 106,000. The resin B2 has a mass average molecular weight Mw of 106,000. The resin B3 has a number average molecular weight of 106,000. The resin B4 has a mass average molecular weight Mw of 40,000 and dispersibility (Mw/Mn) of 2.6.

[Chem. 63]

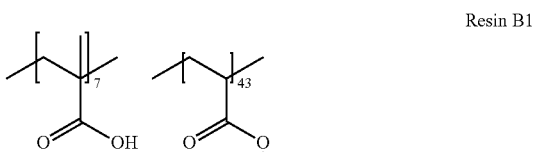

Resin B1

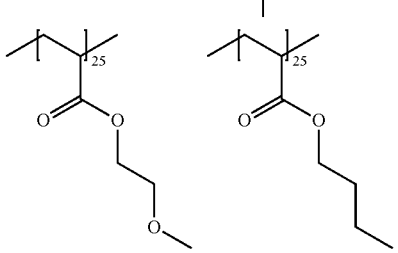

Resin B2

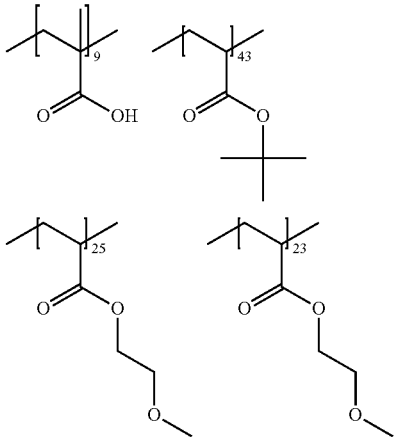

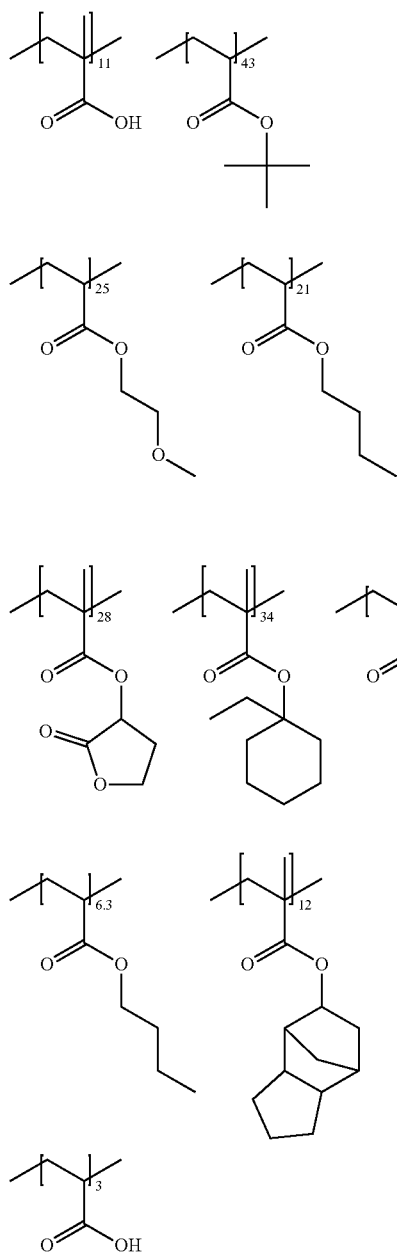

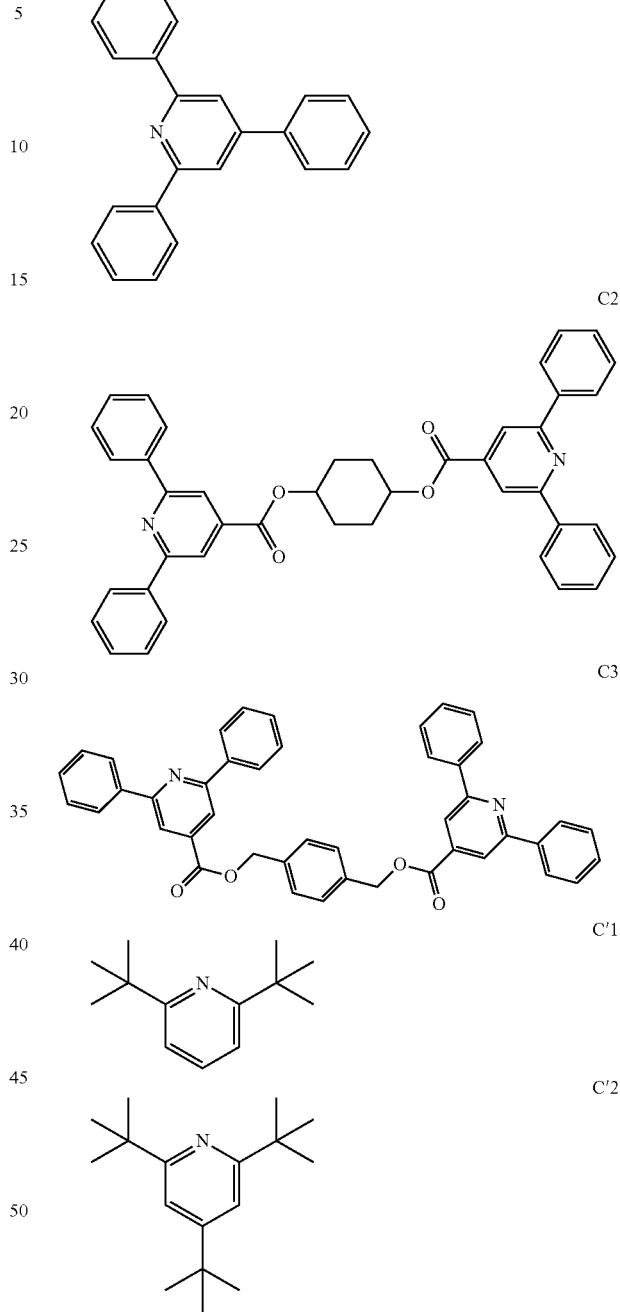

As the nitrogen-containing aromatic heterocyclic compound (C), in Examples 1 to 12, the following C1, C2 obtained in Preparation Example 2, and C3 obtained in Preparation Example 3 were used. In Comparative Examples 1 to 8, as the substituted additive (C') of nitrogen-containing aromatic heterocyclic compound (C), the following C'1 and C'2 were used. Log S values of C1, C2, C3, C'1, and C'2 calculated by ChemDraw Prime (16.0) for Windows are as follows:

C1: −7.313
C2: −12.37
C3: −12.84
C'1: −2.355
C'2: −4.222

As the alkali-soluble resin (D), the following resins D1 and D2 were used.

D1: polyhydroxystyrene resin (copolymer of p-hydroxystyrene:styrene=85:15 (mass ratio), mass average molecular weight (Mw): 2,500, dispersibility (Mw/Mn): 2.4) D2: novolac resin (m-cresol single condensate (mass average molecular weight (Mw): 8,000)

As the sulfur-containing compound (E), a mercapto compound E1 obtained in Preparation Example 1 was used.

The acid generator (A), the resin (B), the nitrogen-containing aromatic heterocyclic compound (C) or the additive (C'), the alkali-soluble resin (D), the sulfur-containing compound (E) in types and amounts shown in Table 1, and 0.05 parts by mass of a surfactant (BYK310, manufactured by BYK) were dissolved in a mixed solvent of 3-methoxybutyl acetate (MA) and propylene glycol monomethyl ether acetate (PM) so that the solid content concentration was 40% by mass (MA/PM=6/4 (mass ratio)) to obtain photosensitive resin compositions for the Examples and Comparative Examples.

Using the thus obtained photosensitive resin composition, shapes, a margin of depth of focus (DOF), film loss speed, and PED were evaluated according to the following method. These evaluation results are shown in Table 1.

[Evaluation of Shape]

Each of the photosensitive resin compositions of Examples and Comparative Examples was applied on a copper substrate having a diameter of 8 inches to form a photosensitive resin layer (a coated film photosensitive resin composition) having a thickness of 7 μm. Then, the photosensitive resin layer was pre-baked at 130° C. for 5 minutes. After the pre-baking, using a line-and-space pattern mask having a line width of 2 μm and a space width of 2 μm and an exposure device Prisma GHI 5452 (Ultratech Inc.), pattern exposure was performed with the ghi line at an exposure dose greater by 1.2 times than the minimum exposure dose capable of forming a pattern having a predetermined size. Subsequently, when nine hours had passed after pattern exposure, a substrate was mounted on the hot plate and post-exposure baking (PEB) was carried out for 1.5 minutes at 90° C. Immediately after PEB, an aqueous 2.38% by weight solution of tetramethylammonium hydroxide (developing solution, NMD-3, manufactured by Tokyo Ohka Kogyo Co., Ltd.) was added dropwise to the exposed photosensitive resin layer and allowed to stand at 23° C. for 30 seconds. This operation was repeated 2 times in total. Subsequently, the surface of the resist pattern was washed (rinsed) with running water and blown with nitrogen to obtain a resist pattern. The cross-sectional shape of this resist pattern was observed by a scanning electron microscope to evaluate the cross-sectional shape of the pattern. Specifically, if the width of the surface (top) opposite to the surface on which the resist pattern was brought into contact with the substrate is defined as Wt, and the width of the pattern of the intermediate portion in the thickness direction of the resist pattern cross-section is defined as Wm, when Wm was within ±10% or less relative to Wt, evaluation was given as "o"; and when Wm was out of the range of ±10% relative to Wt, evaluation was given as "x". Note here that in all Examples, the pattern width of the intermediate part of in the thickness direction of the resist pattern cross-section was the same as the width of the surface (bottom) that is brought into contact with the resist pattern cross-section.

[Evaluation of Margin of Depth of Focus (DOF)]

A line-and-space pattern having a line width of 2 μm and a space width of 2 μm was formed by the same method as in [Evaluation of shape]. At this time, a range of focus in which patterns were independent of each other and capable of self-standing was checked. Cases where the range of focus was 32 μm or more were rated "⊚", cases where the range of focus was 28 μm or more and less than 32 μm were rated "○", and cases where the range of focus was less than 28 μm were rated "x".

[Evaluation of Film Loss Speed]

Each of the photosensitive resin compositions of Examples and Comparative Examples was applied on an Si substrate, a photosensitive resin layer having a film thickness of 7 μm (a coated film photosensitive resin composition) was formed. Then, the photosensitive resin layer was pre-baked at 130° C. for 5 minutes. After the pre-baking, an operation of bringing a 2.38% by mass aqueous solution of tetramethylammonium hydroxide into contact with the photosensitive resin layer at 23° C. for 30 seconds was carried out two times with an interval in between, and the photosensitive resin layer was then rinsed with pure water. A thickness value of the photosensitive resin layer after the pre-baking and before the operation of bringing the 2.38% by mass aqueous solution of tetramethylammonium hydroxide into contact with a photosensitive resin layer for 30 seconds and a thickness value of the photosensitive resin layer after rinsing were measured, the latter value was subtracted from the former value to obtain a value, and the obtained value divided by the time for which the 2.38% by weight aqueous solution of tetramethylhydroxide was brought into contact with the photosensitive resin layer (one minute total contacting time) was defined as the film loss speed. Results are shown in Table 1.

[Evaluation of PED]

A line-and-space pattern having a line width of 2 μm and a space width of 2 μm was formed by the same method as in [Evaluation of shape]. At this time, a time after pattern exposure until post-exposure baking (PEB) was made to be 0 hours (PEB immediately after pattern exposure) or 9 hours, and resist patterns were formed, respectively. The rate (CD (Critical Dimension) change rate) of the mean value of the line width of the top part of the resist pattern obtained when the time until PEB was carried out immediately after pattern exposure relative to a mean value of the line width of the top part of the resist pattern when PEB was carried out after 9 hours was obtained. A case where the CD change rate was 10% or less was determined as "o" and a case where the CD change rate was larger than 10% was determined as "x". Results are shown in Table 1.

TABLE 1

| | Resin (B) and alkali-soluble resin (D) Types/part by mass | Nitrogen-containing aromatic heterocyclic compound (C) Types/part by mass | Acid generator (A) Types/part by mass | Sulfur-containing compound (E) Types/part by mass | Evaluation | | | |
|---|---|---|---|---|---|---|---|---|
| | | | | | Shape | DOF | Film loss speed (μm/mim) | PED |
| Example 1 | B1/35 | C1/0.2 | A1/1 | E1/ 0.05 | ○ | ⊚ | 0.10 | ○ |
| Example 2 | D1/10 | C2/0.2 | | | ○ | ○ | 0.10 | ○ |
| Example 3 | D2/55 | C3/0.2 | | | ○ | ○ | 0.10 | ○ |
| Example 4 | B2/35 | C1/0.2 | | | ○ | ⊚ | 0.17 | ○ |
| Example 5 | D1/10 | C2/0.2 | | | ○ | ○ | 0.17 | ○ |
| Example 6 | D2/55 | C3/0.2 | | | ○ | ○ | 0.17 | ○ |

TABLE 1-continued

| | Resin (B) and alkali-soluble resin (D) Types/part by mass | Nitrogen-containing aromatic heterocyclic compound (C) Types/part by mass | Acid generator (A) Types/part by mass | Sulfur-containing compound (E) Types/part by mass | Evaluation | | | |
|---|---|---|---|---|---|---|---|---|
| | | | | | Shape | DOF | Film loss speed (μm/mim) | PED |
| Example 7 | B3/35 | C1/0.2 | | | ○ | ◉ | 0.20 | ○ |
| Example 8 | D1/10 | C2/0.2 | | | ○ | ○ | 0.20 | ○ |
| Example 9 | D2/55 | C3/0.2 | | | ○ | ○ | 0.20 | ○ |
| Example 10 | B3/35 | C1/0.2 | | — | ○ | ◉ | 0.10 | ○ |
| Example 11 | D1/10 | C2/0.2 | | | ○ | ○ | 0.10 | ○ |
| Example 12 | D2/55 | C3/0.2 | | | ○ | ○ | 0.10 | ○ |
| Comparative Example 1 | B1/35 D1/10 | C'1/0.2 | | E1/0.05 | X | X | 0.10 | ○ |
| Comparative Example 2 | D2/55 | C'2/0.2 | | | X | X | 0.10 | ○ |
| Comparative Example 3 | B2/35 D1/10 | C'1/0.2 | | | X | X | 0.17 | ○ |
| Comparative Example 4 | D2/55 | C'2/0.2 | | | X | X | 0.17 | ○ |
| Comparative Example 5 | B3/35 D1/10 | C'1/0.2 | | | X | X | 0.20 | ○ |
| Comparative Example 6 | D2/55 | C'2/0.2 | | | X | X | 0.20 | ○ |
| Comparative Example 7 | | C'1/0.2 | | — | X | X | 0.10 | ○ |
| Comparative Example 8 | B4/80 D2/20 | C'1/0.2 | | E1/0.05 | X | X | 0.01 | X |

As is apparent from Examples 1 to 12, it is shown that a positive-type photosensitive resin composition including the acid generator (A) which generates acid upon exposure to an irradiated active ray or radiation and the resin (B) whose solubility in alkali increases under the action of acid as well as the nitrogen-containing aromatic heterocyclic compound (C) represented by the formula (c-a) or (c-b) and having a Log S value of −6.00 or less can form a resist pattern whose cross-sectional shape is favorably rectangular, and that a margin of depth of focus (DOF) is wide. Furthermore, according to Examples 1 to 12, it is shown that a film loss amount in the above-mentioned evaluation was 0.1 μm/min or more and 0.5 μm/min or less. Furthermore, according to Examples 1 to 12, it is shown that PED is also excellent.

Meanwhile, as is apparent from Comparative Examples 1 to 8, when the additive (C') as a nitrogen-containing aromatic heterocyclic compound which is not the nitrogen-containing aromatic heterocyclic compound (C) is included instead of the nitrogen-containing aromatic heterocyclic compound, it has a tapered shape in which the cross-sectional shape of the top of the resist pattern becomes thinner, and a resist pattern whose cross-sectional shape becomes favorably rectangular cannot be easily obtained. Furthermore, in Comparative Examples 1 to 8, the range of the focus in the evaluation of the margin of depth of focus (DOF) was 24 μm or less, and the margin of the depth of focus was narrow.

What is claimed is:

1. A chemically amplified positive-type photosensitive resin composition comprising an acid generator (A) which generates acid upon exposure to an irradiated active ray or radiation, a resin (B) whose solubility in alkali increases under an action of acid, and a nitrogen-containing aromatic heterocyclic compound (C), wherein the nitrogen-containing aromatic heterocyclic compound (C) is a compound represented by the following formula (c1):

$(Y^1\text{-}A^2)_k\text{—}R^1$ (c1)

wherein in the formula (c1), $Y^1$ is a group represented by the formula (c-a-1):

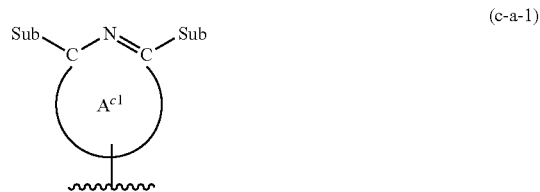

(c-a-1)

$A^1$ is a single bond or a divalent group selected from a group consisting of —O—, —CO—, —COO—, —OCO—, —OCOO—, —NH—, —CONH—, —NHCO—, —NHCONH—, —S—, —SO—, and —SO$_2$—;

$R^1$ is a hydrogen atom or a k-valent organic group:

k is 1 or 2, when k is 2, two $Y^1\text{-}A^2$ - may be identical to or different from each other, and when $R^1$ is a hydrogen atom, k is 1;

in the formula (c-a-1), Sub is a substituent, $A^{C1}$ is a pyridine ring, where two Subs may be identical to or different from each other wherein a common logarithm value Log S of the solubility S of the nitrogen-containing aromatic heterocyclic compound (C) is -6.00 or less.

2. The chemically amplified positive-type photosensitive resin composition according to claim 1, wherein k is 2.

3. The chemically amplified positive-type photosensitive resin composition according to claim 2, wherein $R^1$ is an alkylene group having 1 or more and 10 or less carbon atoms which may be linear or branched, a cycloalkyne group, an arylene group, or a divalent group which is a combination thereof.

4. The chemically amplified positive-type photosensitive resin composition according to claim 1, wherein Sub is a hydrocarbon group.

5. The chemically amplified positive-type photosensitive resin composition according to claim 1, wherein when, after heating a coated film of the chemically amplified positive-type photosensitive resin composition at 130° C. for 5 minutes, an operation of bringing the coated film into contact with 2.38% by mass aqueous solution of tetramethylammonium hydroxide at 23° C. for 30 seconds is carried out two times at intervals, followed by rinsing with pure water, a film loss speed is 0.1 μm/min or more and 0.5 μm/min or less.

6. The chemically amplified positive-type photosensitive resin composition according to claim 1, further comprising an alkali-soluble resin (D).

7. The chemically amplified positive-type photosensitive resin composition according to claim 6, wherein the alkali-soluble resin (D) includes at least one resin selected from a group consisting of a novolac resin (D1), a polyhydroxystyrene resin (D2), and an acrylic resin (D3).

8. The chemically amplified positive-type photosensitive resin composition according to claim 1, further comprising a sulfur-containing compound (E) which comprises a sulfur atom capable of coordinating a metal.

9. A photosensitive dry film comprising a substrate film and a photosensitive resin layer formed on a surface of the substrate film, wherein the photosensitive resin layer is the chemically amplified positive-type photosensitive resin composition according to claim 1.

10. A method of manufacturing a photosensitive dry film, the method comprising applying the chemically amplified positive-type photosensitive resin composition according to claim 1 on a substrate film to form a photosensitive resin layer.

11. A method of manufacturing a patterned resist film, the method comprising:
 laminating a photosensitive resin layer including a chemically amplified positive-type photosensitive resin composition according to claim 1 on a substrate having a metal surface;
 exposing the photosensitive resin layer by irradiation with an active ray or radiation in a position-selective manner; and
 developing the photosensitive resin layer after exposure.

12. A method of manufacturing a substrate with a template, the method comprising:
 laminating a photosensitive resin layer including the chemically amplified positive-type photosensitive resin composition according to claim 1 on a substrate having a metal surface;
 exposing the photosensitive resin layer by irradiation with an active ray or radiation; and
 developing the photosensitive resin layer after exposure to form a template for forming a plated article.

13. A method of manufacturing a plated article, the method comprising plating the substrate with a template manufactured by the method according to claim 12 to form a plated article in the template.

* * * * *